(12) United States Patent
Alvarado et al.

(10) Patent No.: US 12,029,008 B2
(45) Date of Patent: Jul. 2, 2024

(54) HYBRID MICROJET LIQUID-COOLED HEAT SPREADER

(71) Applicant: The Penn State Research Foundation, University Park, PA (US)

(72) Inventors: Bladimir Ramos Alvarado, State College, PA (US); Carlos Ulises Gonzalez Valle, State College, PA (US); Luis Enrique Paniagua Guerra, State College, PA (US); Jonathan Veli, Harrisburg, PA (US)

(73) Assignee: The Penn State Research Foundation, University Park, PA (US)

( * ) Notice: Subject to any disclaimer, the term of this patent is extended or adjusted under 35 U.S.C. 154(b) by 481 days.

(21) Appl. No.: 17/602,100

(22) PCT Filed: Apr. 13, 2020

(86) PCT No.: PCT/US2020/027887
§ 371 (c)(1),
(2) Date: Oct. 7, 2021

(87) PCT Pub. No.: WO2020/210783
PCT Pub. Date: Oct. 15, 2020

(65) Prior Publication Data
US 2022/0232732 A1    Jul. 21, 2022

Related U.S. Application Data

(60) Provisional application No. 62/832,652, filed on Apr. 11, 2019.

(51) Int. Cl.
*H05K 7/20*    (2006.01)
*B33Y 80/00*    (2015.01)
(Continued)

(52) U.S. Cl.
CPC ....... *H05K 7/20263* (2013.01); *F28D 1/0246* (2013.01); *F28F 3/12* (2013.01);
(Continued)

(58) Field of Classification Search
CPC .................. B33Y 80/00; F28D 1/0246; F28D 2021/0029; F28F 3/12; F28F 7/02;
(Continued)

(56) References Cited

U.S. PATENT DOCUMENTS 5,388,635 A * 2/1995 Gruber ...................... F28F 3/12
                                                257/E23.09
7,255,153 B2 * 8/2007 Berger ................. H01L 23/4735
                                                257/714
(Continued)

FOREIGN PATENT DOCUMENTS

EP    3188230 A1 *  7/2017  ......... H01L 23/4735
EP    3188230 B1 *  9/2020  ......... H01L 23/4735
(Continued)

OTHER PUBLICATIONS

Sabry, Modamed; GreenCool: An Energy-Efi¬? cient Liquid Cooling Design Technique for 3-D MPSoCs Via Channel Width Modulation; IEEE Transactions on Computer-Aided Design of Integrated Circuits and Systems, vol. 32, No. 4, Apr. 2013.
(Continued)

*Primary Examiner* — Ljiljana V. Ciric
(74) *Attorney, Agent, or Firm* — DINSMORE & SHOHL LLP

(57) ABSTRACT

A liquid-cooled heat sink has three parts: the water block, the X-clamp, and a copper plate. The water block has an inlet connected to a resin shell. Inside the shell, a fractal inlet manifold divides the inlet coolant flow into several sub streams that eventually exit in the form of uniformly distributed liquid jets through small nozzles/microjets at the
(Continued)

bottom of the shell. The union between the shell and the copper plate forms a flood chamber, where the jets impinge on the copper plate, dissipating the heat supplied to the copper plate in contact with the heat source. The warm liquid is removed from the flood chamber through an outlet manifold embedded with the resin shell.

20 Claims, 31 Drawing Sheets

(51) Int. Cl.
| | |
|---|---|
| F28D 1/02 | (2006.01) |
| F28D 21/00 | (2006.01) |
| F28F 3/12 | (2006.01) |
| F28F 7/02 | (2006.01) |
| H01L 23/367 | (2006.01) |
| H01L 23/473 | (2006.01) |

(52) U.S. Cl.
CPC ............ *F28F 7/02* (2013.01); *H01L 23/3677* (2013.01); *H01L 23/4735* (2013.01); *H05K 7/20236* (2013.01); *H05K 7/20254* (2013.01); *H05K 7/20272* (2013.01); *B33Y 80/00* (2014.12); *F28D 2021/0029* (2013.01)

(58) Field of Classification Search
CPC ............ H01L 23/3677; H01L 23/4735; H05K 7/20263; H05K 7/20236; H05K 7/20254; H05K 7/20272
See application file for complete search history.

(56) References Cited

U.S. PATENT DOCUMENTS

| | | | | |
|---|---|---|---|---|
| 7,516,776 | B2 * | 4/2009 | Bezama | H01L 23/4735 |
| | | | | 165/80.4 |
| 7,536,870 | B2 | 5/2009 | Bezama et al. | |
| 7,992,627 | B2 * | 8/2011 | Bezama | H01L 23/4735 |
| | | | | 165/80.4 |
| 8,006,746 | B2 * | 8/2011 | Tao | F28F 23/00 |
| | | | | 165/80.4 |
| 9,252,069 | B2 | 2/2016 | Bhunia et al. | |
| 9,484,284 | B1 * | 11/2016 | Gambin | H01L 23/4735 |
| 10,334,755 | B2 * | 6/2019 | Oprins | H01L 23/4735 |
| 10,393,444 | B2 * | 8/2019 | Kusuda | F28D 7/0058 |
| 10,512,152 | B2 * | 12/2019 | Smith | H01L 23/473 |
| 10,651,112 | B2 * | 5/2020 | Malouin, Jr. | F28F 3/12 |
| 10,903,141 | B2 * | 1/2021 | Malouin, Jr. | H05K 7/20254 |
| 10,957,624 | B2 * | 3/2021 | Chen | H01L 23/473 |
| 11,018,077 | B2 * | 5/2021 | Smith | G06F 1/20 |
| 11,031,312 | B2 * | 6/2021 | Poltorak | H01L 23/367 |
| 11,191,184 | B2 * | 11/2021 | Mizerak | H01L 23/473 |
| 11,322,426 | B2 * | 5/2022 | Malouin, Jr. | F28D 1/0246 |
| 11,653,472 | B2 * | 5/2023 | Amos | H05K 7/20772 |
| | | | | 361/699 |
| 11,670,564 | B2 * | 6/2023 | Poltorak | H01L 23/473 |
| | | | | 165/281 |
| 2002/0080563 | A1 | 6/2002 | Pence et al. | |
| 2006/0254762 | A1 * | 11/2006 | Tao | H01L 23/473 |
| | | | | 165/80.4 |
| 2006/0260784 | A1 * | 11/2006 | Bezama | H01L 23/4735 |
| | | | | 165/80.2 |
| 2008/0060792 | A1 * | 3/2008 | Berger | H01L 23/4735 |
| | | | | 165/80.4 |
| 2008/0210405 | A1 * | 9/2008 | Datta | F28D 15/0266 |
| | | | | 257/E23.098 |
| 2009/0095444 | A1 * | 4/2009 | Bezama | H01L 23/4735 |
| | | | | 165/80.2 |
| 2015/0043164 | A1 * | 2/2015 | Joshi | G06F 1/20 |
| | | | | 165/185 |
| 2016/0358842 | A1 | 12/2016 | Milne | |
| 2017/0092565 | A1 | 3/2017 | Chen et al. | |
| 2017/0196120 | A1 | 7/2017 | Oprins et al. | |
| 2020/0343160 | A1 * | 10/2020 | Mizerak | H05K 7/20254 |
| 2022/0117115 | A1 * | 4/2022 | Malouin | H05K 7/20254 |
| 2022/0230937 | A1 * | 7/2022 | Malouin | H01L 23/473 |
| 2022/0232732 | A1 * | 7/2022 | Alvarado | H01L 23/3677 |
| 2023/0204308 | A1 * | 6/2023 | Poltorak | H05K 7/20509 |
| | | | | 165/158 |
| 2023/0207426 | A1 * | 6/2023 | Yaglioglu | H05K 7/20281 |
| | | | | 257/714 |

FOREIGN PATENT DOCUMENTS

| | | | | |
|---|---|---|---|---|
| JP | 2006518100 A | * | 8/2006 | |
| WO | WO-2004063639 A2 | * | 7/2004 | ............ F28F 23/00 |
| WO | WO-2011138670 A2 | * | 11/2011 | ............ F28D 15/00 |

OTHER PUBLICATIONS

Brunschwiler, Thomas; Direct Liquid Jet-Impingement Cooling With Micron-Sized Nozzle Array and Distributed Return Architecture; 8 pages.
International Search Report dated Jun. 17, 2020; International Application No. PCT/US2020/027887.
Wei, Tiwei; Experimental and Numerical Study of 3-D Printed Direct Jet Impingement Cooling for High-Power, Large Die Size Applications; IEEE Transactions on Components, Packaging and Manufacturing Technology, vol. 11, No. 3, Mar. 2021.
Luo, Lingai; Experimental study of constructal distributor for flow equidistribution in a mini crossflow heat exchanger (MCHE); Chemical Engineering and Processing 47 (2008) 229-236.
Paniagua-Guerra, Luis; Efficient hybrid microjet liquid cooled heat sinks made of photopolymer resin: thermo-fluid characteristics and entropy generation analysis, International Journal of Heat and Mass Transfer 146 (2020) 118844.
Ulises Gonzalez-Valle; Experimental investigation of the cooling performance of 3-D printed hybrid water-cooled heat sinks; Applied Thermal Engineering 168 (2020) 114823.
Ramos-Alvarado, Bladimir, Constructal flow distributor as a bipolar plate for proton exchange membrane fuel cells; international journal of hydrogen energy 36 (2011) 12965-12976.
Paniagua-Guerra, Luis; Fractal channel manifolds for microjet liquid-cooled heat sinks; International Journal of Heat and Mass Transfer 138 (2019) 257-266.
Escher, W; Efficiency of optimized bifurcating tree-like and parallel microchannel networks in the cooling of electronics; International Journal of Heat and Mass Transfer 52 (2009) 1421-1430.
Fan, Zhiwei; Experimental investigation of the flow distribution of a 2-dimensional constructal distributor; Experimental Thermal and Fluid Science 33 (2008) 77-83.

\* cited by examiner

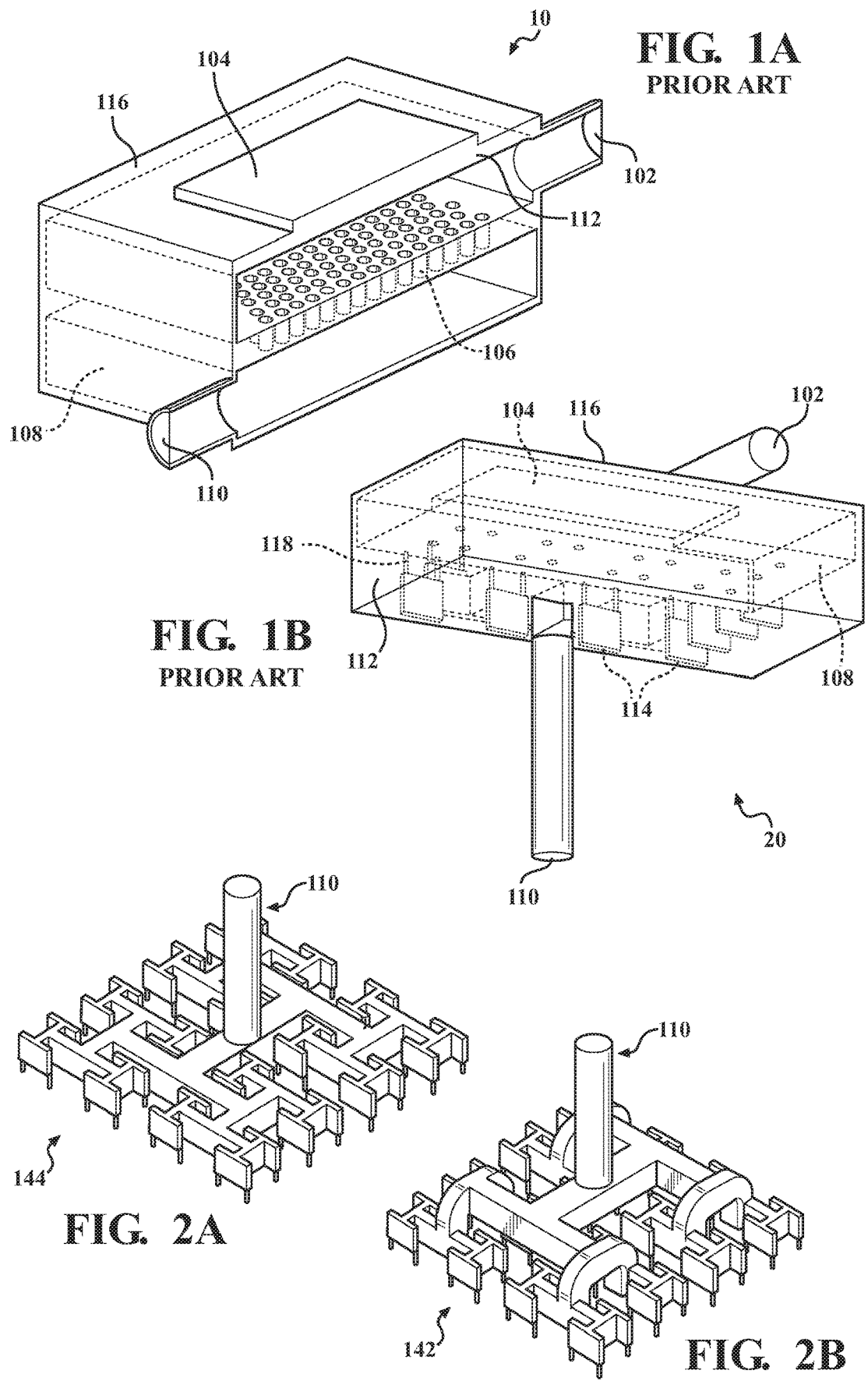

FIG. 13A
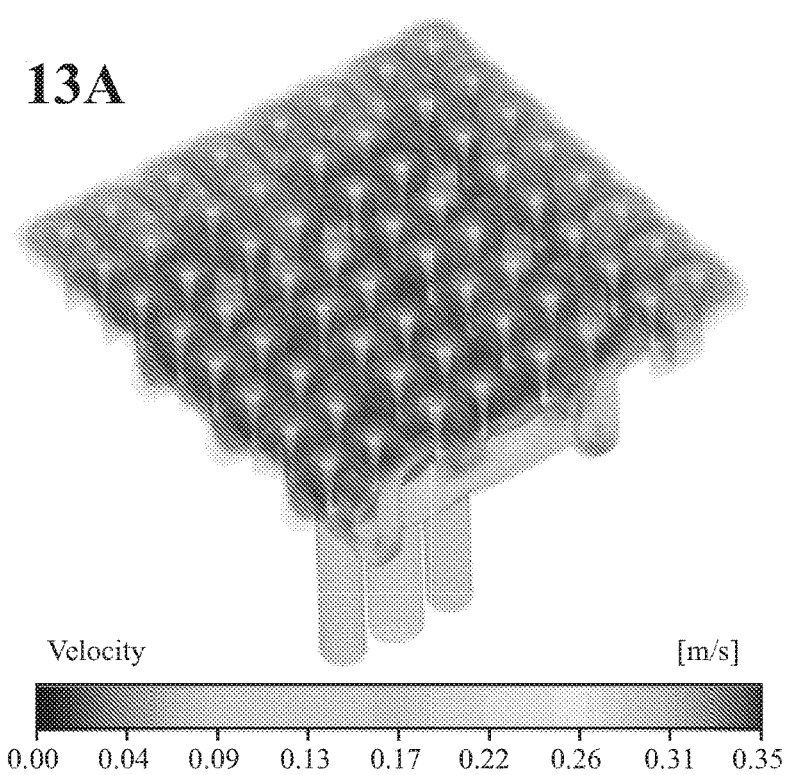
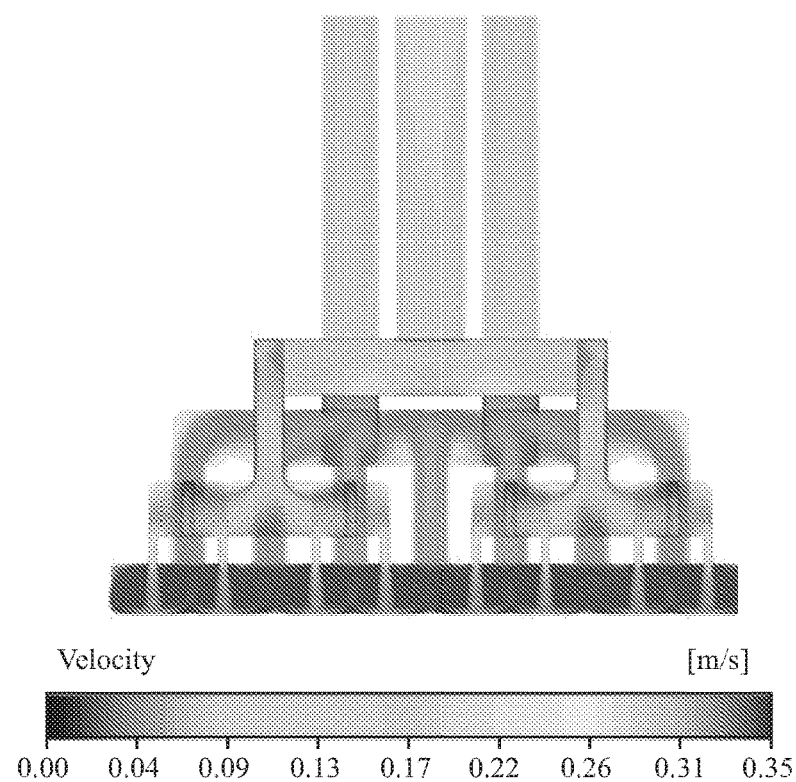
FIG. 13B

FIG. 21
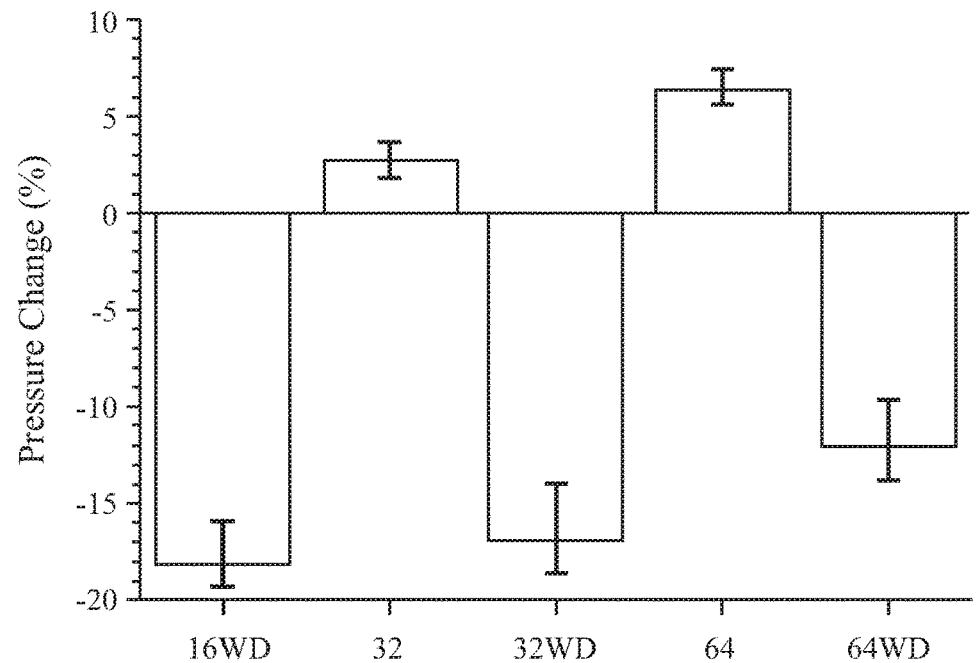
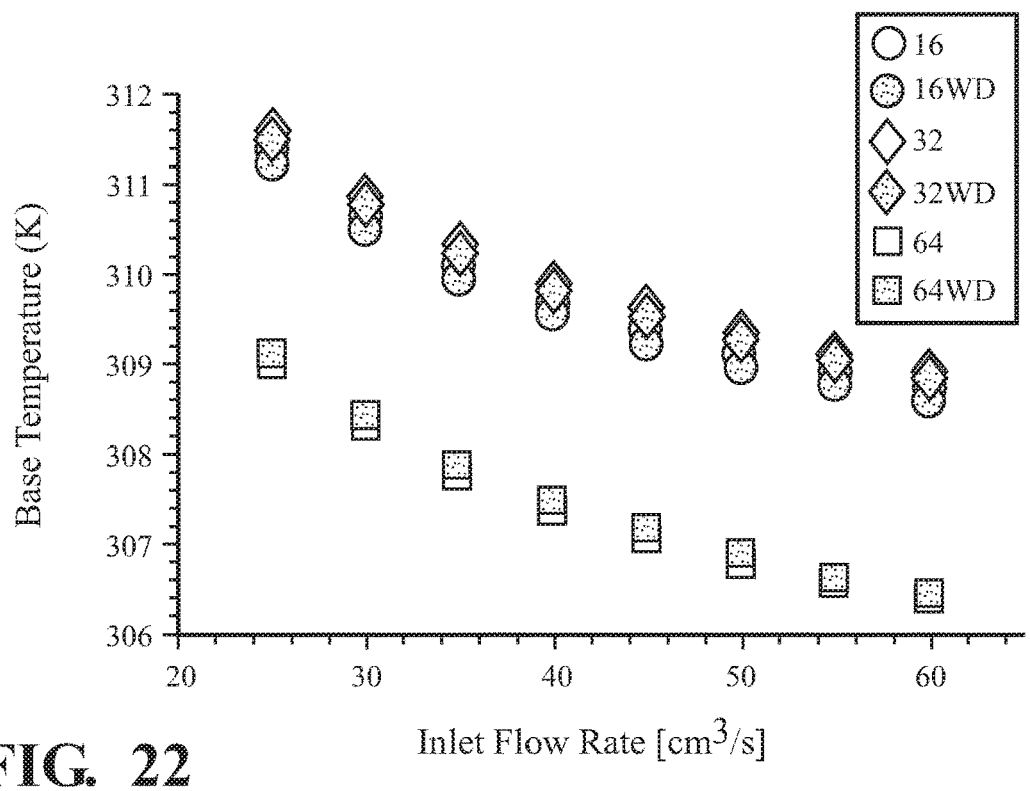
FIG. 22

FIG. 23
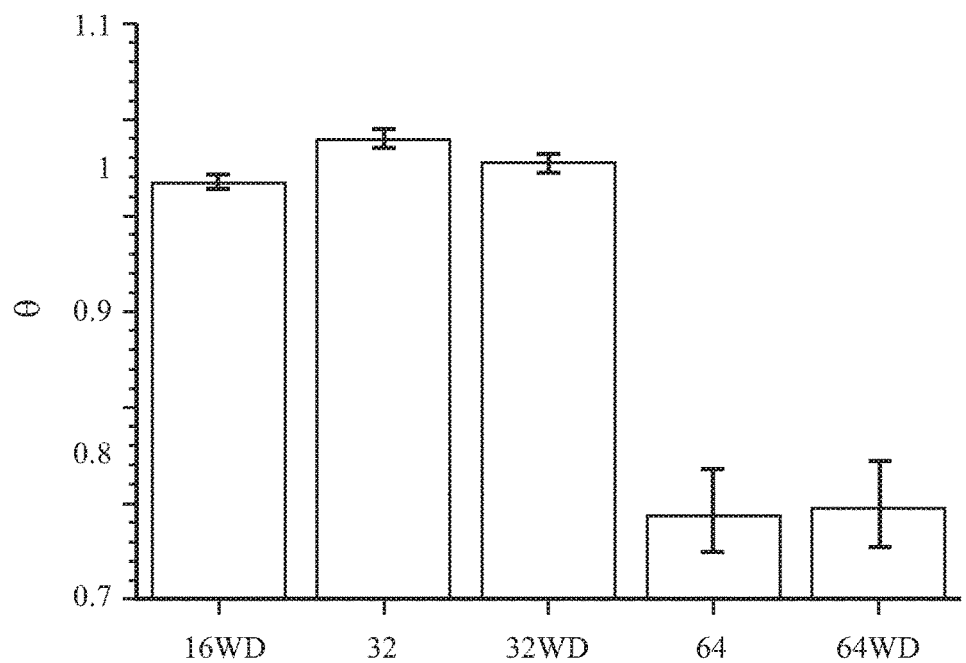
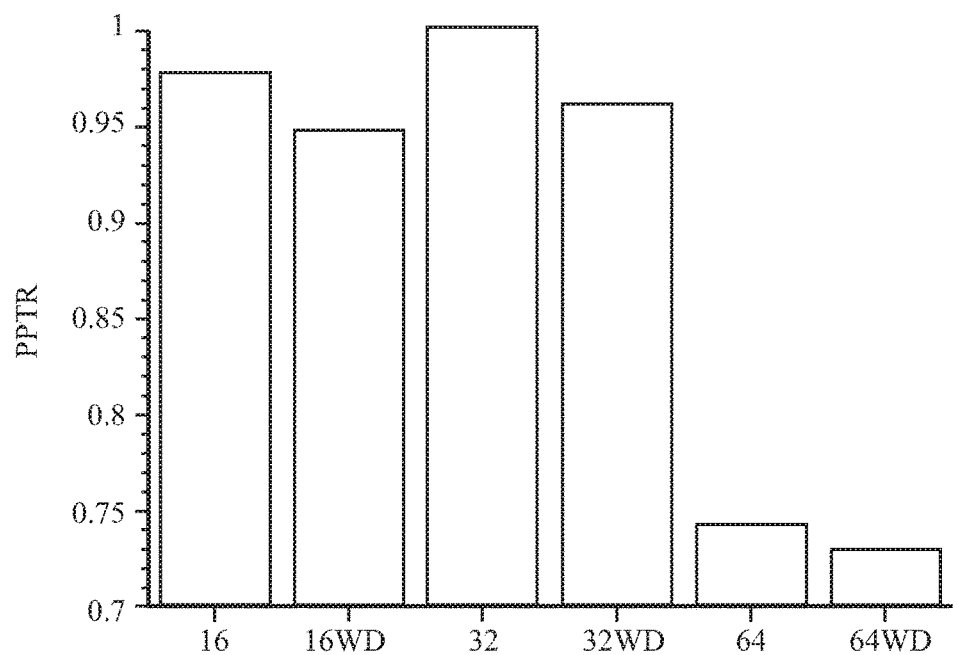
FIG. 24

FIG. 26
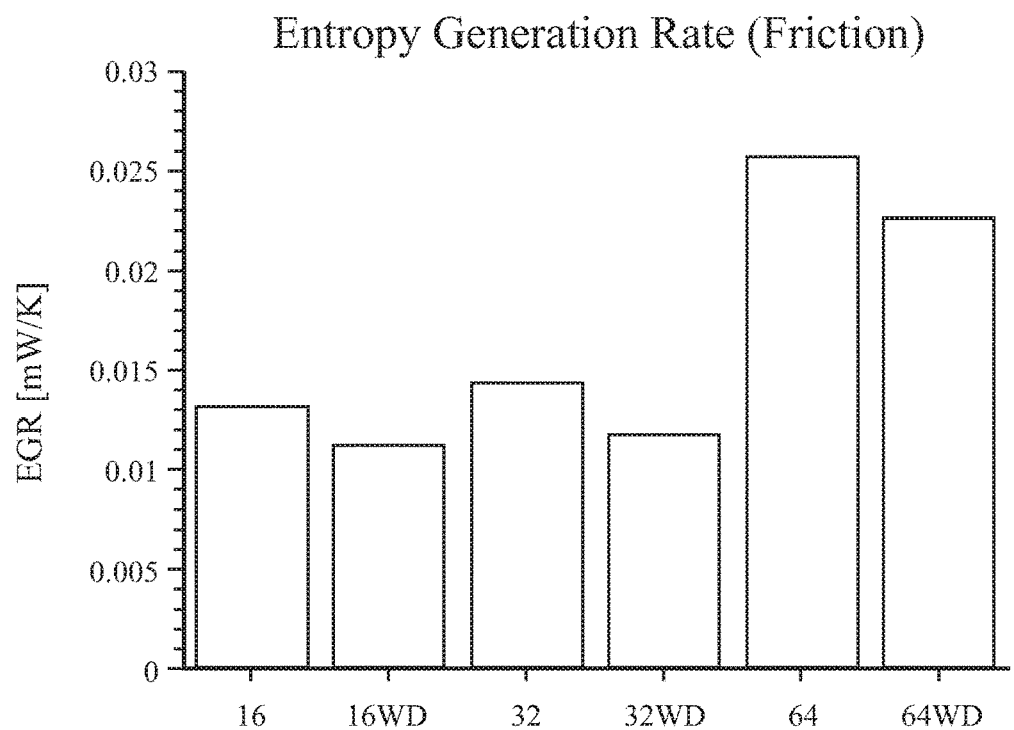
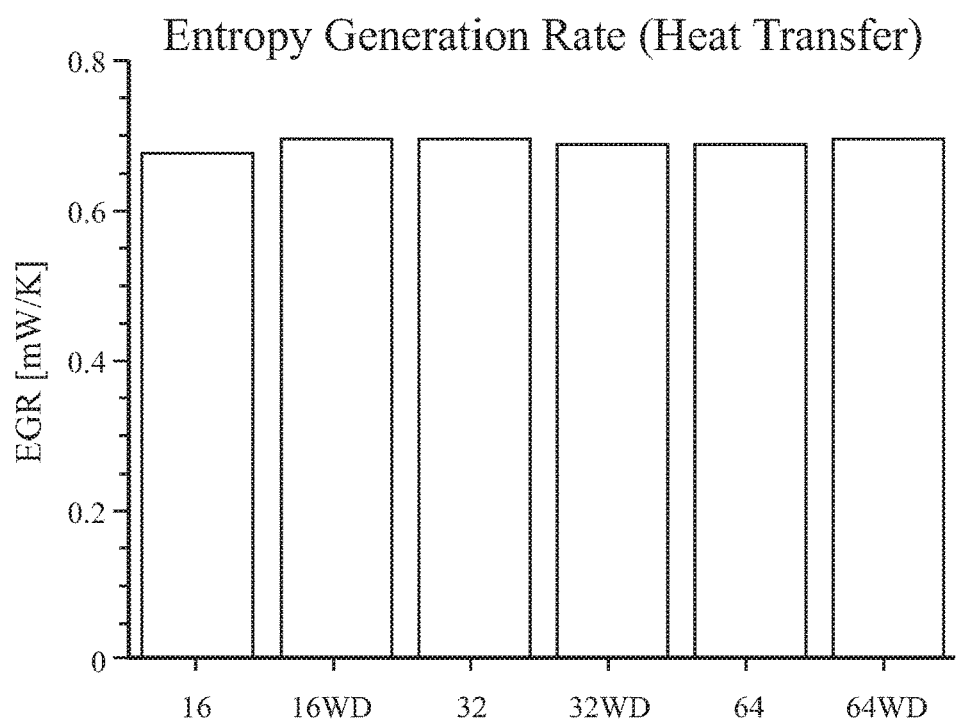
FIG. 27

FIG. 28
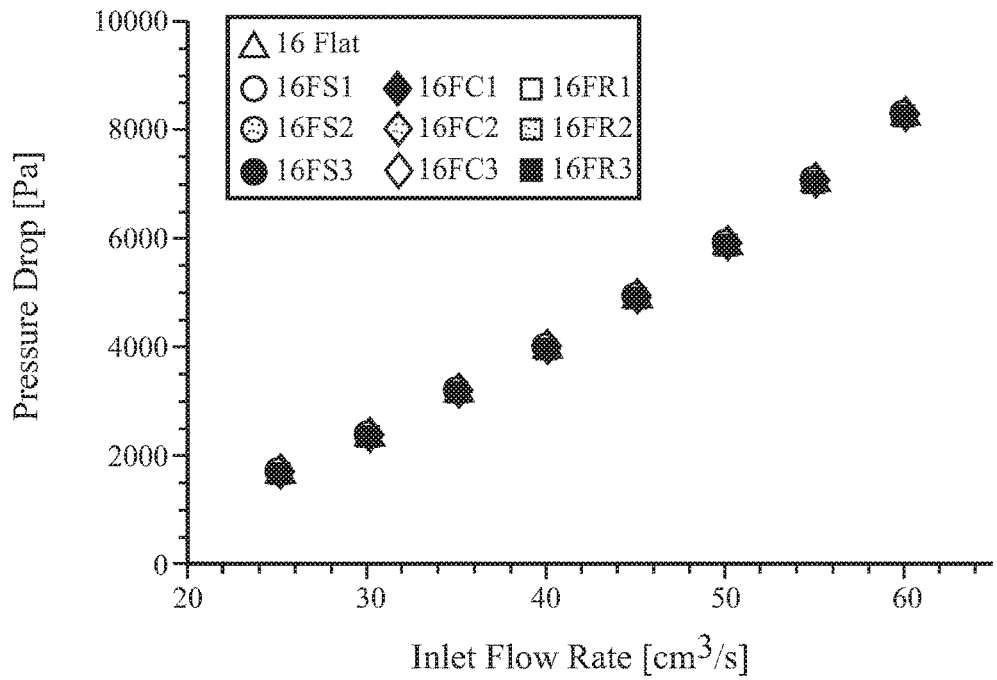
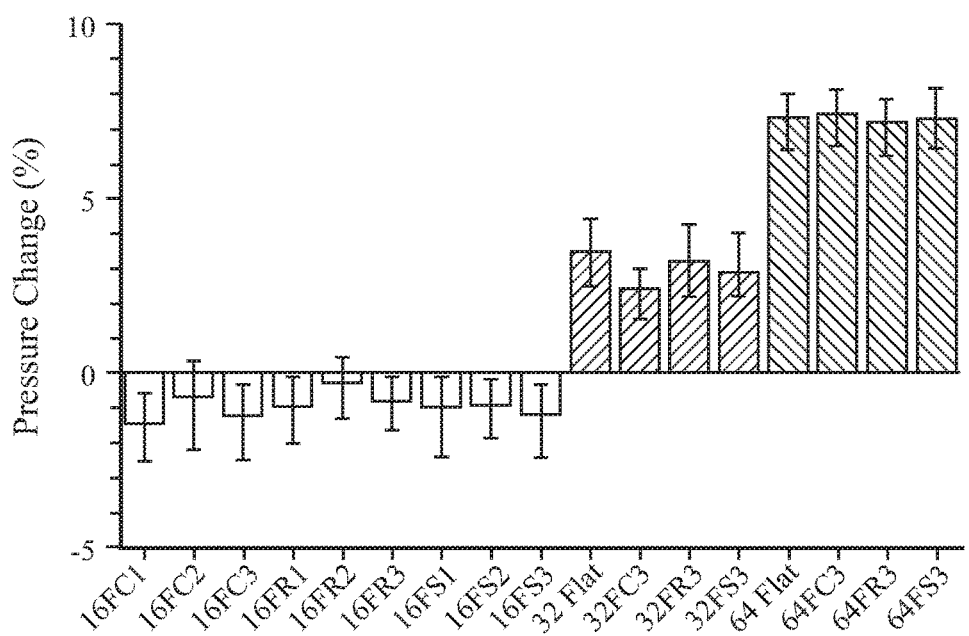
FIG. 29

FIG. 30
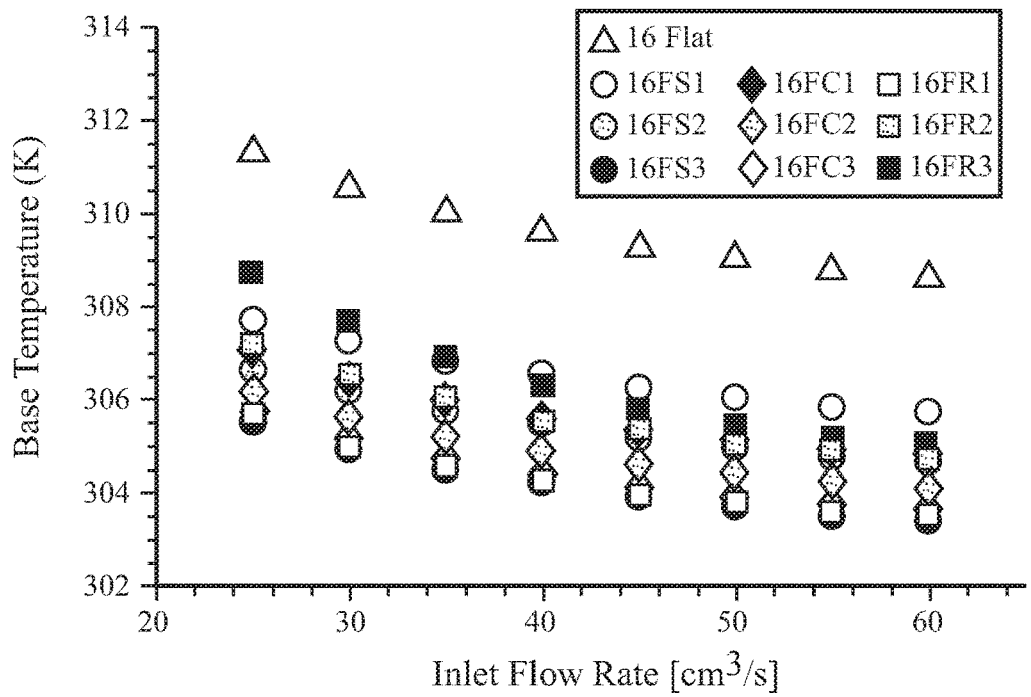
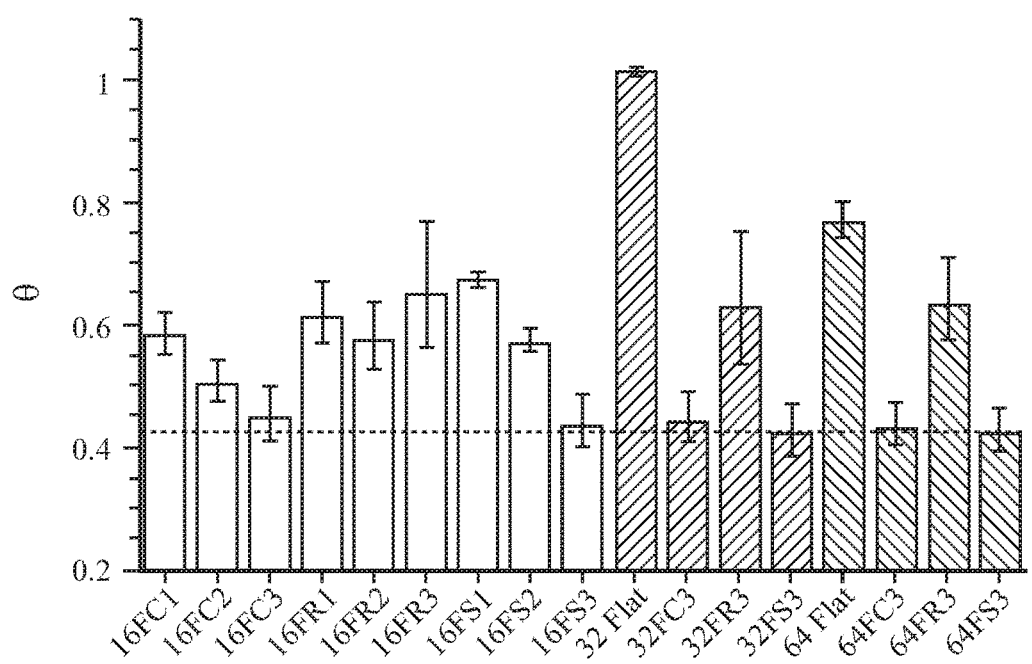
FIG. 31

FIG. 32
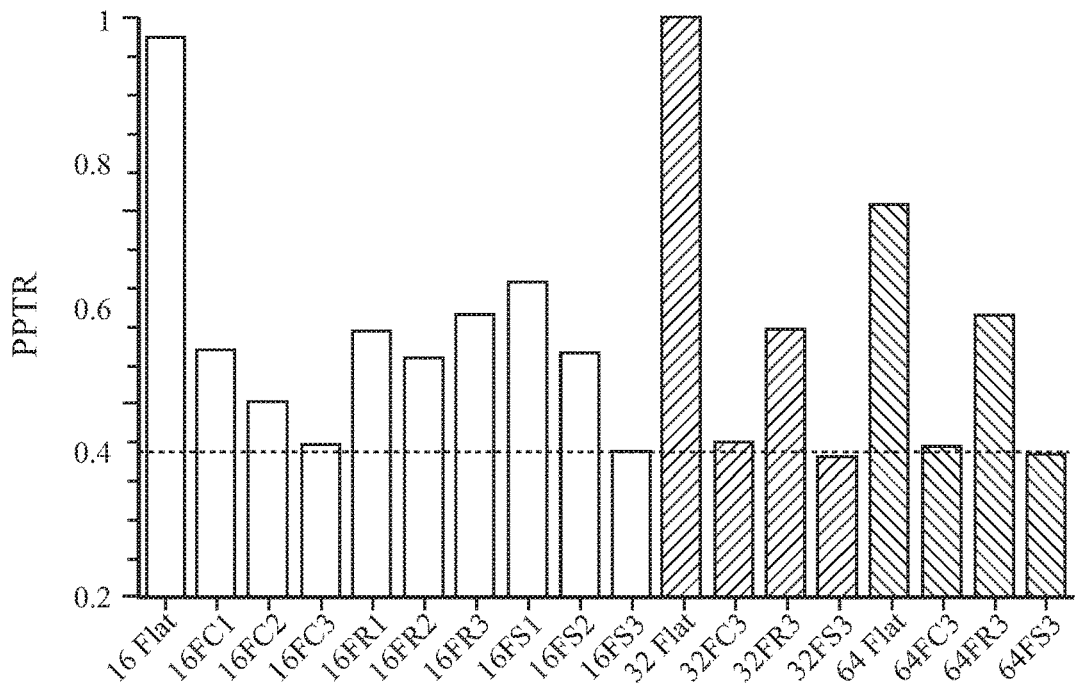
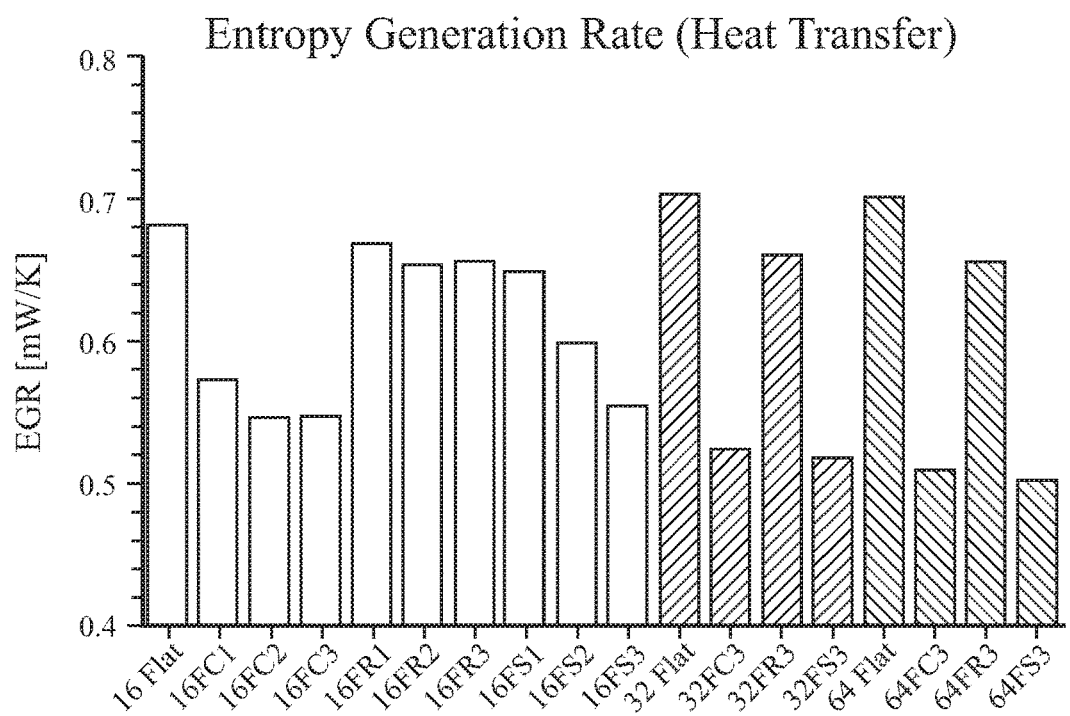
FIG. 33

FIG. 36A
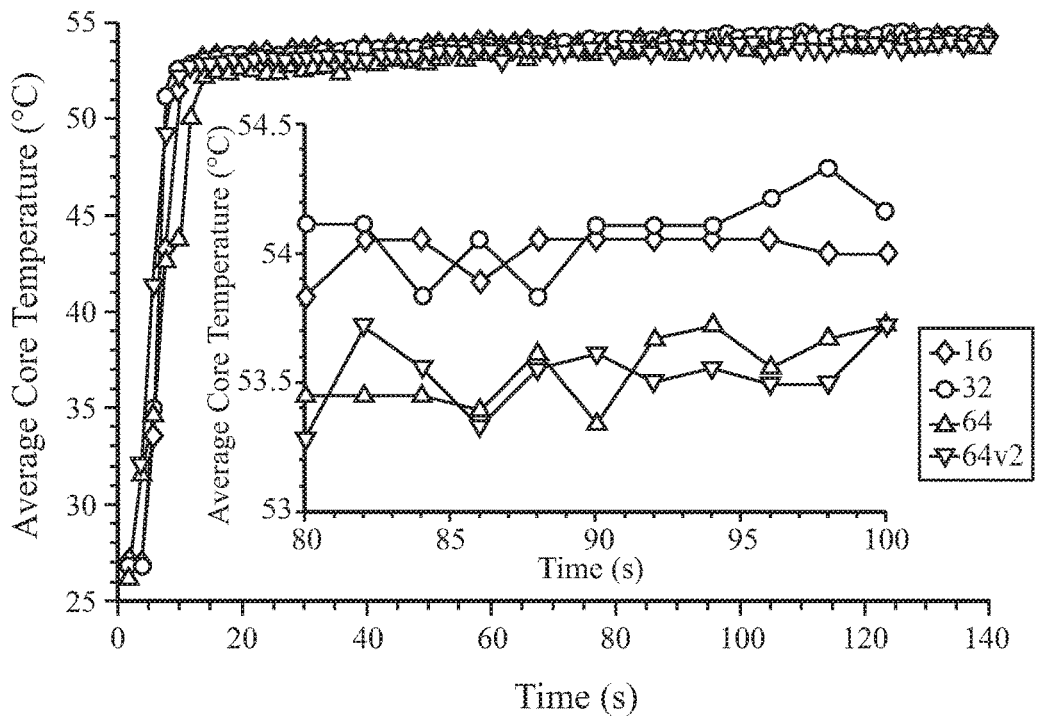
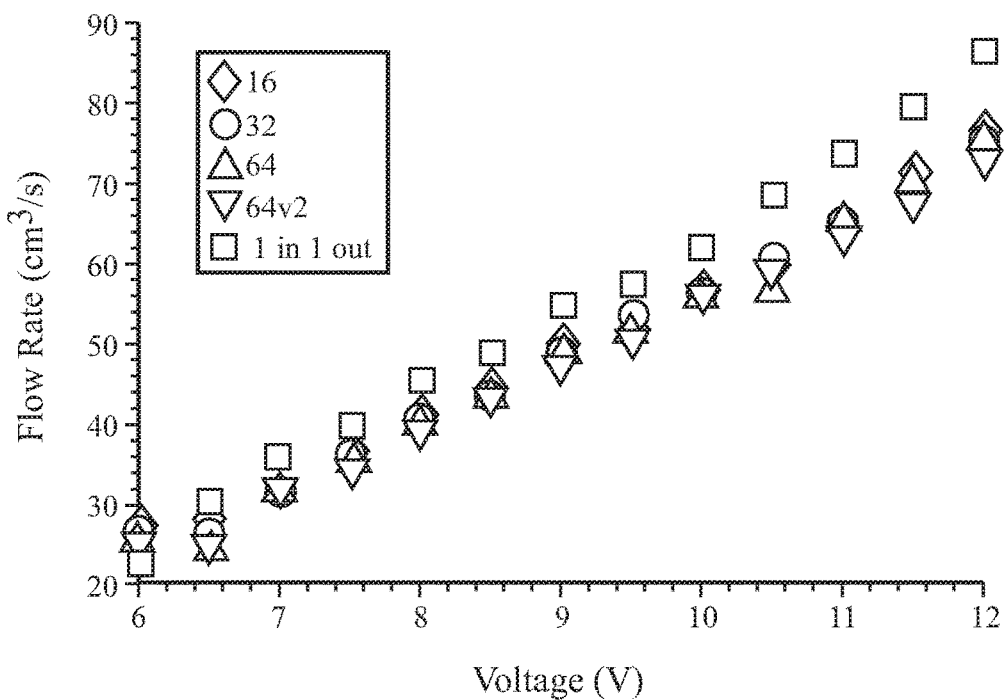
FIG. 36B

FIG. 37
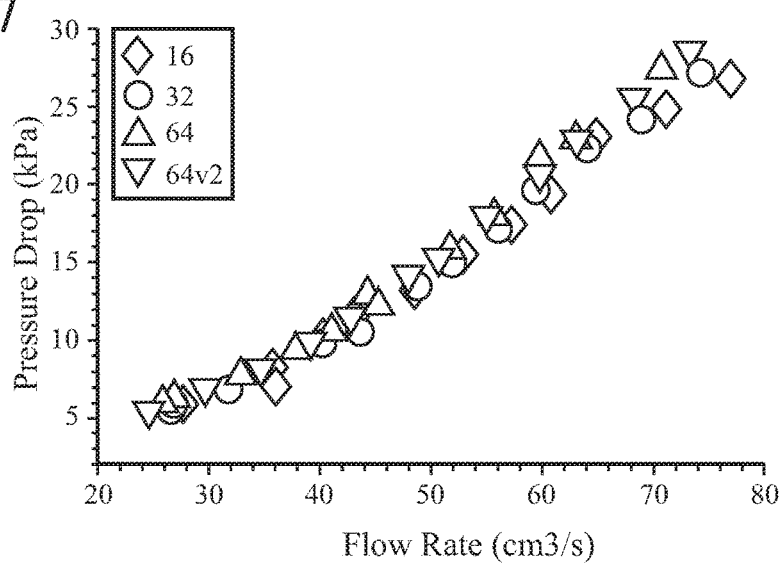
FIG. 38A
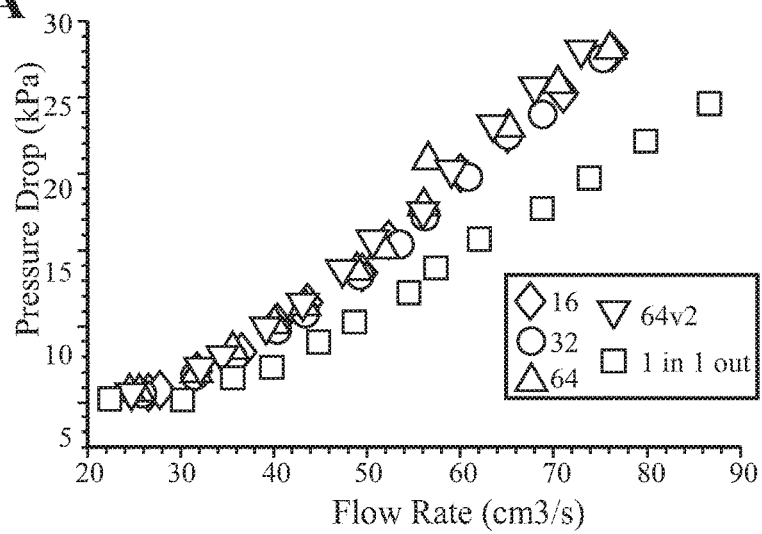
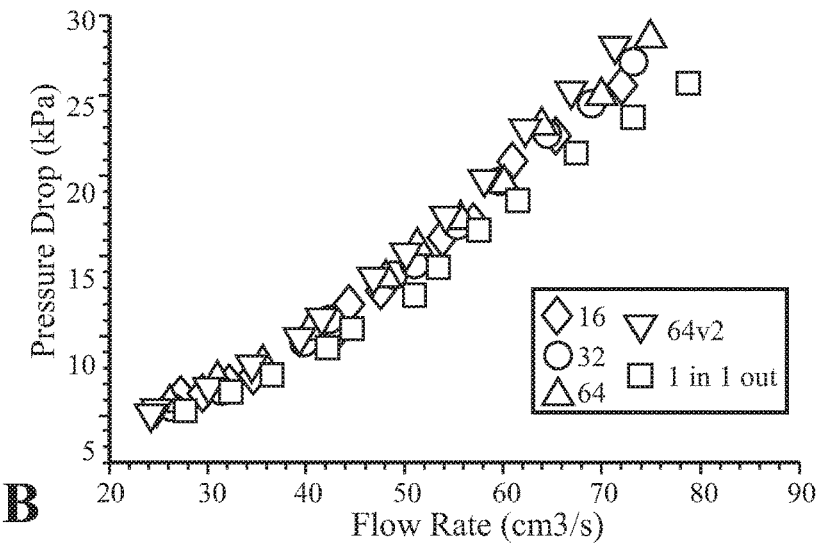
FIG. 38B

FIG. 42A
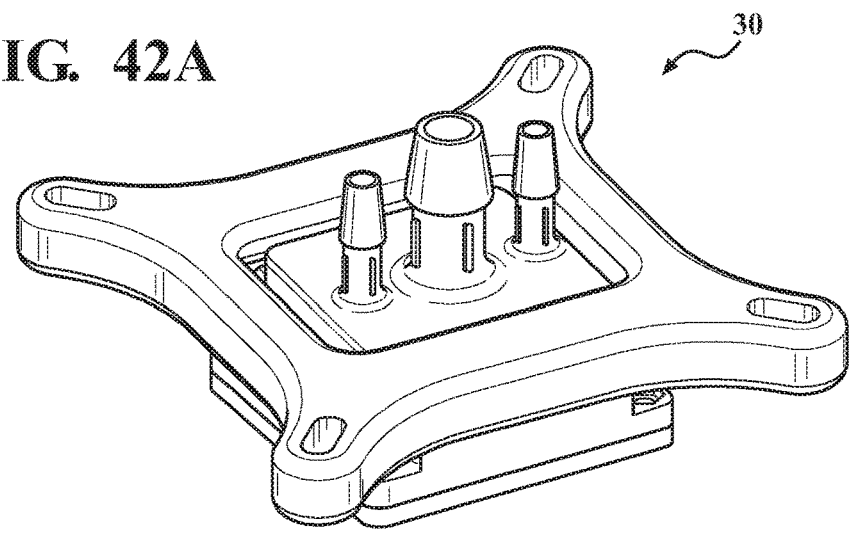
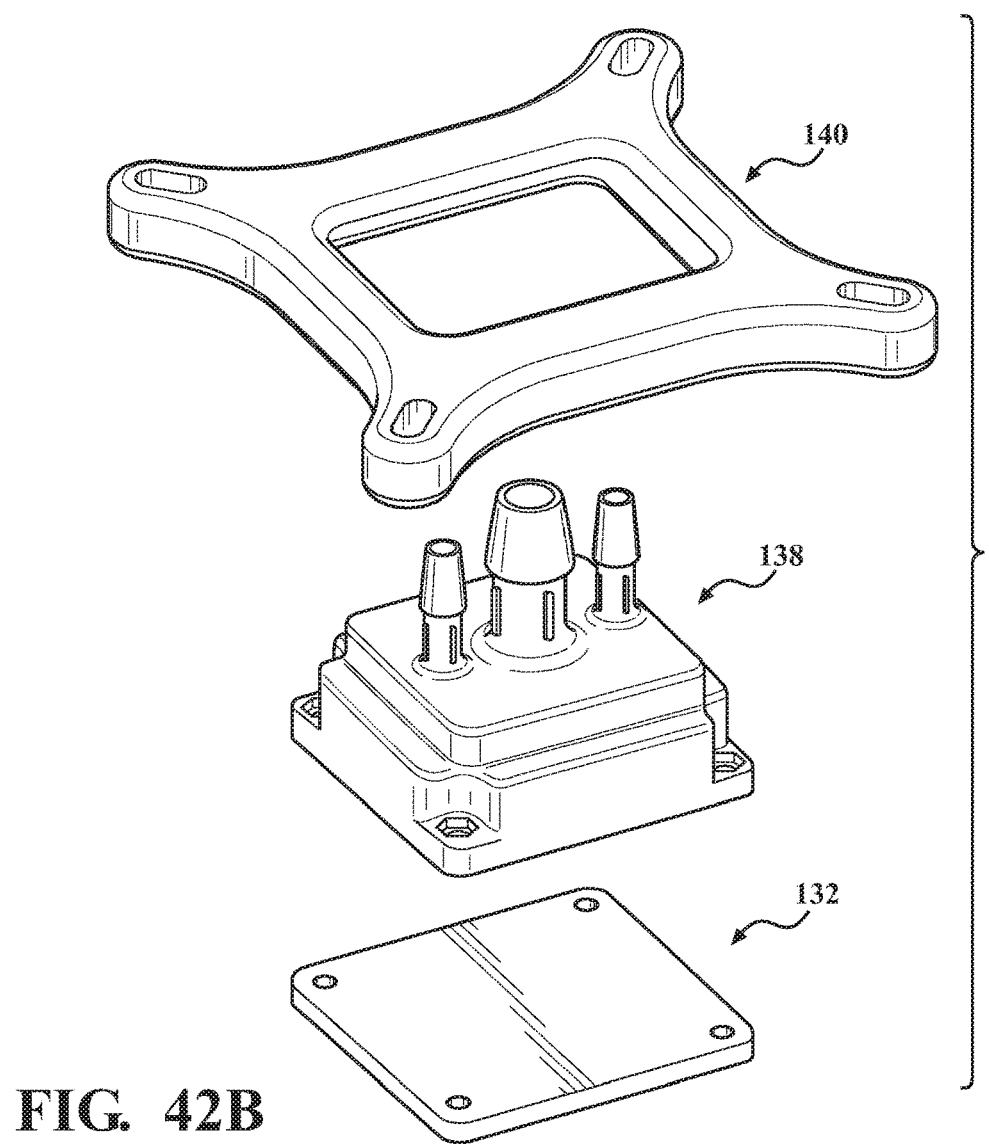
FIG. 42B

HYBRID MICROJET LIQUID-COOLED HEAT SPREADER

REFERENCE TO RELATED APPLICATION

This application is the U.S. National Stage of PCT/US2020/027887 filed Apr. 13, 2020, which claims priority to U.S. Provisional Patent Application Ser. No. 62/832,652, filed Apr. 11, 2019, the entire content of both are incorporated herein by reference in their entirety.

FIELD OF THE INVENTION

This invention relates to the field of liquid cooled heat sinks used for cooling of electronic components.

BACKGROUND OF THE INVENTION

In the light of the fast-paced development track of microscale electronics, such as CPU chips and LED arrays, thermal management has emerged as a vital element in the operation of such devices. The heat generation in multiscale microsystems initiates at the interconnect level and progresses over subsequent length scales [1], where the interconnect level heat transfer analysis is comprehended using mainstream nanoscale heat transfer [2]. With microscale systems as next in the scale order, the need for effective thermal management of such systems can be traced back from the work of Keyes [3], which informed about heat removal from logical circuitry being a limitation to circuit density. To address the issue of heat removal, Tuckerman et al. [4] conducted experimental studies to present a high performance liquid-cooled microchannel heat sink for cooling planar integrated circuits. They essentially demonstrated the variation of the maximum thermal resistance at different flow rates, while targeting a maximum heat flux value of 790 W/cm$^2$ acting over an area of 1 cm$^2$. Nowadays, liquid-cooled heat sinks are used as thermal management for various devices ranging from fuel cells to microscale electronics and solar cells [5].

In their reviews about microchannel cold plates, Adham et al. [6] focused on channel geometries, flow conditions, working fluids, and structural material with an emphasis on the recent growth in dependence of the studies on numerical packages. Dixit et al. [7] underlined different manufacturing techniques ranging from micro-machining to CNC-ultra fine machining as widely used methods for manufacturing microscale cold plates. Jae-Young et al. [8] and Kang et al. [9] examined the application of microchannel heat sinks in the form of closed loop cooling systems for computer chips. Discussions in [8, 9] include the characterization of microchannel heat sinks based on pumping power, thermal resistance, effects of the working fluids, heat dissipation capabilities, and temperature distributions, which are imperative in comprehending the performance of present-day cold plates. Further, Kang et al. [9] also reported copper and its alloys as appropriate materials for wetted components of the closed loop system due to their compatibility with aqueous coolants used in such single phase cooling systems. Yang et al. [10] informed about the cooling capabilities of microchannel heat sinks to cool a computer chip using different pin-fin shapes. The circular pin-fin cold plates were found to have minimum pressure drop as reported in [10]. Experimental investigations pertaining to flow transitions in different pin-fin arrangements in microchannels are discussed in [11]. Further, Xie et al. [12] performed a parametric numerical analysis to address the tradeoff between thermal resistance and pumping power for a minichannels heat sink explaining the effect of channel height, channel width, bottom plate thickness, and inlet velocity. The conclusions dictated a good agreement of numerical models with conventional correlations in the prediction of thermal resistance.

Contributions on the track of microjet cold plates are covered in [13-16], which majorly involve using impinging jets for cooling LED arrays followed by structural improvements for increasing the thermal performance of microjet cold plates. Owing to the high heat transfer coefficient of impinging jets, Luo et al. [13] investigated the feasibility of using a two cavity microjet cold plate to cool a 2×2 LED array with an input power of 5.6 W both, experimentally and numerically. The optimized microjet cold plate was finally tested for cooling a 220 W LED lamp. This was followed by another contribution by Liu and Luo [14], wherein three different microjet configurations, based on different inlet-outlet and jet arrays arrangements were investigated for comparison to cool a 220 W LED lamp. The configuration with one inlet and two outlets was found to have promising cooling performance with a reduced maximum temperature of 23 K in comparison to the previous cases. In another contribution, Husain et al. [15] explored the thermal-hydraulic performance of a varying number of jet arrays for cooling LEDs. The results showed lower thermal resistance for higher flow rates and lower upper cavity height. Moreover, Brunshwiler et. al [17] showed that high-performance microjet thermal management systems required interspersed fluid removal, resulting in complex interconnected 3-D flow networks. This advantageous effect of closely-spaced jets and alternating outlets in microjet cooling was studied in detail by Rattner [18].

Recently, trends have shown interest in hybrid heat sinks, which employ vital combinations of microjets, microchannels, and/or pin-fins as seen in [19-23]. In their work, Husain et al. [19] presented a hybrid heat sink by incorporating microchannel, pin-fins, and impinging jets in different combinations. As per their findings, higher heat transfer coefficients were noted for low jet pitch to jet diameter ratios and low-pressure drop was achieved for high jet pitch to jet diameter ratio. Ghani et al. [20] investigated hybrid microchannel heat sinks using ribs and secondary channels. In their series of investigations, Zhang et al. [22, 23] reported a combination of parametric studies aimed at investigating the effect of channel shape on the performance of hybrid microchannel and slot-jet modules followed by the effect of varied slot-jet locations on a trapezoid channel on the same hybrid heat sink. In [22], the authors compared rectangular, trapezoidal, and circular channels on the basis of pressure drop and thermal performance. Subsequently, efforts were made to optimize the position of slot-jet on the hybrid heat sink in the view of performance of trapezoidal channels as seen in [23].

It would be desirable to overcome the limitations of the existing cooling methods and/or devices to provide a better solution.

SUMMARY OF THE INVENTION

The present disclosure relates to a liquid-cooled heat sink. In some embodiments, the heat sink is made of three parts: the water block, the X-clamp, and a copper plate. The water block has an inlet connected to a resin shell. Inside the shell, a fractal inlet manifold of a non-limiting embodiment divides the inlet coolant flow into several substreams, each one carrying the same flow rate (less than 9% variation between substreams) that eventually exit in the form of liquid jets through small nozzles/microjets at the bottom of the shell. Such an uniform flow distribution ensures that the flow rate in each of the bifurcated substreams/channels is substantially uniform with respect to the other substream/channel. The uniform flow distribution according to the embodiments of this disclosure have the variation between substreams within 20%, more preferably 15%, more preferably 10% and generally within 9%. The union between the shell and the copper plate forms a flood chamber, where the jets impinge on the copper plate, dissipating the heat supplied to the copper plate in contact with the heat source. The warm liquid is removed from the flood chamber through an outlet manifold embedded within the resin shell. The warm fluid exits the water block through two outlet channels after the outlet manifold has merged the several exit substreams from the flood chamber. The X-clamp is used for securing the heat sink in place.

The term "fractal" as used herein means a never-ending pattern. Fractals are patterns that are self-similar across different scales. In one example, they are created by repeating a simple process over and over in an ongoing feedback loop. A fractal object has parts that appear geometrically similar to the whole.

The inlet fractal manifold acts as a uniform flow distribution generator for the fluid flowing towards the copper plate and a collocated extraction network for the exiting fluid. The inlet manifold features a fractal geometry to homogeneously distribute the fluid, while the outlet manifold is strategically placed to collect the exiting fluid in the same plane as the inlet flow. The outlet manifold collects the fluid from the flood chamber from extraction ports collocated near the impinging jets to avoid cross flow and to enhance the heat transfer. It should be noted that embodiments of this invention do not require an accumulation/reserve chamber upstream of the microjets.

In an embodiment, the inlet manifold comprises an inlet duct at one end and an array of microjets at an opposing end. The array of microjets are disposed generally in a jet-plane. The inlet duct is bifurcated into a plurality of multi-level flow channels. First, the inlet duct is bifurcated into two first level flow channels. The bifurcation on each level is based on constant volume distribution, i.e. the volume handled by the inlet duct is same as the volume of fluid that can be handled by the two first level flow channels. Each of these two first level flow channels may be further bifurcated into two second level flow channels. Each of the second level flow channel may be further bifurcated into two third level flow channels. The number of levels in any embodiment may be determined by the various factors specific to each application, such as, amount of heat to be removed, dimensions of the heating surface to be cooled, specifications of the cooling fluid, etc.

The multi-level flow channels are disposed between and connect the inlet duct to the array of microjets. The multi-level flow channels each has a fractal distribution and a bifurcated branched pattern. As noted above, each level of the multi-level flow channels is adapted for constant volume distribution of the fluid on each level of bifurcation. The inlet manifold is adapted for delivering the fluid from the inlet duct to the array of microjets via the multi-level flow channels, i.e. first, second, and third level flow channels.

The heat sink comprises a heat exchange plate that is parallelly disposed at a distance from the jet-plane of the array of microjets. The heat exchange plate has a first surface and a second surface. The first surface comprises an array of area-enhancement features, wherein the area-enhancing features are selected from a group consisting of a round pin fin, a rectangular pin fin, and a square pin fin. The microjets in the array are generally perpendicular to the first surface of the heat exchange plate. The second surface is placed in contact with the heat source of an electronic component. As one of skill in the art will recognize, generally perpendicular means that the microjets are sufficiently close to perpendicular to provide the performance discussed herein. In non-limiting examples, "generally perpendicular" means within 20 degrees or 10 degrees or 5 degrees of perpendicular.

In a non-limiting example, the square pin-fins have a height of about 1.6 mm and a side length of about 1 mm. In some embodiments, the height and the side length of the square pin-fins is in a range of (0.5-2.5 mm) and (0.25-1.50 mm), respectively. In some embodiments, the distance between the area-enhancing features is in a range of 0.1-2.0 mm. The area enhancing features improve the thermal performance of the system. The turbulent flow condition in the flood chamber is a consequence of the operating flow rates, the dimensions of the system, and the viscosity of the cooling fluid. The operating flow rates may be produced using a commercially available pump for a liquid-cooling loop and the hydraulic resistance produced by the flow channels according to this invention.

The heat sink also has a flood chamber defined between the jet-plane of the array of microjets and the first surface of the heat exchange plate. Each of the microjets is adapted to produce a substantially perpendicular impinging jet of the fluid on the first surface.

In this embodiment, the outlet manifold comprises two outlet ducts at one end, a plurality of extraction ports on an opposing end, and an out-of-plane network of channels for draining the fluid from the flood chamber. The out-of-plane network of channels connect the plurality of extraction ports to the two outlet ducts. The extraction ports are disposed generally in the jet-plane and interspersed among the plurality of microjets. Each of the plurality of extraction ports has a diameter that is optimized for minimum pressure drop and maximum heat transfer. The outlet manifold is adapted to drain the fluid in an opposite direction to the direction of impinging jets produced by the microjets. Unlike the plurality of multi-level flow channels of the inlet manifold, the out-of-plane network of channels of the outlet manifold, in an example, may not have a fractal distribution and a bifurcated branched pattern.

In some embodiments, the heat sink has a central-plane running vertically across and dissecting the inlet duct into two halves. The central plane dissects the heat sink into two symmetrical parts, with half of the inlet manifold and outlet manifold on each side and one outlet duct disposed on each side of the central-plane.

In the inlet manifold, the diameter of various levels of channels depends on the bifurcation level. The first levels (e.g. first level flow channel, containing a larger volumetric flow of the working fluid) feature wider channels, while the hydraulic diameter is decreasing for further bifurcation levels (where the volumetric flow is divided). The reason for the reduction of the channel's size is two-fold: 1) an optimization based on the reduction of the pressure drop in the channels for turbulent flow operation informed on the most adequate size of the channels (as per an equation discussed below); 2) in order to maximize the cooling capabilities of the microjets, the exit channels must be as small as possible to increase the exit velocity, but not so small as to drastically increase the pressure losses in the exit channels.

As noted above, this design enables the jets of cooling fluid to impinge substantially perpendicular at the heat exchange plate and the warm fluid is removed from the flood chamber in an opposite direction to the impinging jets, wherein the exiting fluid is flowing in a generally parallel direction with respect to the inflow of the fluid. The impinging jets help in the disruption of the boundary layer and enhancing the energy transport process. In addition, the implementation of impinging jets drastically alters the direction of the flow which now is parallel to the heat flux. Thus, the disruption of the boundary layer and the change of the direction of the flow are two of the enhancement features attained with implementing impinging jets.

As noted above, the liquid-cooled heat sink may be attached to the heat-dissipating component by an external standardized clamping (X-clamp), which allows the implementation of the heat sink to different heat-dissipating electronics, such as computer CPUs. The heat sink is designed to be used with any of the commercially available CPUs/standard computer configurations. The heat sink can be mounted and dismounted without endangering the integrity of the electronic component. Moreover, the assembling of parts in this system permits the replacement of any of the components if required.

In examples of the inlet fractal manifold, each bifurcation level is accompanied by a "step down" to the next bifurcation level, which is in a 3-dimensional distribution instead of a 2-dimensional distribution. This "step down" and the 3-dimensional distribution gives enough space to accommodate the outlet manifold going through the "empty" spaces that the 3-dimensional distribution accommodates. The implementation of the outlet manifold permits to collocate the extraction port parallel to the inlet connection. Hence, the combination of the 3-dimensional inlet distribution and the embedded outlet manifold allows to position the inlet and the outlet ports in locations that are convenient for the implementation in standard computing systems.

It should be noted that the dimensions of the flow channels in the fractal manifold of the heat sink may be determined from an optimization conducted to obtain the lowest pressure drop for turbulent flows. Outlet manifolds according to this disclosure are independent of the inlet manifold structure. This design does not require modifying the electronic/chip component and can be assembled without being permanently attached to the chip structure, using the X-clamp system to fix the whole assembly (shell and impingement plate) to the chip.

The outlet manifold is completely independent to the number of impinging jets in the cooling device. In other words, for 16, 32, or 64 impinging jets, the same outlet manifold can be used. The advantages of having the independent outlet manifold are evident in the manufacturing (it is easier to set a standardized manufacturing procedure for a given geometry instead of one of changing features) and the pressure drop associated with that geometry.

According to one embodiment, the array of microjets is configured to operate under turbulent flow conditions in the flood chamber with the impinging jets on the first surface of the heat exchange plate. In some embodiments, the inlet manifold, the outlet manifold or both are configured to operate under turbulent flow conditions. In some embodiments, at least a portion of each of the plurality of multi-level flow channels, discussed above, are disposed in a channel-plane that is substantially parallel to the jet-plane. As one of skill in the art will recognize, substantially parallel means that the plurality of multi-level flow channels are sufficiently close to parallel to provide the performance discussed herein. In non-limiting examples, "substantially parallel" means within 20 degrees or 10 degrees or 5 degrees of parallel. The plurality of multi-level flow channels may have k number of levels, with each of the k level disposed in a respective channel-plane, and the respective channel-planes of each of the k level of the plurality of multi-level flow channels substantially parallel to each other and to the jet-plane. As one of skill in the art will recognize, substantially parallel (as used in this disclosure) means that the two surfaces are sufficiently close to parallel to provide the performance discussed herein. In non-limiting examples, "substantially parallel" means within 20 degrees or 10 degrees or 5 degrees of parallel. In other embodiments, the plurality of multi-level flow channels may have k number of levels, with each of the k level disposed in a main-plane. In other words, all levels are disposed in the same plane (i.e. coplanar) that is parallel to the jet-plane.

In other embodiments, the number of microjets in the array of microjets are selected from the group of 16, 32, and 64. The main manifold may be manufactured by an additive manufacturing technique. The hybrid microjet liquid-cooled heat spreader/sink may further comprise a water block housing the main manifold and the flood chamber. The water block may be detachably connected to the heat exchange plate. The hybrid microjet liquid-cooled heat spreader/sink may further comprise a X-clamp for mounting the water block on an electronic component.

The number of microjets in the array may be $2^k$, wherein k is total number of levels in the plurality of multi-level flow channels. The ratio between a diameter of each of the plurality of extraction ports and a diameter of each of the microjects may be $$\frac{d_{ep}}{d_{jn}} = 2^{1.3}\left(\frac{JN}{EN}\right),$$

wherein $d_{ep}$ is the diameter of the extraction ports, $d_{jn}$ is the diameter of the jet nozzles, JN is the number of microjets in the array, and EN is the number of extraction ports in the outlet manifold.

In some embodiments, the out-of-plane network of channels of the outlet manifold has at least two levels of channels, each of the at least two levels of channels are disposed in a respective outlet-plane, and each of the respective outlet-planes are substantially parallel to each other and to the jet-plane.

This disclosure also provides a method of cooling an electronic component using a hybrid microjet liquid-cooled heat spreader/sink, comprising the step of providing a main manifold comprising an inlet manifold and an outlet manifold, wherein the inlet manifold comprises an inlet duct at one end and an array of microjets at an opposing end, the array of microjets is disposed generally in a jet-plane, the inlet duct being bifurcated into a plurality of multi-level flow channels, the multi-level flow channels disposed between and connecting the inlet duct to the array of microjets, the multi-level flow channels each having a fractal distribution and a bifurcated branched pattern, the multi-level flow channels each adapted for a uniform flow distribution on each level of bifurcation, wherein the inlet manifold is adapted for delivering the fluid from the inlet duct to the array of microjets via the multi-level flow channels.

Embodiments of the method include the step of providing a heat exchange plate and disposing the heat exchange plate parallelly at a distance from the jet-plane of the array of microjets, the heat exchange plate having a first surface and a second surface, the first surface comprising an array of area-enhancement features, the area-enhancing features selected from a group consisting of a round pin fin, a rectangular pin fin, and a square pin fin, wherein one or more of the microjets in the array are generally perpendicular to the first surface of the heat exchange plate; providing a flood chamber defined between the jet-plane of the array of microjets and the first surface of the heat exchange plate, each of the microjets being adapted to produce a substantially perpendicular impinging jet of the fluid on the first surface; providing the outlet manifold comprising two outlet ducts at one end, a plurality of extraction ports on an opposing end and an out-of-plane network of channels for draining the fluid from the flood chamber, the out-of-plane network of channels connecting the plurality of extraction ports to the two outlet ducts, the plurality of extraction ports being disposed generally in the jet-plane and being interspersed among the plurality of microjets, and the outlet manifold being adapted to draining the fluid in an opposite direction to the impinging jets produced by the microjets; and pumping the fluid into the inlet manifold through the inlet duct and draining the fluid from the flood chamber through the outlet manifold for cooling the heat exchange plate/electronic component.

In some embodiments of the method, the array of microjets is configured to operate under turbulent flow conditions with the impinging jets on the first surface of the heat exchange plate. In some embodiments, the inlet manifold, the outlet manifold or both are configured to operate under turbulent flow conditions. In other embodiments of the method, the step of providing the main manifold comprises disposing at least a portion of each of the plurality of multi-level flow channels in a channel-plane that is substantially parallel to the jet-plane. The plurality of multi-level flow channels may have k number of levels, with each of the k level disposed in a respective channel-plane, and the respective channel-planes of each of the k level of the plurality of multi-level flow channels are substantially parallel to each other and to the jet-plane. The number of microjets in the array of microjets may be selected from the group of 16, 32, and 64.

In some embodiments, the step of providing the main manifold comprises manufacturing the main manifold by an additive manufacturing technique. The method may further comprise a step of providing a water block, and housing the main manifold and the flood chamber in the water block. The water block may be detachably connected to the heat exchange plate. The method may further comprise a step of providing a X-clamp and mounting the water block on the electronic component. In some embodiments, the number of microjets in the array is $2^k$, wherein k is total number of levels in the plurality of multi-level flow channels.

The ratio between a diameter of each of the plurality of extraction ports and a diameter of each of the microjets may be $$\frac{d_{ep}}{d_{jn}} = 2^{1.3}\left(\frac{JN}{EN}\right),$$

wherein $d_{ep}$ is the diameter of the extraction ports, $d_{jn}$ is the diameter of the jet nozzles, JN is the number of microjets in the array, and EN is the number of extraction ports in the outlet manifold. The out-of-plane network of channels of the outlet manifold may have at least two levels of channels, each of the at least two levels of channels are disposed in a respective outlet-plane, and each of the respective outlet-planes are substantially parallel to each other and to the jet-plane.

The development track of liquid-cooled heat sinks (cold plates) presented herein, covers a range of investigations pertaining to microchannel, microjet, pin-fin, and modern-day hybrid cold plates which, lay a foundation for this disclosure.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. In the drawings:

FIG. 1A is a schematic showing a 3-D computational model and primary boundary conditions of a microjet cold plate benchmark model;

FIG. 1B is a schematic showing a 3-D computational model and primary boundary conditions of a hybrid microjet heat sink with 64 coplanar channel branches;

FIG. 2A is a perspective view of a solid model of a hybrid channel and jet manifolds with coplanar channels;

FIG. 2B is a perspective view of a solid model of a hybrid channel and jet manifolds with out-of-plane channels;

FIGS. 3A, 3B and 3C are perspective, lateral, and top views, respectively of a solid model for the 64V2-MO configuration, wherein FIG. 3A is the perspective view of a solid model of the inlet and outlet manifolds for the "MO" hybrid microjet heat sinks, FIG. 3B is the lateral view with indicated flow path directions inside the inlet and outlet manifolds, and FIG. 3C is the top view of the "MO" hybrid microjet heat sinks;

FIG. 13A is an impinging surface view of a velocity distribution image;

FIG. 13B is a lateral cross-section view of a velocity distribution image;

FIG. 21 is a graph of pressure drop of the hybrid heat sinks;

FIG. 22 is a graph of the inlet flow rate versus base temperature for the hybrid heat sink configurations;

FIG. 23 is a graph comparing the thermal performance for the hybrid heat sinks with respect to a design with 16 jet nozzles without deflectors;

FIG. 24 is graph of the PPTR parameter for various hybrid heat sinks;

FIG. 26 is a graph of frictional entropy generation rates for various hybrid heat sinks;

FIG. 27 is another graph of entropy generation rate due to the overall heat transfer for various hybrid heat sinks;

FIG. 28 is a graph showing pressure drop across the 16-jet nozzle hybrid heat sinks;

FIG. 29 is a graph of percentage change in pressure drop for the various hybrid heat sinks;

FIG. 30 is a graph of base temperature for various 16-jet nozzle hybrid heat sinks;

FIG. 31 is a graph of thermal performance for various hybrid heat sinks;

FIG. 32 is another graph of the PPTR parameter for various hybrid heat sinks;

FIG. 33 is another graph of entropy generation rates due to heat transfer for various hybrid heat sinks;

FIG. 36A is a graph of average core temperature as a function of time for all hybrid heat sinks using a plain copper plate operating at 12V;

FIG. 36B is a graph of flow rate in the cooling loop as a function of the pump operating voltage;

FIG. 37 is a graph of pressure drop measurements as a function of flow rate for different hybrid heat sinks;

FIG. 38A is a graph of pressure drop measurements as a function of the flow rate for different heat sink designs with circular fins on the copper plate;

FIG. 38B is a graph of pressure drop measurements as a function of the flow rate for different heat sink designs with square fins on the copper plate;

FIG. 42A is a schematic of a water block assembled with a copper plate and a X-clamp; and FIG. 42B is an exploded view of water block shown in FIG. 42A, with a flat (featureless) copper plate.

DETAILED DESCRIPTION OF THE INVENTION

Figure 3A:
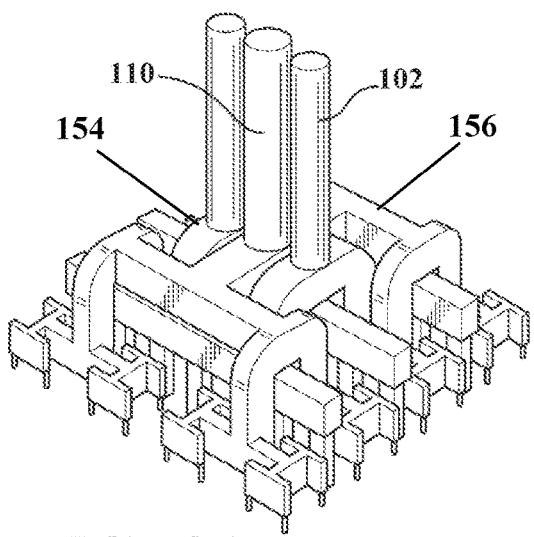

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

A parametric optimization of a novel hybrid configuration of liquid-cooled heat sinks is presented herein. Such a hybrid design encompasses a combination of channels and microjets for optimal performance of chip scale high-power density electronic packages. Fractal flow channel geometries were used to create variants consisting of 16, 32, and 64 microjets in the impingement cavity. In addition to the conventional coplanar setup, where channels and area enhancing features align with the main flow direction, an out-of-plane network of channels was created to allow for removal of the cooling fluid in the opposite direction of the impinging jets. The parametric analysis was performed via 3-D CFD simulations to investigate the tradeoff between hydraulic and thermal resistances in jet cooling systems. The thermal resistance of the heat sinks was estimated and the pressure drops for every design were calculated. Observations of the flow patterns were used to inform on the optimization process of the architecture of the flow channels. A metric able to merge thermal and hydraulic performance was defined, such that the thermo-fluid characteristics of a liquid cooled heat sink are represented using one parameter. The utilization of this parameter led to a unique performance assessment of the proposed hybrid liquid-cooled heat sinks and allowed to identify an optimum design, which provides the lowest thermal resistance at the lowest pumping power input.

The current investigation comprehends the feasibility of the combination of fractal channels [24] and microjets to cool a computer chip operating at 150 W. A dimensionally similar two-cavity microjet cold plate, as presented by Luo et. al [13], was used as a benchmark. The combination of fractal channels and microjets harvested the benefits of flow uniformity of fractal channels [25] and mid-range pressure drop of microjet cooling blocks [26]. The framework of the current study is established by the thermal-fluid characterization of hybrid cold plates, which consist of three variants each of 16, 32, and 64 channels manifolds after being optimized for the lowest pressure drop possible. Two alternative cases were analyzed: hybrid microjet heat sinks with out-of-plane channels on the manifold, and hybrid microjet heat sinks with an added outlet manifold system, aiming to improve the feeding and draining of the cooling fluid. The tradeoff between pressure drop and cooling efficiency was parametrically investigated by varying the size of the jet nozzles, a dimension that was dependent on the optimization equations used to design the fractal channel manifolds. 3-D CFD simulations were used to model the thermal-fluid characteristics of the cold plates and the results inform about hydrodynamic and thermal performance in the form of pumping power and thermal resistance respectively. An optimum geometry was found in terms of a novel parameter able to account for the thermal performance of a cold plate over a wide range of flow rates and the resulting pressure loses. Such an optimum design balances high heat dissipation at the lowest possible pumping requirements.

Cold Plate Configurations

The thermal performance of a series of hybrid liquid-cooled heat sinks was investigated by means of 3-D CFD simulations. A benchmark microjet cold plate, similar to the one reported by Ramos-Alvarado et al. [26] and Luo et. al [13], was used for comparison purposes. The computational domain for the benchmark cold plate 10 according to the prior art is presented in FIG. 1A, which consists of 216 jets (106) of diameter 1.4 mm each. The benchmark case is formed by an inlet chamber and an outlet chamber (shown as fluid domain 108) separated by a perforated screen that allows the formation of jets impinging on a copper plate. FIG. 1A also shows the position of the chip package 104 (heat source), the position of the inlet and outlet ducts (110, 102), solid domain 116, and a symmetry condition wall 112 that allows to minimize the computing efforts. The computational domain of a version of the hybrid microjet heat sink 20 with coplanar channels is depicted in FIG. 1B. Unlike the benchmark design, there is only one chamber 108 (where the jets form), the inlet chamber has been substituted by a manifold 114 formed by a fractal structure of rectangular cross-section channels, and the inlet duct 110 is normal to the plane of the jets 118. FIG. 1B also shows the position of the chip package 104. Symmetry wall 112, solid domain 116, inlet 110, and outlet 102.

The dimensions of the fractal channels in the manifold are given by a set of recursive equations [24]. The number of channels ($N_k$) is given by a $2^k$ factor, where k is the bifurcation level. The value of k was varied in order to obtain 16, 32, and 64 microjets at the exit of the manifold. The length $l_k$ of each channel, at the branch level k is determined by $$l_k = \begin{cases} \dfrac{L}{2^{(k+2)/2}} & k = 2, 4, 6, \ldots \\ \dfrac{L}{2^{(k+3)/2}} & k = 1, 3, 5, \ldots \end{cases} \quad (1)$$

where L, the side length of the cold plate, i.e., 50 mm for all the configurations analyzed herein.

The width of the channels is determined after minimizing the pressure drop using the Lagrange multipliers method under the constraint of constant system volume. After several steps of algebra, the objective function was $$\phi = \sum_{i=0}^{n} \left\{ \frac{C_k(h+w_k)^2}{N_k(hw_k)^3} + \lambda l_k h w_k N_k \right\} \quad (2)$$

where $w_k$ is the width of the channel at the branch level k, h is the height of the channel, $N_k=2^k$ indicates that two branches are generated per bifurcation level k, $\lambda$, is the Lagrange multiplier, and $C_k=51.4+5.42\ w_k/h$ accounts for the variation of the friction coefficient as a function of the aspect ratio ($w_k/h$) of the channel, valid for $1 \leq w_k/h \leq 4$, where the friction factor $f=C_k/Re_k$ and $Re_k$ is the Reynolds number in the branch level k. The first term in Eq. (2) represents the pressure drop of the branch level k and the second term is the total volume constraint. Fan et. al. [24], conducted a similar optimization process by assuming that $C_k$ did not significantly vary between bifurcation levels. The widths leading to lowest pressure drop are given by:

$$\left(\frac{w_{k+1}}{w_k}\right)4\frac{(w_k+h)(w_k+2.4743h)}{(w_{k+1}+h)(w_{k+1}+2.4743h)} = \frac{1}{4} \quad (3)$$

which is similar to the result presented in Ref. [24], except for the fact that the constant multiplying h is 3.0 while we obtained 2.4743. Eq. (3) has a more rigorous derivation and represents only half of the optimization. At some point, the definition of the aspect ratio has to be inverted to $h/w_k$, such that the definition of $C_k$ still holds. Thus, in order to keep accounting for the aspect ratio effect in the optimization process, the following equation is applied $$\left(\frac{w_{k+1}}{w_k}\right)5\frac{(w_k+h)(51.4w_k^2+165.12w_kh+11.84h^2)}{(w_{k+1}+h)(51.4w_{k+1}^2+165.12w_{k+1}h+11.84h^2)} = \frac{1}{4} \quad (4)$$

The width of the first level $w_0$ was fixed by the inlet diameter of the manifold, while the height of the channels h was set to 4.5 mm. It shroud be noted that the diameter of the jet nozzles is given by the width of the last bifurcation level. FIG. 2A illustrates the shape of the channels in a coplanar configuration manifold with 64 nozzles. A second manifold design was introduced by generating out-of-plane channels, similar to Ref [27]. This alternative design alleviates manufacturing concerns created by the thin walls in between the channels in the coplanar designs, see FIG. 2B.

A parametric analysis was conducted by varying the inlet diameter, which is the input parameter to design the manifolds, including the nozzles diameter and the number of bifurcations and nozzles. This was done in an effort to find the most ideal system able to balance low pressure drops and high cooling capabilities. The nomenclature used to identify the different hybrid cold plate configurations is given by JN VX, where JN is the number of jet nozzles and VX indicates the inlet diameter according to the information given in Table 1 below. The nomenclature rules apply for all configurations with minor modifications, e.g., adding "3D" at the end of the design name indicates an out-of-plane channels manifold. FIGS. 2A and 2B depict the designs 64V2 and 64V2-3D, respectively.

TABLE 1

Inlet and nozzle diameters of the different hybrid cold plated heat sink configurations.

| Design | Inlet Diameter [mm] | Jets Nozzle Diameter [mm] | | |
|---|---|---|---|---|
| | | 16 | 32 | 64 |
| V1 | 5.00 | 1.50 | 1.03 | 0.71 |
| V2 | 5.25 | 1.56 | 1.07 | 0.74 |
| V3 | 5.50 | 1.62 | 1.11 | 0.77 |
| V4 | 5.75 | 1.69 | 1.16 | 0.80 |
| V5 | 6.00 | 1.75 | 1.20 | 0.83 |

Figure 3B:
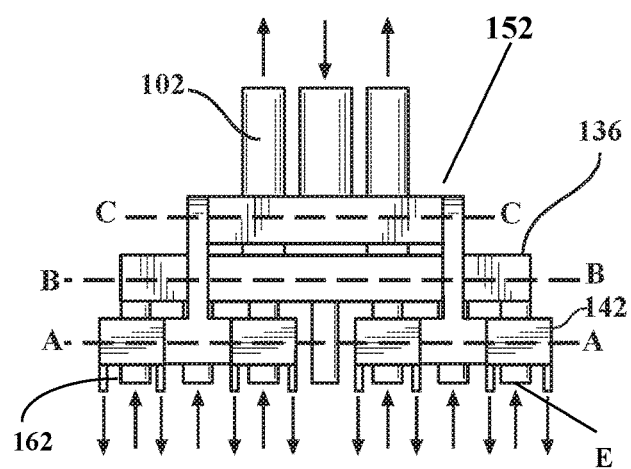
Figure 3C:
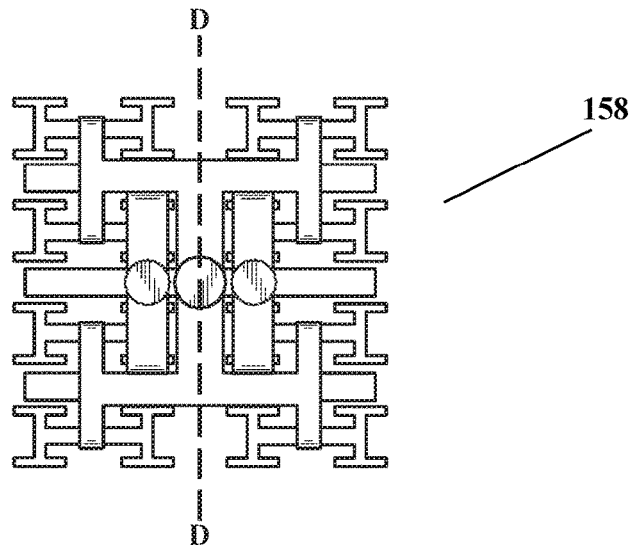

One last set of alternative designs was proposed by introducing an outlet manifold for the hybrid cold plate heat sink. This new iteration targets two objectives: 1) to optimize the space for the cooling loop system pipeline by placing the inlet and outlets on the same plane, and 2) to take advantage of the interspersed fluid extraction ports effect reported by Rattner [18]. The same nomenclature rules apply for naming this new iteration of designs by only adding "MO" at the end of the design name. Perspective, lateral, and top views of a solid model for the 64V2-MO configuration are shown in FIGS. 3A, 3B, and 3C, respectively. An embodiment of a hybrid microjet liquid-cooled heat spreader/sink comprises a main manifold 158 having an inlet manifold 156 and an outlet manifold 154. The inlet manifold comprises multi-level flow channels 152. The configuration has an inlet duct 110, two outlet ducts 102, a plurality of microjets 142 and an out-of-plane network of channels 136 for draining the fluid from the flood chamber 108.

Figure 3D:
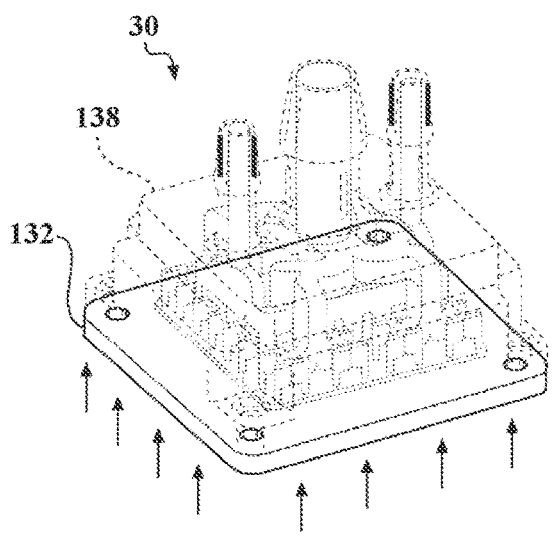
FIG. 3D is an external view of an embodiment with a resin-made case attached to the heat spreader of a hybrid heat sink for removing heat from a copper plate.
Figure 3E:
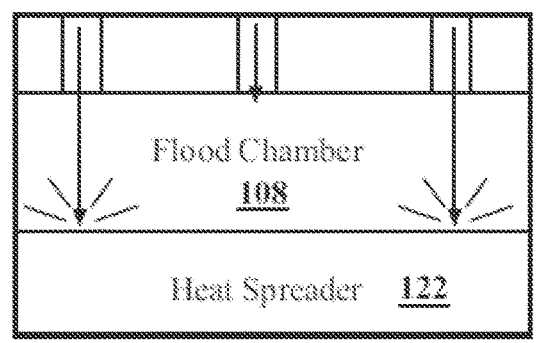
FIG. 3E is a schematic of the jets impinging on the heat spreader inside the flood chamber.

In a non-limiting example, the inlet duct is bifurcated into a plurality of multi-level flow channels that has k number of levels, and each of the k level disposed in a respective channel-plane, e.g. channel-plane along CC in FIG. 3B. The array of microjets are disposed generally in a jet-plane, e.g. along AA in FIG. 3B. The outlet duct is divided into the out-of-plane network of channels at one or more levels, and each level of channels is disposed in a respective outlet-plane, e.g. along BB in FIG. 3B. As noted above, in some embodiments, the heat sink has a central-plane (along DD in FIG. 3D) running vertically across and dissecting the inlet duct into two halves. The central plane dissects the heat sink into two symmetrical parts, with half of the inlet manifold and the outlet manifold on each side and one outlet duct disposed on each side of the central-plane. FIG. 3D shows an embodiment comprising a water block 138 housing a hybrid microjet liquid-cooled heat sink 30 that is connected to a copper plate 132. The copper plate 132 is connected to a heat source (not shown). The heat generated by the heat source is transferred to the copper plate 132, and thereafter, the hybrid heat sink 30 removes the heat from the copper plate 132, thus managing heat/temperature of the heat source. FIG. 3E is a close-up view of a part of the flood chamber 108, wherein the microjets produce impinging jets of the fluid on the heat spreader/copper plate 122.

The inlet manifold is the same as the homologous versions of the out-of-plane designs and has the same dimensions prescribed in Table 1. For the design of the outlet manifold, an equivalent design process was implemented. The outlet manifold has two levels of channels, regardless of the number of jet nozzles, and the input parameter for its design is the diameter of the extraction ports. The diameter "E" (as shown in FIG. 3B of the extraction ports 162 is determined by the nozzle diameter, applying Eq. (5), which is a modified version of Murray's law [28, 29] with a weight factor for the ratio between the number of nozzles and extraction ports.

$$\frac{d_{ep}}{d_{jn}} = 2^{1/3}\left(\frac{JN}{EN}\right), \quad (5)$$

where $d_{ep}$ is the diameter of the extraction ports, $d_{jn}$ is the diameter of the jet nozzles, JN is the number of jets, and EN is the number of extraction ports, which was set to 21 for all the designs. The extraction ports are evenly distributed between the jet nozzles and connected by three main channels at the first level of the manifold. The width of the channels in the first level is given by the diameter of the extraction ports. For the second level of channels, the width is obtained after applying Eq. (3). This second level of channels is connected to the two outlets.

Figure 3F:
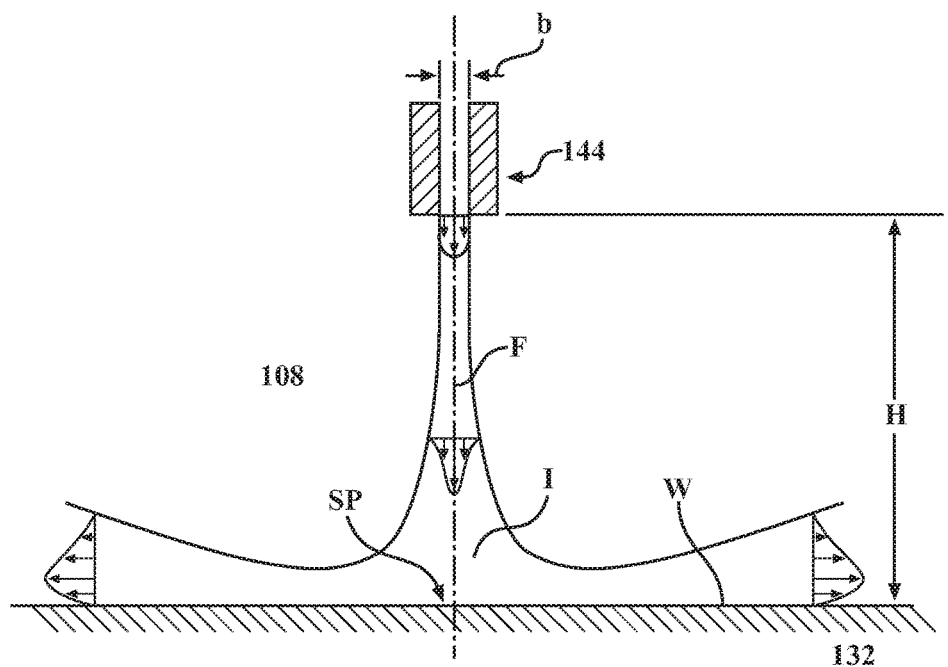
FIG. 3F is another schematic of a jet impinging on the heat spreader inside the flood chamber.

FIG. 3F is another schematic of a jet impinging on the heat spreader inside the flood chamber 108. A microjet/nozzle 144 has a diameter b, which may be determined as discussed above. The tip of the nozzle 144 is at a distance H from the surface of the heat spreader 132. The heat spreader may be a copper plate. The impinging jet produced by the nozzle 144 travels substantially perpendicular to the heat spreader 132 in a free jet area F. As one of skill in the art will recognize, substantially perpendicular means that the impinging jet is sufficiently close to perpendicular to provide the performance discussed herein. In non-limiting examples, "substantially perpendicular" means that the impinging jet is within 20 degrees or 10 degrees or 5 degrees of perpendicular with respect to the heat spreader. The fluid jet then hit the surface of the heat spreader 132 at the impact area I and spreads flat in the wall jet area W around the impact area I. The heat from the heat spreader is absorbed by the fluid that is drained out of the flood chamber 108 by the extraction ports.

Due to the complexity of the manifold geometry and the dimensions of the channels, some of them below 1 mm, it is necessary to rely on additive manufacturing techniques to ensure a cost-effective manufacturing process [30, 31]. Concerns in dimensions variability can arise from the manufacturing approach; however, the technological advances in additive manufacturing allow for the fabrication of channels as small as 200 µm, with resolutions of 10 µm [32, 33].

Computational Model and Analysis
Modeling Assumptions

The hydraulic and thermal performance for the coplanar, 3-D, and MO designs was investigated using 3-D CFD simulations. The simulations were conducted under the following assumptions:
  Steady-state operation
  Incompressible flow.
  Laminar flow regime (700<Re<1650).
  Constant thermo-physical properties.

Governing Equations and Discretization

Under the aforementioned assumptions, the governing equations that describe the hydrodynamic and thermal behavior of the systems are:

Continuity $$\nabla \cdot \vec{u} = 0 \tag{6}$$

Momentum $$(\vec{u} \cdot \nabla)\vec{u} = -\nabla P + \mu \nabla^2 \vec{u} \tag{7}$$

Energy $$\rho c_p (\vec{u} \cdot \nabla) T = k \nabla^2 T \tag{8}$$

The governing equations were discretized and solved in the computational environment of ANSYS FLUENT® (v19.1). Grid size independent results were obtained for the different computational models. The CutCell algorithm [34] was implemented for the mesh generation of the coplanar designs, while a Polyhedral Mesh Generation Algorithm [35] was used for both, the 3-D and MO configurations. To ensure grid size independent results, the number of cell elements in the grids was increased while the pressure drop and thermal resistance were monitored in every iteration. The grid size independent condition was obtained when the variation of the monitored variables was below 5% for different models. An average number of 5.5 million grid elements was necessary to achieve grid independent results for the CutCell grids, while approximately 3.5 million grid elements were necessary for the Polyhedral grids.

A second order upwind discretization scheme was used for the momentum and energy equations, with a least squares cell based gradient method. The coupling of pressure and velocity was achieved by means of the SIMPLE algorithm. The under-relaxation factors were set as follows: 0.3 for pressure, 0.5 for momentum, and 1 for density, body forces, and energy. The convergence of the numerical solution was achieved when the scaled residuals for the continuity and momentum equations reached a value of $10^{-6}$, while the criterion for the energy equation scaled residuals was to reach a value of $10^{-10}$.

Simultaneously, in order to verify the convergence and stability of the solution, the area-weighted average temperature at the surface in contact with the chip package and the pressure drop across the heat sink were computed and monitored each iteration.

Boundary Conditions

The primary boundary condition zones are depicted in FIG. 1. The geometric arrangement of the channels generates a symmetric flow distribution through the system, allowing to apply symmetry boundary conditions at the planes that divide the computational domains into quarters. The external walls of the 3D models were defined as insulated, with the exception of the surface zone in contact with the chip package. Such a surface is a square of dimensions of 30 mm per side and centered in the 50 mm per side plate. This surface is exposed to a constant heat input of 150 W. A special case where the heat transfer area is the whole 50 mm side length base plate is also analyzed; a postfix "a" is added at the end of the name for such configurations.

The flow inlet condition was a uniform temperature of 300 K and uniform velocity profile determined by a range of volumetric flow rates varying from 2.6 to 5.2 cm³/s. The outlet boundary condition was defined as a zero-gauge pressure, and the interface between the solid and fluid was considered impermeable. Water was the cooling fluid ($k_f$=0.6 W/(m–K), $c_{p,f}$=4182 J/(kg–K), $\mu_f$=1.003×10$^{-3}$ kg/(m–s), and $\rho_f$=998.2 kg/m³), while the solid heat sink material was set as cooper ($k_s$=387.6 W/(m–K), $c_s$=381 J/(kg–K), and $\rho_s$=8978 kg/m³).

Analysis Parameters

An appropriate operation of the cold plates requires from the cooling fluid to be able to take away the highest possible excess heat from the chip package in order to maintain a relatively low temperature in the device, while consuming the lowest possible pumping power. To characterize the thermal performance of the different cold plate configurations, the average temperature at the heating surface of the chip package was monitored, and an estimated thermal resistance was computed as $$R = \frac{\overline{T}_s - T_{in}^f}{Q} \tag{9}$$

where $\overline{T}_s$ is the average temperature at the heated surface, $T_f^{in}$ is the water temperature at the inlet (300 K), and Q is the heat input dissipated by the chip package (150 W).

The cold plate's performance was also described in terms of its hydraulic operation, which can be characterized from the pressure drop in the cold plate system and the corresponding inlet flow rate condition. The pumping power consumption is defined as $$\dot{W}_p = \dot{V} \Delta P \tag{10}$$

where $\Delta P$ is the pressure drop of the water through the channels of the cold plate and $\dot{V}$ is the volumetric flow rate.

A tradeoff can be identified between the lower thermal resistance values, for a better cooling performance, and the needed pumping power to operate the system. In an attempt to take into account, the effect of both parameters into a single metric, the following performance parameter was defined $$PPTR = \int Rd\,\dot{W}_p \tag{11}$$

The PPTR parameter represents the area under the curve of the thermal resistance as a function of the pumping power, such that an individual increment of these parameters would increase the magnitude of the PPTR. Large values in both, thermal resistance and pumping power, indicate a poor efficiency of the cooling system; conversely, lower PPTR values indicate an enhanced overall performance. By using a single value metric, we can compare a large number of different designs under a wide range of operating conditions without the need to look into the individual behavior of the thermal resistance and pumping power in the system.

Results and Discussion

After obtaining grid independent results and prior to the performance characterization of the cold plate configurations, the energy conservation was verified for all simulations. The results are divided into three sections, corresponding to the parametric analysis of the three sets of hybrid cold plate configurations, namely: 1) coplanar channels manifold, 2) out-of-plane channels manifold and 3) integrated outlet manifold system configurations.

Hybrid Cold Plate Configurations with Coplanar Channels Manifold

The performance of the cold plates with coplanar channels was studied under different flow rate conditions. A parametric analysis was conducted for the different inlet diameters indicated in Table 1 and for 16, 32 and 64 jets. The objective of this analysis was to identify an optimum manifold design that would allow to have high jet velocities at the lowest possible pumping power.

Figure 4:
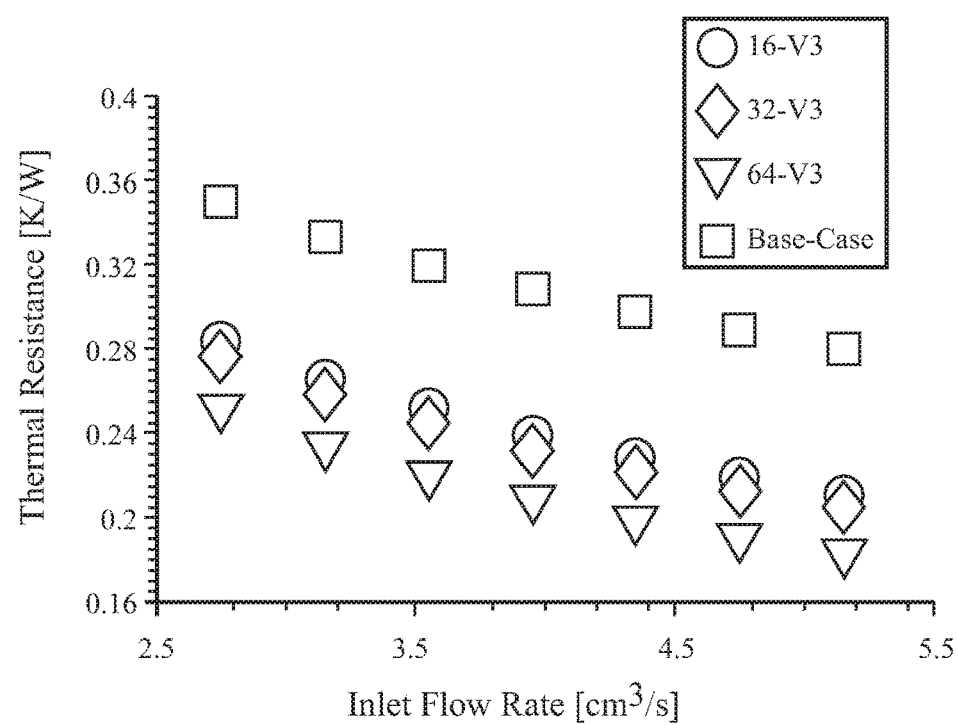
FIG. 4 is a graph of thermal resistance as a function of inlet flow rate in the laminar regime.

An improvement in the thermal performance of the hybrid cold plate designs with respect to the benchmark configuration is shown in FIG. 4, where the thermal resistance values are presented for the V3 designs with different number of microjets. FIG. 4 is a graph of thermal resistance as a function of inlet flow rate for coplanar channels designs with a 5.5 mm inlet diameter and different number of jets. Base case results are included for comparison. Improvements in thermal resistance are in the range 19%-25% for 16V3, 21%-27% for 32V3 and 28%-35% for 64V3. Similar trends are observed for the other versions, showing slightly lower thermal resistance as the inlet diameter gets smaller. It is observed that as the number of jets increases, the average temperature at the interface between the chip and the cold plate decreases, resulting in lower thermal resistance values, see FIG. 4, where the improvement is more prominent for the 64 jets design.

Figure 5A:
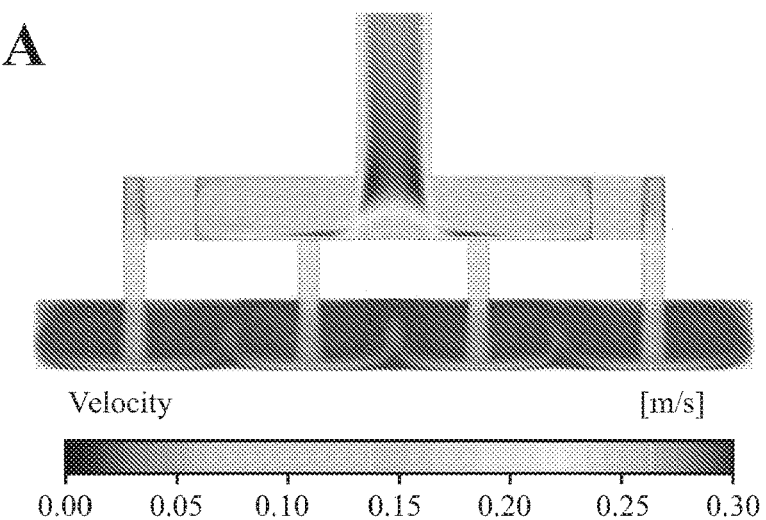
FIGS. 5A to 5C are velocity distribution contours showing a comparison of jets velocity distribution.
Figure 5B:
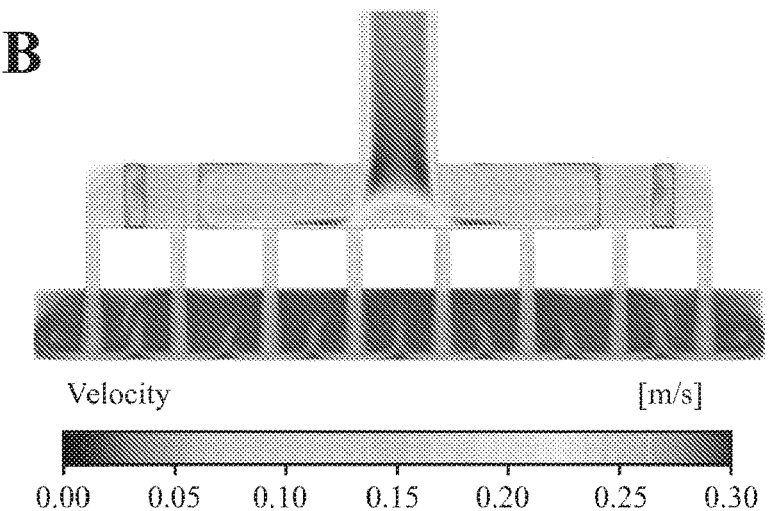
Figure 5C:
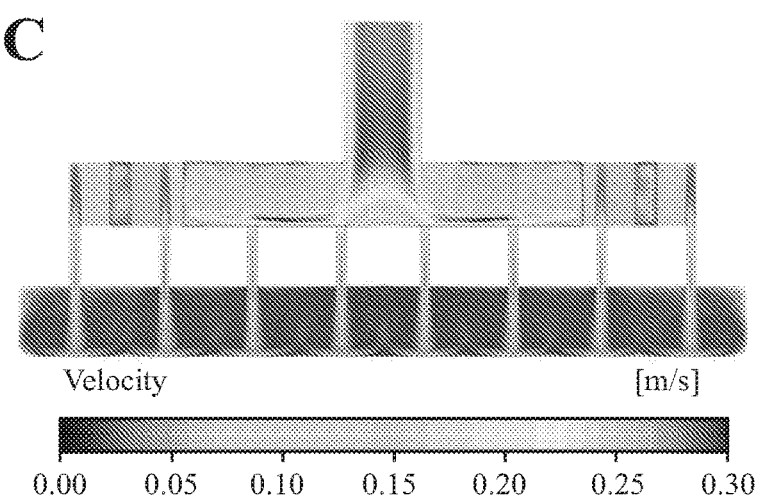

The lower values of thermal resistance as the number of jets increases can be associated with two main mechanisms. The first one is related to the velocity of the jets. Considering that the dimensions of the channels are fixed by Eqs. (3-4), as the number of jets increases (branch levels), the nozzle diameters get smaller. This reduction in the nozzle diameter increases the jet velocity, possibly increasing the heat transfer coefficient. This same effect is the main cause for the smaller thermal resistance values as the inlet diameter of the designs gets smaller. FIGS. 5A, 5B, and 5C are velocity distribution contours showing a comparison of jets velocity distribution impinging on the heat sink base plate for a) 16V3, b) 32V3 and c) 64V3 configurations, respectively, under 5.15 cm3/s inlet flow rate condition. The high-velocity jets impinging on the base plate of the 64V3 configuration can be observed in FIG. 5C, while a velocity reduction is seen in both FIGS. 5A and 5B for the 16V3 and 32V3 designs, respectively.

The flow uniformity produced by the fractal manifold can be observed in FIGS. 5A to 5C. The flow distribution among the channels was calculated by area-averaging the jet exit velocity and a uniformly distributed flow was observed over all the jets. The ratio between the maximum and minimum jet average velocity was calculated, yielding ratios of 1.06 for 16V3, 1.09 for 32V3 and 1.06 for 64V3; similar values were obtained for other inlet diameter designs. Moreover, looking into the velocity contours of the jets from side to side, all of them have similar patterns, but different velocities at the core of the jets that match the expectations between different nozzle sizes. It should be noted that the flow distribution uniformity obtained from the fractal manifold is at the expense of a high flow resistance path generated by the constricted channels and stagnation points at each bifurcation, which are a part of an intricate structure that changes the direction of the flow. The pressure loss originated by this flow path should therefore be considered as an important parameter. The pressure loss is considered as a parameter in the present parametric analysis.

Figure 6A:
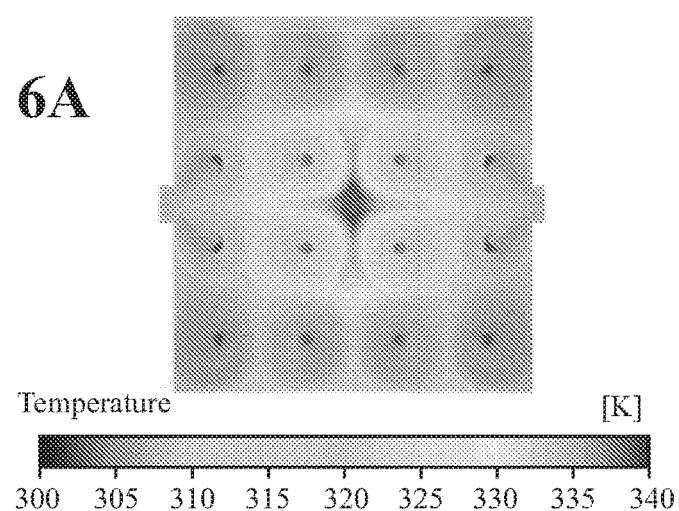
FIGS. 6A to 6C are thermal contours showing a comparison of temperature distribution.
Figure 6B:
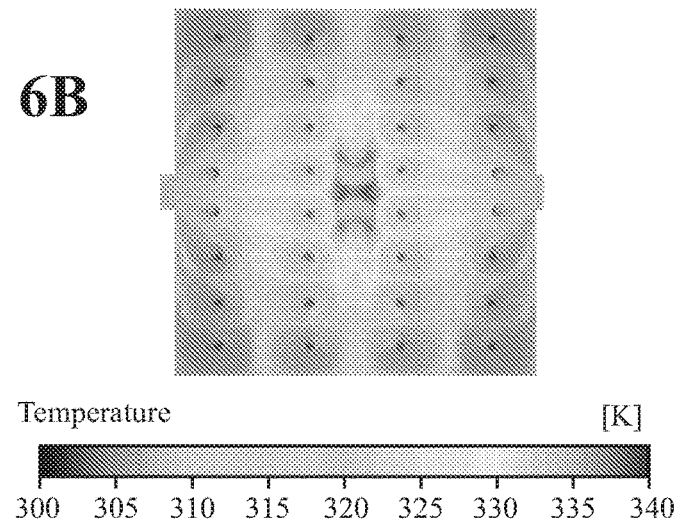
Figure 6C:
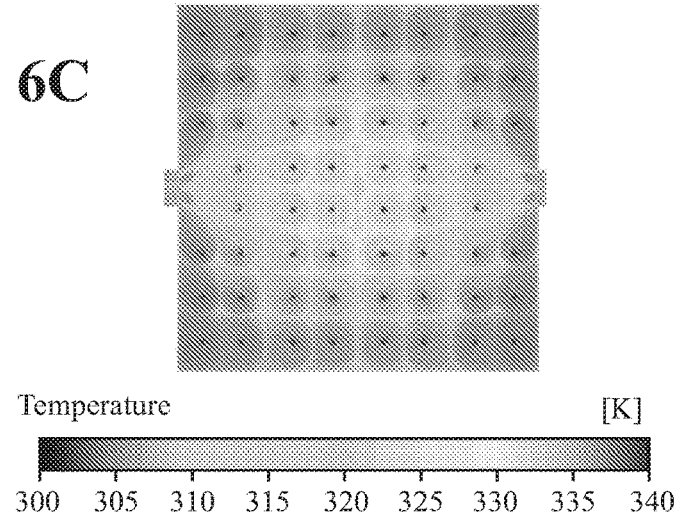

The second mechanism that reduces the thermal resistance as the number of jets increases is related to the distribution of the jets impinging on the base plate. FIGS. 6A, 6B, and 6C are temperature contours showing a comparison of the temperature distribution on the water side of the interface with the heat sink base plate for a) 16V3, b) 32V3 and c) 64V3 configurations, respectively, for a 5.2 cm3/s inlet flow rate condition. As noted above, a temperature distribution comparison for the 16V3, 32V3, and 64V3 configurations is depicted in FIGS. 6A to 6C. The temperature in FIG. 6C for the 64V3 configuration is shown to be more uniform than the temperature for both, the 16V3 and 32V3 configurations, depicted in FIGS. 6A and 6B, respectively, where wider hot spots zones can be perceived. The improvement in the temperature uniformity can be attributed to the closest proximity between the jets, as more jets exist, therefore increasing the effective impingement area. It is known that jet cooling produces high heat transfer coefficients at the impingement point and that they sharply decrease radially from the stagnation point; therefore, having more jets increases the discrete regions with high heat transfer coefficients where lower temperatures can be obtained as depicted in FIGS. 6A to 6C.

Figure 7:
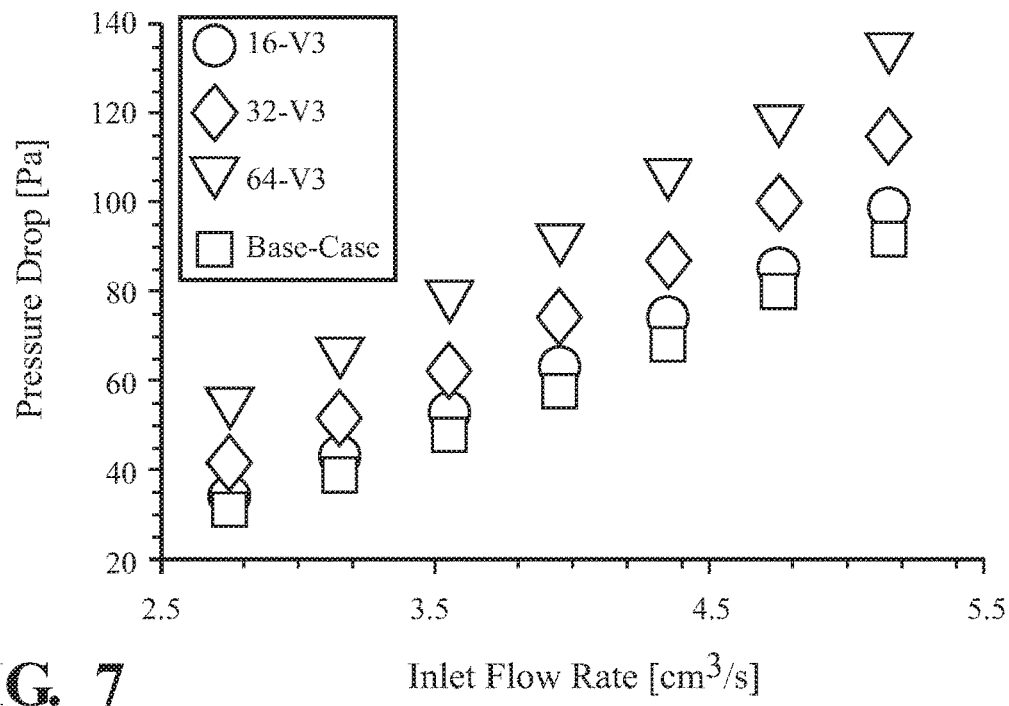
FIG. 7 is a graph of pressure drop as a function of inlet flow rate for coplanar channel designs.

As noted above, the hydraulic behavior in the cold plate heat sink is an important parameter in the overall performance of the cooling system. FIG. 7 is a graph of pressure drop as a function of inlet flow rate for coplanar channel designs with a 5.5 mm inlet diameter (V3) and different number of jets. Base case results are included for comparison. The pressure drop for V3 designs with different numbers of jets is shown in FIG. 7. An increment in the pressure drop is observed as the number of jets increases. This is an expected behavior, as the fluid path is enlarged and smaller channels are created by increasing the branch levels to obtain more jet nozzles. Increments in the pressure drop are in the range of 7%-11% for 16V3, 25%-34% for 32V3 and 47%-77% for 64V3, with respect to the base case.

Smaller pressure drop increments are obtained as the inlet diameter gets bigger, with pressure drop decrements in the range of 12%-18% with respect to the base case, for the 16V5 design.

The thermal resistance and pressure drop plots are only presented for the V3 designs, since the other configurations described in Table 1 produce similar trends in terms of thermal and hydraulic behavior when changing the number of jets and inlet flow rate conditions. Focusing on the impact of the number of jets to the overall performance of the hybrid cold plate heat sink, the tradeoff between thermal resistance and pressure drop, and therefore pumping power, is clearly stated in FIGS. 4 and 7.

Figure 8:
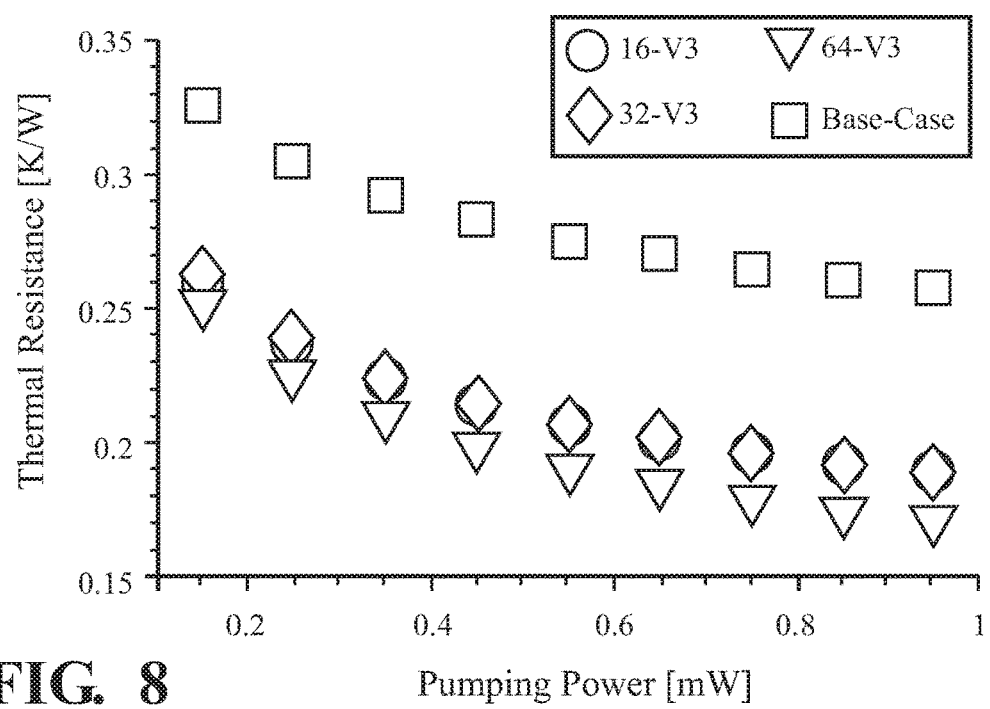
FIG. 8 is a graph of pumping power versus thermal resistance.

FIG. 8 is a graph showing the combined effect of thermal and hydraulic performance for coplanar channels designs with a 5.5 mm inlet diameter and different number of jets. Base case results are included for comparison. In an effort to assess the combined effect of the thermal and hydraulic behavior of the cold plates, the thermal resistance is plotted as function of the pumping power in FIG. 8. Since both high thermal resistance and pumping power mean lower efficiency, the upper curves in FIG. 8 correspond to least favorable options. Interestingly, there is a clear improvement in the performance of all the hybrid cold plate configurations with respect to the benchmark case. However, even under this narrow comparison spectrum, it is not quite clear which design has the best overall performance, particularly for the 16 and 32 jet designs.

Figure 9:
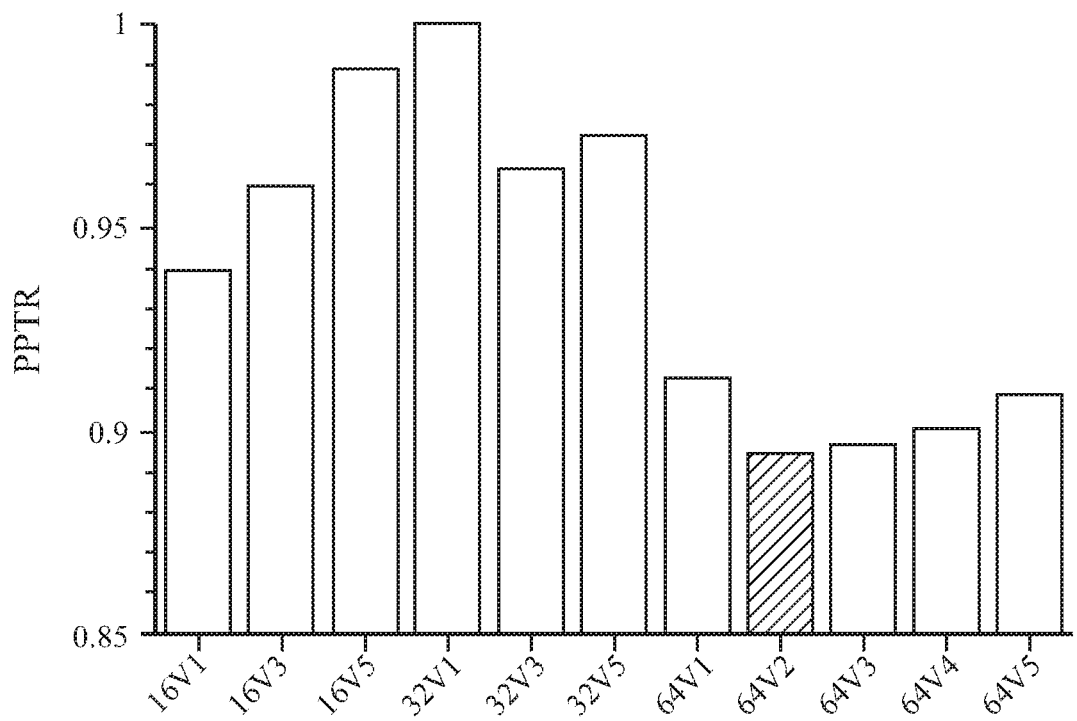
FIG. 9 is a graph showing a PPTR parameter for various proposed coplanar channels microjet cold plate configurations.

In order to have a single-value metric parameter that could be used to compare the overall performance of the hybrid cold plates, the PPTR performance parameter is introduced in our analysis, as defined in Eq. (11). FIG. 9 is a graph showing an overall performance comparison of the hybrid cold plate heat sinks with coplanar channels manifold using the PPTR parameter. PPTR values are normalized by the worst case (32V1). The comparison of the complete set of proposed coplanar channels microjet cold plate configurations is reported in FIG. 9. It can be observed that the 64 jet designs have the best performance, as they exhibit the lowest PPTR values. Moreover, looking into the different inlet diameters for the 64 jets configurations, we can identify a local minimum within the studied range (5 to 6 mm inlet diameter); the minimum is highlighted in a red bar and corresponds to a configuration with a 5.25 mm inlet diameter.

The PPTR parameter has come in handy to find the optimum designs within this first set of proposed configurations. However, PPTR values for the 32 jet designs exhibit an unexpected behavior, based on the two cooling enhancement mechanisms previously discussed, as some of the 32 jet designs have a lower overall performance than the 16 jet ones. It can be argued that the improvement in the thermal resistance generated by increasing the number of jets from 16 to 32 is not able to overcome the increase in pressure drop caused by an extra branching level for some of the cases. Additionally, the lower overall performance of some of the 32 jet designs can be explained by the distribution of the jets and its impingement zones. It must be noted that the heat transfer region is a 30 mm square centered on the base plate area, and the design equation Eq. (1) distributes the jet positions over a 50 mm by 50 mm area; thus, the effective impingement cooling area depends on the number of jets that are impinging inside this reduced heat transfer area.

Figure 10:
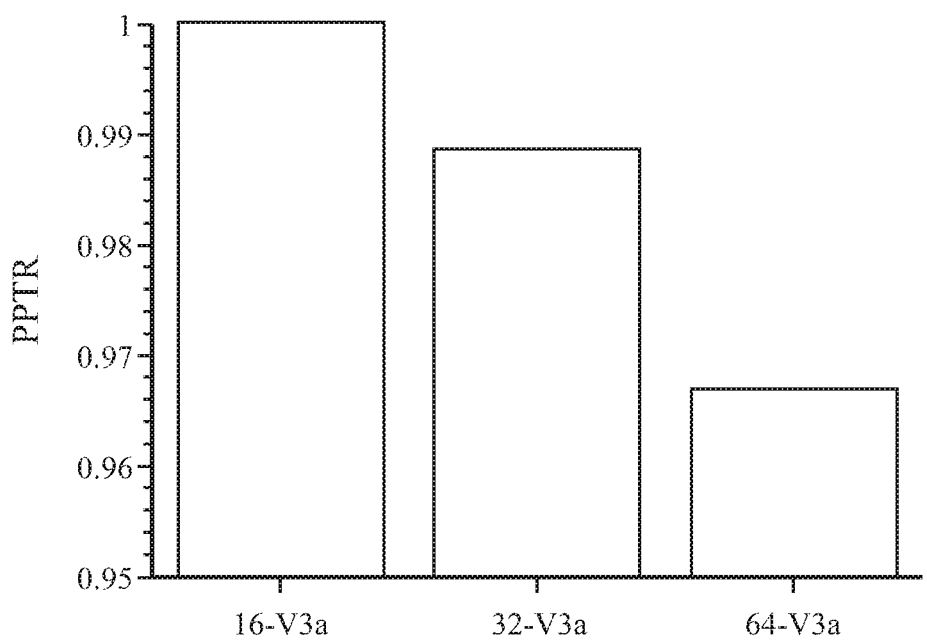
FIG. 10 is a graph showing the PPTR parameter for various coplanar channels manifold (V3)

As a way to analyze the effect of the uneven proportion of jet impingement on the heat transfer area, a set of V3 configurations with 16, 32 and 64 jets were analyzed, where the heat transfer area is the full 50 mm side length plate (150 W are applied over the whole base plate). FIG. 10 is a graph showing overall performance comparison of the hybrid cold plate heat sinks with coplanar channels manifold and modified heat transfer area using the PPTR parameter. PPTR values are normalized by the worst case (16V3a). The PPTR values obtained for this set of cases are presented in FIG. 10, showing a clear improvement in the hybrid cold plates performance as the number of jets is increased, a behavior that is not observed in FIG. 9. This brief analysis confirms that part of the atypical behavior of 32 jets configurations exhibited in FIG. 9 is due to the irregular distribution of the jets over the reduced 30 mm square side length heat transfer area, which can be observed on the temperature distributions of FIG. 6.

Hybrid Cold Plate Configurations with Out-of-Plane Channels Manifold

Aiming for an enhanced spatial distribution of the channels in the inlet manifold, the out-of-plane designs were proposed. This version of the hybrid cold plate eliminates the thin walls in between channels that pose a constraint to potential manufacturing methods. Changes in the performance of this new set of hybrid cold plates are expected with respect to the coplanar channel designs in terms of hydraulic behavior. The inclusion of arched sections in the out-of-plane channels design, to change the flow direction between planes in the manifold, result in an increase in the hydraulic resistance due to the bending of the flow path.

Figure 11:
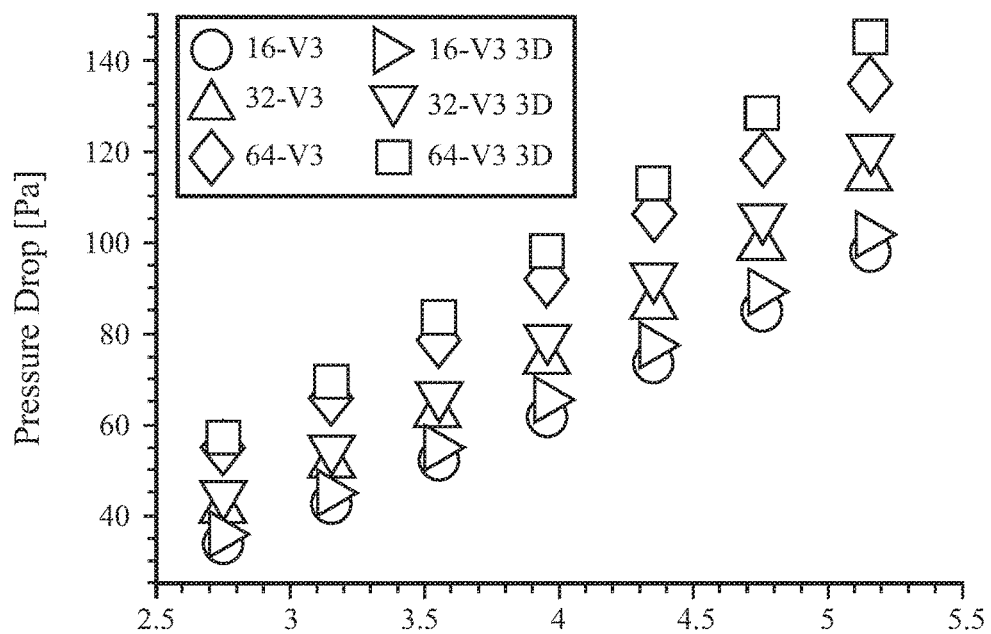
FIG. 11 is a graph of pressure drop as a function of inlet flow rate for out-of-plane channel manifolds.

FIG. 11 is a graph of pressure drop as function of inlet flow rate for out-of-plane channels manifold designs with a 5.5 mm inlet diameter and different number of jets. Coplanar channels results are included for comparison. The pressure drop across the V3-3D designs for different number of jets (16, 32 and 64) is presented in FIG. 11. Relatively small increases in pressure drop, below 10 Pa, are exhibited by the out-of-plane channels designs with respect to the original coplanar channels configurations. Pressure drop increments are in the range of 2.3%-4.5% for 16V3-3D, 4.7%-5.6% for 32V3-3D and 3.9%-8.1% for 64V3-3D. These increments are not significant enough to considerably affect the overall performance of the heat sinks, therefore ensuring a proper operation of the cooling system.

Figure 12:
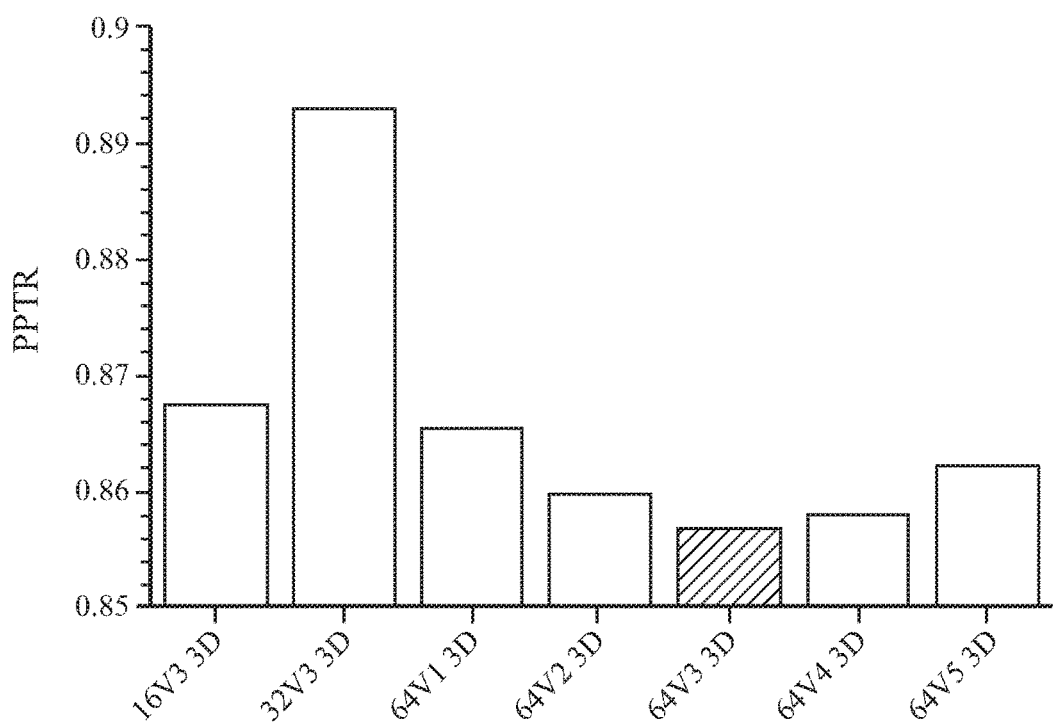
FIG. 12 is a graph of the PPTR parameter for various out-of-plane channels manifolds.

FIG. 12 is a graph showing overall performance comparison of the hybrid cold plate heat sinks with out-of-plane channels manifold using the PPTR parameter. PPTR values are normalized by the worst case (32V1). The PPTR parameter was computed for the out-of-plane channel designs seeking to identify the optimum configuration from this set. The results are shown in FIG. 12, where a local minimum PPTR value was found for the 64 jet configurations. In this case, the design with 5.5 mm inlet diameter seems to be the optimum from the set of analyzed configurations. The corresponding designs with 16 and 32 jets for 5.5 mm inlet diameter are also included for comparison, observing again that designs with 64 jets are the most optimal. The atypical behavior of the 32 jets design due to the irregular distribution of the jets is also observed for this set of designs with out-of-plane channels.

The improvement in the overall performance for the out-of-plane channels manifolds is related to an increase in the thermal efficiency of the cold plate heat sinks. This change in thermal behavior can be attributed to the modification of the inlet manifold. As a hybrid system, both the channels and the jets contribute to the cooling performance in the heat sink. The efficiency improvement of the out-of-plane channels configurations can be partially explained by both the increase in the heat transfer area with the integrated out-of-plane channels system and the mass added to the copper solid heat sink while introducing two levels of channels. Approximately, 55% of mass was added to the copper heat sink on the out-of-plane channels designs compared with the original coplanar channels designs.

Hybrid Cold Plate Configurations with Integrated Manifold Outlet System.

A manifold outlet path was incorporated to the hybrid cold plate configurations as a last iteration of alternative designs, looking for the inlet and outlet connections to be in suitable positions for the assembly of the piping in a cooling loop system. The parametric analysis for this last set of configurations was done by using the optimum coplanar and out-of-plane inlet manifold dimensions, 64V2 and 64V3-3D, respectively; for comparison purposes, MO designs were tested with the inlet manifold dimensions obtained from the 16V3-3D and 32V3-3D designs.

FIGS. 13A and 13B are, respectively, a) an impinging surface view and b) a lateral cross section view of velocity flow distribution for the 64V3-MO configuration. The addition of the outlet manifold creates a complex flow network that can be observed in FIG. 13. The uniformity of the flow at the jets nozzles has been explained above, with a ratio between the max to min average jet velocity of 1.02. However, the flow is not evenly distributed along the extraction ports of the outlet manifold, as approximately two times more flow is extracted by the inner extraction port than the exterior extraction ports, with a ratio between the max to min average extraction port velocity of 2.3. This indicate that the flow impinges the base plate uniformly, then is accelerated to the center of the flood chamber and exits via the extraction ports.

Figure 14:
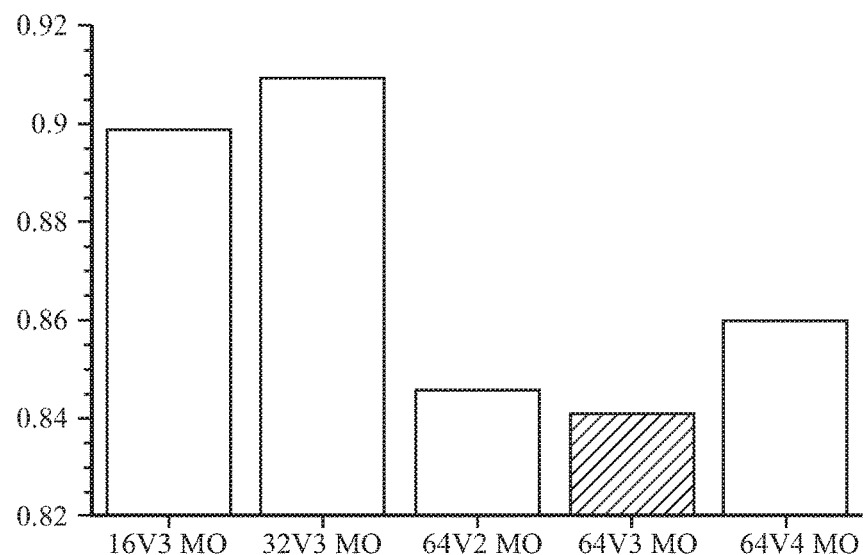
FIG. 14 is a graph of PPTR values for various hybrid cold plate heat sinks with an integrated manifold outlet system, the bar indicates the optimum design.

The PPTR values obtained for the MO designs are reported in FIG. 14, where as expected, the 64 jets configurations have the best overall performance. FIG. 14 shows overall performance comparison of the hybrid cold plate heat sinks with integrated manifold outlet system using the PPTR parameter. PPTR values are normalized by the worst case of the coplanar channels designs (32V1) for comparison purposes. This time, the optimum version is the 64 jets and 5.5 mm inlet or 64V3-MO, similar to the out-of-plane designs. It can be concluded that the optimum inlet diameter size (which is directly related to all the other manifold dimensions) is between 5.25 and 5.5 mm, independently of the other hybrid cold plate features. The design with 32 jets is still the worst-case from the studied configurations due to the issues discussed above.

The PPTR values presented in FIG. 14 are normalized by the worst case of the original coplanar channels. An improvement in the overall performance can be appreciated for the hybrid cold plates with integrated manifold outlet system. This enhanced performance can be explained partially in terms of the interspersed fluid extraction ports effect. It should be noted that no significant pressure drop changes were found with respect the original coplanar system (±4%), and that the inclusion of the outlet manifold added 10% of mass to the cooper heat sinks compared with the out-of-plane channels designs.

Figure 15A:
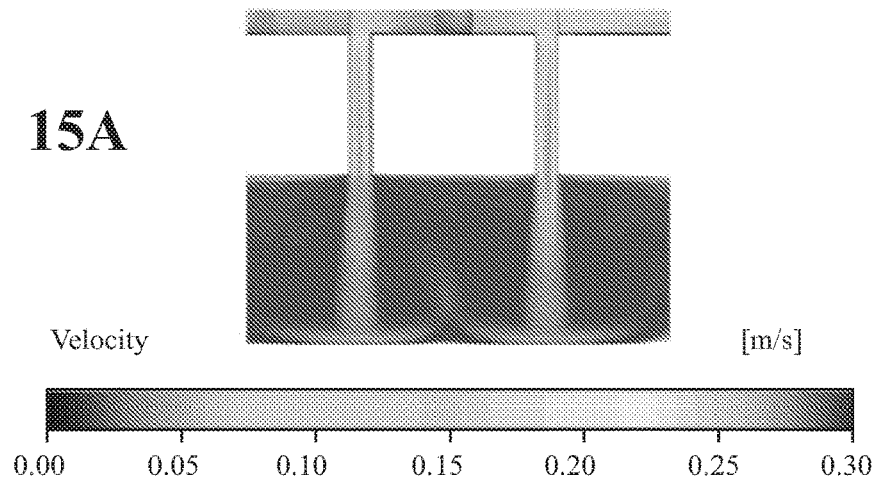
FIG. 15A is a close-up velocity distribution image of the jets impinging the base plate on the a) 64V3 configuration.
Figure 15B:
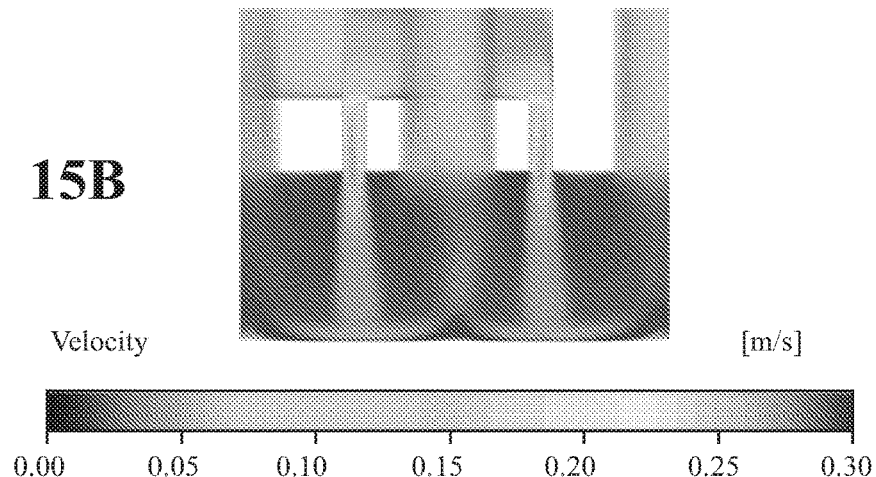
FIG. 15B is a close-up velocity distribution image of the jets impinging the base plate on the 64V3-MO configuration.

As mentioned above, closely-spaced jets and alternating outlets have benefits in the efficiency of jet cooling systems. A close-up to the jets impinging the base plate of the original coplanar channels 64V3 configuration is shown in FIG. 15AB, while in FIG. 15B a pair of jets between an extraction port from 64V3-MO is depicted. The interspersed flow extraction effect can be appreciated between the jets of the 64V3-MO design, as the flow is accelerated after impinging the base plate to the extraction ports. This flow acceleration in the flood chamber improves heat transfer due to the jet cooling mechanism, as reported in [18].

The interspersed extraction ports improves the efficiency of the jet cooling mechanism, but as a hybrid system, some of the cooling could be attributed to the channels embedded in the copper plate for the coplanar and out-of-plane designs; while the MO cold plates could experience adverse effects due to a heat exchanger effect between the inlet and outlet channels for the MO configurations. An average jet nozzle exit temperature of 302.5 K was observed for coplanar and out-of-plane channels designs, confirming that the embedded channels indeed account for some of the heat removal using these hybrid microjet cold plates. Alternatively, for the MO configurations nozzle exit temperatures of 303.3 K where obtained, independently of the number of jets; thus confirming the heat exchanger effect. As the water temperature at the exit of the hybrid heat sinks is approximately 307 K for the heat input of 150 W, we can suggest that 35% of the cooling is due to the channels in the coplanar and out-of-plane designs, while for the MO designs is similar plus the energy exchange between the inlet and outlet manifolds.

Figure 16A:
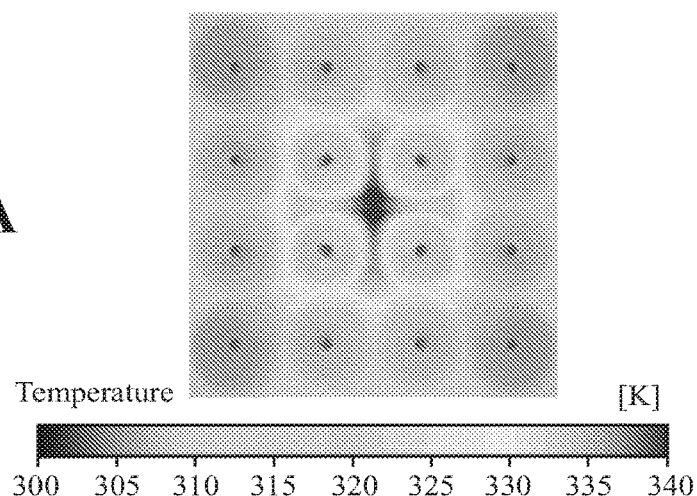
FIGS. 16A, 16B and 16C are thermal images on the water side for a) 16V3-MO, b) 32V3-MO and c) 64V3-MO configurations, respectively.
Figure 16B:
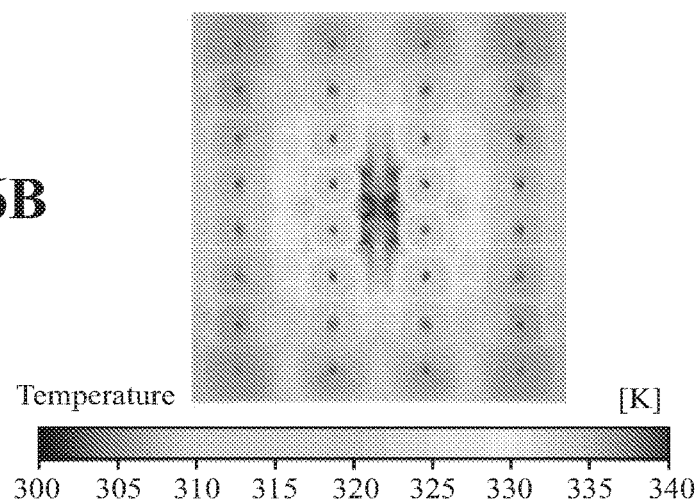
Figure 16C:
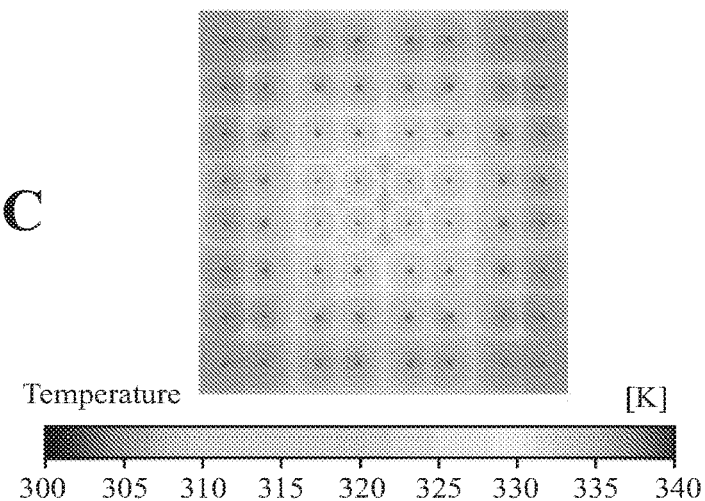

The atypical behavior of the 32 jet designs can be observed again in FIGS. 16A-16C. FIGS. 16A, 16B, and 16C show a comparison of temperature distribution on the water side of the interface with the heat sink base plate for a) 16V3-MO, b) 32V3-MO and c) 64V3-MO configurations, respectively, for a 5.15 cm3/s inlet flow rate condition. Looking into the temperature distributions of FIGS. 16A-16C, the uneven distribution of the jets impinging the base plate in the 32V3-MO configuration can be observed. Broad hot spots populate the center of the base plate, where the chip region is located. These induced hot spots have important effects in the reduced efficiency of the 32 jets configurations, as have been previously noted above. These results align with the fact that the arrangement of the nozzles is of importance in impinging jet cooling; however, in this study we are bounded by the fractal flow structures and the resulting array of nozzles produced from their geometry.

Conclusion of the Parametric Optimization of the Hybrid Configuration

A parametric analysis was conducted for several hybrid microjet heat sink designs using 3-D CFD simulations. The objective behind this extensive parametric analysis was to optimize both, the hydrodynamic and thermal performance of liquid-cooled heat sinks. For such a purpose, the geometry of fractal channel manifolds was varied in order to find the proper balance between low thermal resistance at the lowest possible pumping power requirement. A single-value parameter was defined as the metric to characterize the overall performance of all the liquid-cooled heat sinks investigated here in, i.e., the PPTR. Overall, the hybrid microjet heat sinks with the largest number of jets, 64, were the best, while the 32 jet designs seemed to be the worst. The inadequate tradeoff between pressure losses and cooling efficiency and the uneven arrangement of the nozzles were indicated as the reasons for the poor performance of the 32 jet designs. The 64 jet configurations with an inlet diameter in the range between 5.25 to 5.5 mm showed the optimal overall performance from the sets of studied systems, independent of the other design features. Dimensional variability has to be addressed when the optimum design we are proposing lies between two designs with minimum dimensional differences between them; however, the range of dimensions studied herein are well within the levels of resolution of additive manufacturing techniques and the results reported in this paper provide insight into the overall performance changes expected for dimensional variability.

An outlet manifold was proposed to deal with the problems related to the assembly of a cooling loop, due to inaccessible positions of the heat sink outlets, without affecting the overall performance in the system. However, flow distribution along the outlet manifold showed important non-uniformities.

Hybrid Microjet Liquid Cooled Heat Sinks Made of Photopolymer Resin: Thermo-Fluid Characteristics and Entropy Generation Analysis Further to the parametric analysis discussed above for several hybrid microjet heat sink designs, an investigation on the performance of a hybrid design of active liquid cooled heat sinks is presented here. A numerical analysis was performed via full 3-D CFD simulations of a set of hybrid microjet heat sinks formed by a pair of fractal channel manifolds, used as liquid inlet and outlet conduits (manufactured in stereolithographic resin), an array of impinging microjets for uniform cooling, and a metallic heat spreader attached to a heat source. The pressure losses generated by the small channels in the manifolds were targeted for minimization using various structural modifications, while the metallic heat spreader in contact with the heat source was optimized for improving the cooling capabilities of the heat sink. A parametric analysis was conducted to determine the improvements in the overall performance; additionally, a local entropy generation analysis was conducted to obtain a heat sink design with the lowest intrinsic irreversibility. The entropy generation rates were obtained by coupling a local entropy generation model with the governing equations in the CFD simulations. The results obtained from the entropy generation analysis indicated that the major irreversibility source is the heat transfer in the metallic heat spreader. The addition of area-enhancement features, such as microchannels and mini-fins to the original heat spreader led to increasing the cooling capabilities of the hybrid heat sinks. The implementation of the entropy generation analysis allowed to identify the local sources of irreversibility and the impact of the hydrodynamic and thermal deficiencies in the operation of the heat sink. Lastly, an overall performance indicator (PPTR) enabled a proper assessment of the thermo-fluid response of the heat sinks and the results drawn from this parameter matched the fundamental observations obtained from the entropy generation analysis.

Nomenclature

| | |
|---|---|
| $c_p$ | specific heat |
| f | friction factor |
| h | channel height |
| k | branch level |
| l | channel length |
| $\bar{u}$ | time-average x-component velocity |
| u' | fluctuating x-component velocity |
| $\bar{v}$ | time-average y-component velocity |
| v' | fluctuating y-component velocity |
| w | channel width |
| $\bar{w}$ | time-average z-component velocity |
| w' | fluctuating z-component velocity |
| C | friction variation coefficient |
| L | metallic plate side length |
| N | number of branches per bifurcation |
| P | pressure drop |
| PPTR | comprehensive performance parameter |
| Q | heat input rate |
| R | thermal resistance |
| Re | Reynolds number |
| $\dot{S}_{g,f}'''$ | volumetric frictional entropy generation rate |
| $\dot{S}_{g,h}'''$ | volumetric thermal entropy generation rate |
| $\dot{S}_{g,t}'''$ | volumetric total entropy generation rate |
| $\dot{S}_{g,t}$ | global entropy generation rate |
| $\bar{T}$ | time-average temperature |
| T' | fluctuating temperature |
| $T_{in}^f$ | flow inlet temperature |
| $\bar{T}_s$ | average temperature of the heated surface |
| $\dot{V}$ | volumetric flow rate |
| $\dot{W}$ | pumping power |

Greek symbols

| | |
|---|---|
| α | thermal diffusivity |
| κ | thermal conductivity |
| λ | Lagrange multiplier |
| μ | dynamic viscosity |
| ρ | density |
| φ | objective function |
| θ | nondimensional temperature difference |
| ν | kinematic viscosity |

Subscripts

| | |
|---|---|
| f | water properties |
| p | photopolymer resin properties |
| s | copper properties |

Abbreviations

| | |
|---|---|
| CFD | computational fluid dynamics |
| EGM | entropy generation minimization |
| RANS | Reynolds-averaged Navier-Stokes equations |
| SLA | stereolithography apparatus |
| WD | designs with flow deflectors and rounded corners |

Introduction

The fast-paced miniaturization of electronic components, followed by an increased circuit integration density, have made thermal management an integral part of electronic devices [36], i.e., the reliability and performance of electronics are limited by temperature safety thresholds [37]. Furthermore, the nonuniform power distribution in electronic packages generates hotspots, thus, cooling solutions must target both, bulk and localized heat loads [38].

Closed-loop liquid-cooling systems for the thermal management of electronic packages has received a weighty attention [39], where the origins of this cooling alternative can be traced back to the seminal work by Tuckerman and Pease [40]. Subsequently, several modifications have been proposed, of which, jet impingement and micro-channels heat sinks have emerged as the most efficient thermal solutions [41].

Several numerical and experimental contributions have focused on the investigation of both, microchannels [42-46] and jet impingement [47-50] cooling performance. These works have demonstrated that low heat sink thermal resistances can be obtained using jet impingement systems, while temperature uniformity can be attained by optimizing the spatial distribution in a jet array, to avoid cross-flow interference. On the other hand, microchannel heat sinks have the advantage of achieving higher heat transfer coefficients with lower coolant mass flow rates; but at the cost of significant pressure drop and non-uniformities in the temperature distribution along the channels. To compensate these drawbacks, hybrid cooling schemes combining micro-channels and jet impingement cooling have been proposed as a viable option [51-54].

The primary efforts to optimize the microchannels cooling performance focus on the improvement of the flow distribution uniformity, which can be attained with the help of efficient manifolds. The landmark work of Bejan et al. [55] set the use of the Constructal law for the design of optimized fractal manifolds with uniform flow distribution and low-pressure drop [56-59]. Meanwhile, the efforts to enhance heat transfer on jet cooling systems have relied on the use of interspersed extraction ports [46, 60, 61], which eliminates cross-flow interference. These approaches, both for microchannel manifolds and jet impingement, can also be applied to enhance the performance of hybrid cooling schemes.

The impingement plate, or heat spreader, is a crucial component of every system that includes jet cooling [62]. The addition of mini-fins to the impingement plate of confined liquid cooling systems has shown to improve their cooling capabilities. The performance of heat spreaders with pin fins [63] and minichannels with rectangular fins [64-65] have been previously studied, showing to reduce the maximum operating temperatures in the cooling system substantially.

The conventional approach to characterize the overall performance of heat sinks is based on determining their raw hydraulic and thermal behavior, which can be efficiently estimated using CFD simulations. However, recent numerical investigations have looked into an alternative to optimize the performance of cooling systems through the entropy generation minimization (EGM) methodology [66-67]. The EGM method can be applied to analyze irreversibility in the operation of cooling systems [68-70]. By applying a local entropy generation model, it is possible to obtain a decision-making scenario from a parametric analysis, or apply a mathematical optimization scheme to redesign the cooling system.

In this investigation, the performance of hybrid liquid-cooled heat sinks under turbulent flow conditions was assessed. The hybrid heat sink designs combine two manifolds, a fractal manifold for uniform flow distribution and an extraction manifold, with a jet nozzles array impinging over a heat spreader, such as those described in ref. [71]. In our previous work [71], a series of hybrid heat sinks were parametrically optimized for laminar flow operation using a highly theoretical approach. The heat sinks studied herein were designed using the previous work as a benchmark, but focusing on a practical application and integration into any commercial liquid-cooling system due to (1) the utilization of flow rates in the range of commercial cooling systems, (2) the feasibility of fabrication of the fractal manifolds using additive manufacturing, and (3) the implementation of barbed fittings compatible with commercial tubing. Targeting to reduce the pressure drop in the manifolds, several structural modifications were implemented. The thermal and hydraulic performance of the new heat sink designs was investigated using 3-D CFD simulations with a coupled local entropy generation model. The results from the entropy generation analysis confirmed the importance of the heat spreader in the thermal performance of liquid cooled heat sinks. In a further effort to optimize the performance of the hybrid heat sinks, heat transfer enhancing features, such as fins and microchannels, were added to the impingement plate. Remarkable improvements were found in the thermal performance of the heat sinks for copper plates with rectangular pin-fins, circular pin-fins, and rectangular minichannels. The implementation of the coupled heat transfer, fluid dynamics, and entropy generation models enabled the identification of possible improvement opportunities in the heat sinks' design.

Hybrid Heat Sinks Design
Initial Configuration

The heat sinks consist of an inlet manifold that distributes the flow to a jet nozzles array, a flood chamber where jets impinge on the heat spreader, and an outlet manifold to extract the flow from the chamber (see FIGS. 3A to 3E). The initial design introduced herein was inspired by our previous contribution 71, where now pertinent dimensional and structural modifications were implemented to allow for an experimental application. Heat sinks with fractal manifolds having 16, 32, and 64 jet nozzles were considered to further investigate the effect of the number of jets alongside the modifications to the initial design.

The inlet manifold consists of channels organized in a branched fractal pattern. The number of branching channels in the manifold is given by a $2^k$ factor, where k is the branch level. Since there is a jet nozzle in each terminal channel, the value of k is varied to obtain the designs with 16, 32 and 64 jet nozzles. Consequently, the distribution of the jets array is fixed by the fractal distribution of the inlet manifold. The length $l_k$ of each channel, at the branch level k is determined by $$l_k = \begin{cases} \dfrac{L}{2^{(k+2)/2}} & k = 2, 4, 6 \\ \dfrac{L}{2^{(k+3)/2}} & k = 1, 3, 5 \end{cases} \quad (12)$$

where L=50 mm is the side length of the impingement plate for all the designs considered.

The widths of the channels leading to the lowest pressure drop are obtained using the Lagrange multipliers method under the constraint of constant volume. The optimization process was followed in a similar manner to the presented in ref [71], but considering the variations in the friction coefficient under turbulent flow. Considering that the friction factor under turbulent flow conditions is given by $f=C_k/Re_k^m$, where $C_k$ accounts for variations in the friction coefficient in the channel branch k and $Re_k$ is the Reynolds number in the branch level k, the objective function was $$\phi = \sum_{k=0}^{n} \left\{ \frac{(h+w_k)^{2+m}}{N_k^{2-m}(hw_k)^3} + \lambda l_k h w_k N_k \right\} \quad (13)$$

where $w_k$ is the width of the channel at the branch level k, h is the height of the channel, $N_k=2^k$ implies that there are two branches per bifurcation level k, and $\lambda$, is the Lagrange multiplier. Under this scheme, the widths of the channels that minimize the pressure drop are given by $$\left(\frac{w_{k+1}}{w_k}\right)^4 \frac{(w_k+h)^m[(2-m)w_k+3h]}{(w_{k+1}+h)^m[(2-m)w_{k+1}+3h]} = \frac{1}{2^{3-m}} \quad (14)$$

where the width of the first level $w_0$ was fixed by the inlet diameter of the inlet manifold, while the height of the channels was set to 4.5 mm. The friction factor f was obtained from fitting the smooth pipes curve in the Moody diagram, where C=0.4 and m=0.278.

The outlet manifold extracts the fluid of the flood chamber using interspersed extraction ports between the jet nozzles. The outlet manifold places the inlet and outlets of the heat sink on the same plane, allowing for an accessible path for the assembly of a liquid cooling loop. Further detailed information about the outlet manifold can be found in ref. [71]. The diameter sizes for the inlet, outlets and jet nozzles in the different configurations are presented in Table 2 below, where the inlet and outlet diameters are similar to commercially available barbed fittings of ½" and ¼" internal diameters for the inlet and outlet tubes, respectively.

TABLE 2

Diameter dimensions of the different hybrid heat sinks.

| Inlet Diameter [mm] | Outlet Diameter [mm] | Jets Nozzle Diameter [mm] | | |
|---|---|---|---|---|
| | | 16 | 32 | 64 |
| 9.15 | 3.55 | 2.85 | 1.7 | 1.16 |

The complexity of the channels branched structure in the manifolds and the micrometric precision needed to manufacture the jet nozzles accurately, compels to resort to additive manufacturing methods for the fabrication of the heat sink. From the available 3-D printing methods, the stereolithography apparatus (SLA) exhibits the advantage of high printing resolution and cost-effective manufacturing [72, 73]. The SLA method is based on the layer-by-layer polymerization of photosensitive resins (photopolymer resin) using UV light. The physical properties of the photopolymer resins can be modified by adding composite nanoparticles, but they often manifest low thermal conductivities [74]. Nevertheless, SLA offers a low-cost approach to fabricate the intricate hybrid heat sinks geometry with high accuracy. In the interest of brevity, the experimental component of this investigation will come in a separate publication.

Manifold Channels

Figure 17A:
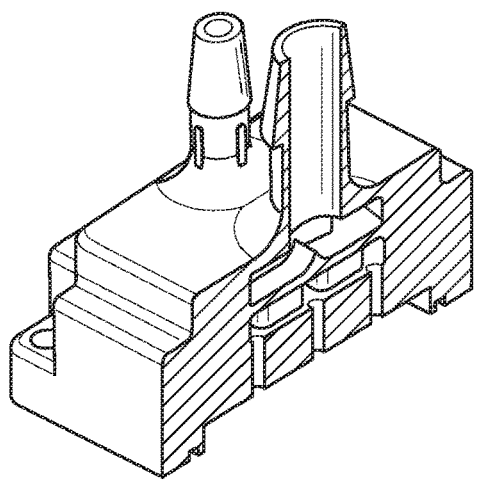
FIGS. 17A-17D are various cross-section views of the manifolds.
Figure 17B:
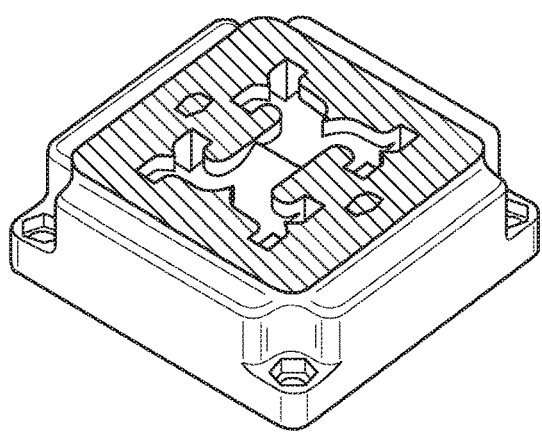
Figure 17C:
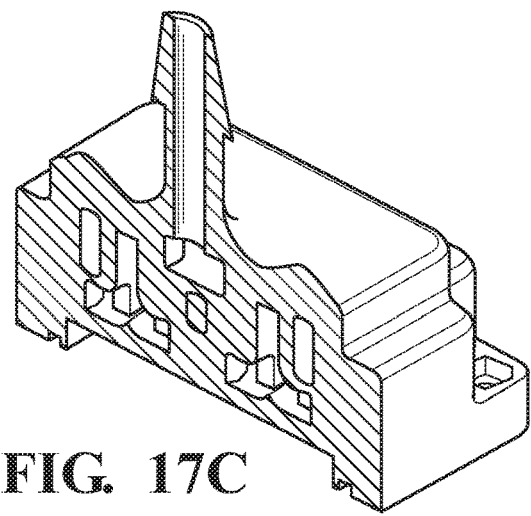
Figure 17D:
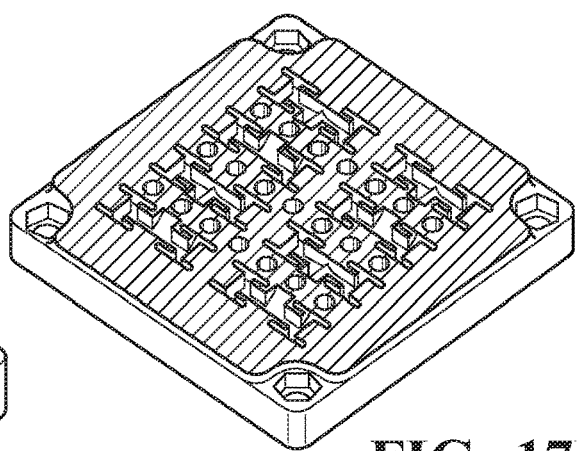
Figure 17E:
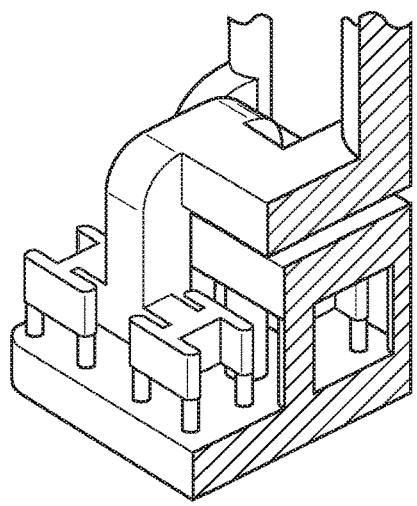
FIG. 17E-17F are partial perspective views of the internal flow channels.
Figure 17F:
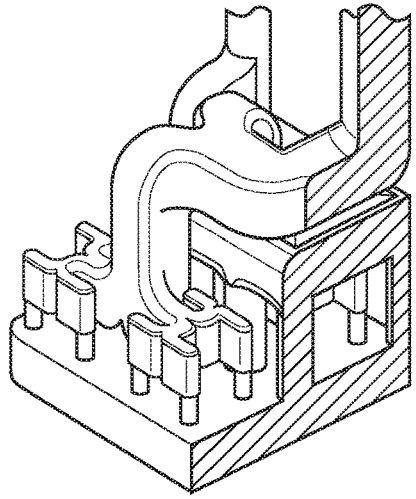

Modifications to the initial design of the hybrid heat sinks were proposed to reduce the pressure drop and friction in the flow. To eliminate stagnation points, deflectors were added to each straight 90-degree turn of the flow across the inlet manifold. The elimination of stagnation points helps to avoid high velocity gradients, thus reducing the friction in the flow [75]. Additionally, the original sharp turns were rounded in an effort to reduce recirculation zones. FIGS. 17A-17D shows cross-section views of the manifolds and FIGS. 17E-17F shows a comparison of the internal flow channels between the initial configuration [71] and the one that includes flow deflectors and curvatures (only one quarter of the symmetric heat sink is shown for visualization purposes). In other words, FIGS. 17A-17D shows cross-section views where the flow deflectors and curvatures are depicted along the different segments of the manifolds; while FIGS. 17E-17F compares the channels for the original hybrid heat sink and the design with the flow deflectors and rounded corners. The models shown in FIGS. 17A-17B correspond to the designs with 64 jet nozzles.

TABLE 3

Nomenclature of the heat sinks with pin-fins

| Cross-Section Type | On-center spacing (mm) | Nomenclature |
|---|---|---|
| Square | 2.5 | FS1 |
| Square | 2.0 | FS2 |
| Square | 1.5 | FS3 |
| Circular | 2.5 | FC1 |
| Circular | 2.0 | FC2 |
| Circular | 1.5 | FC3 |

Heat Spreader (Impingement Plate) Features

Figure 18A:
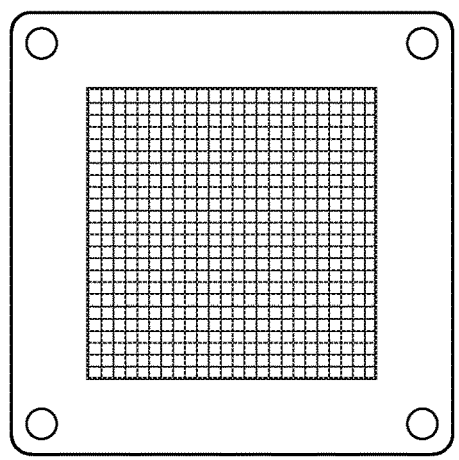
FIGS. 18A and 18B are top views of two impingement plates displaying, respectively, square mini pin-fins with 1.5 mm center-to-center spacing (left), and minichannels with 1 mm slot width (right)

The originally flat impingement plate was modified by including mini-fins on a square region of 37.5 mm in length centered on the impinging area and etched through half of the total plate thickness (3.18 mm). Both, pin-fins and rectangular fins (channels) were considered, as shown in FIG. 18A. For the pin-fin designs, three different patterns were investigated, where the center-to-center spacing between fins was varied as 1.5, 2.0, and 2.5 mm. The dimensions of the fins with square cross-section were fixed to 1 mm per side. To obtain a fair comparison, the dimensions of the circular cross-section fins were set to obtain the same total volume of their square cross-section counterpart, corresponding to a diameter of 1.13 mm. Table 3 summarizes the nomenclature used to name the heat spreader designs with pin-fins, including their corresponding center-to-center spacing.

For the rectangular fins (minichannels), the center-to-center spacing between fins was varied as 0.2, 0.5 and 1 mm, while the width of the fins was fixed to 1 mm. The nomenclature used to name the different heat spreaders with minichannels and their corresponding dimensions are summarized in Table 3. The impingement plate designs presented in Tables 3 and 4 were tested using the fractal manifold heat sinks described above.

TABLE 4

Nomenclature of the heat sinks with rectangular fins

| Slot width (mm) | Nomenclature |
|---|---|
| 1.0 | FR1 |
| 0.5 | FR2 |
| 0.2 | FR3 |

Computational Model and Analysis
Modeling Assumptions

The hydraulic and thermal behavior of the hybrid heat sinks was investigated using 3-D CFD simulations. The simulations were conducted under the following assumptions:

Steady-state operation.
Incompressible flow.
Turbulent flow regime (Re≈2000-10000).
Con
stant thermo-physical properties.
Governing Equations Under the assumptions described above, the description of the hydrodynamic and thermal behavior in the hybrid heat sinks is approximated by solving the Reynolds-averaged Navier-Stokes equations (RANS):

Continuity $$\frac{\partial \overline{u}}{\partial x} + \frac{\partial \overline{v}}{\partial y} + \frac{\partial \overline{w}}{\partial z} = 0 \quad (15)$$

Momentum $$\overline{u}\frac{\partial \overline{u}}{\partial x} + \overline{v}\frac{\partial \overline{u}}{\partial y} + \overline{w}\frac{\partial \overline{u}}{\partial y} = \quad (16)$$
$$-\frac{1}{\rho}\frac{\partial \overline{P}}{\partial x} + \nu\left(\frac{\partial^2 \overline{u}}{\partial x^2} + \frac{\partial^2 \overline{u}}{\partial y^2} + \frac{\partial^2 \overline{u}}{\partial z^2}\right) - \frac{\partial}{\partial x}\overline{(u'^2)} - \frac{\partial}{\partial y}\overline{(u'v')} - \frac{\partial}{\partial z}\overline{(u'w')}$$

$$\overline{u}\frac{\partial \overline{v}}{\partial x} + \overline{v}\frac{\partial \overline{v}}{\partial y} + \overline{w}\frac{\partial \overline{v}}{\partial y} = \quad (17)$$
$$-\frac{1}{\rho}\frac{\partial \overline{P}}{\partial y} + \nu\left(\frac{\partial^2 \overline{v}}{\partial x^2} + \frac{\partial^2 \overline{v}}{\partial y^2} + \frac{\partial^2 \overline{v}}{\partial z^2}\right) - \frac{\partial}{\partial x}\overline{(u'v')} - \frac{\partial}{\partial y}\overline{(v'^2)} - \frac{\partial}{\partial z}\overline{(v'w')}$$

$$\overline{u}\frac{\partial \overline{w}}{\partial x} + \overline{v}\frac{\partial \overline{w}}{\partial y} + \overline{w}\frac{\partial \overline{w}}{\partial y} = \quad (18)$$
$$-\frac{1}{\rho}\frac{\partial \overline{P}}{\partial z} + \nu\left(\frac{\partial^2 \overline{w}}{\partial x^2} + \frac{\partial^2 \overline{w}}{\partial y^2} + \frac{\partial^2 \overline{w}}{\partial z^2}\right) - \frac{\partial}{\partial x}\overline{(u'w')} - \frac{\partial}{\partial y}\overline{(v'w')} - \frac{\partial}{\partial z}\overline{(w'^2)}$$

Energy $$\overline{u}\frac{\partial \overline{T}}{\partial x} + \overline{v}\frac{\partial \overline{T}}{\partial y} + \overline{w}\frac{\partial \overline{T}}{\partial z} = \quad (19)$$
$$\alpha\left(\frac{\partial^2 \overline{T}}{\partial x^2} + \frac{\partial^2 \overline{T}}{\partial y^2} + \frac{\partial^2 \overline{T}}{\partial z^2}\right) - \frac{\partial}{\partial x}\overline{(u'T')} - \frac{\partial}{\partial y}\overline{(v'T')} - \frac{\partial}{\partial z}\overline{(m'T')}$$

Boundary Conditions

Figure 19A:
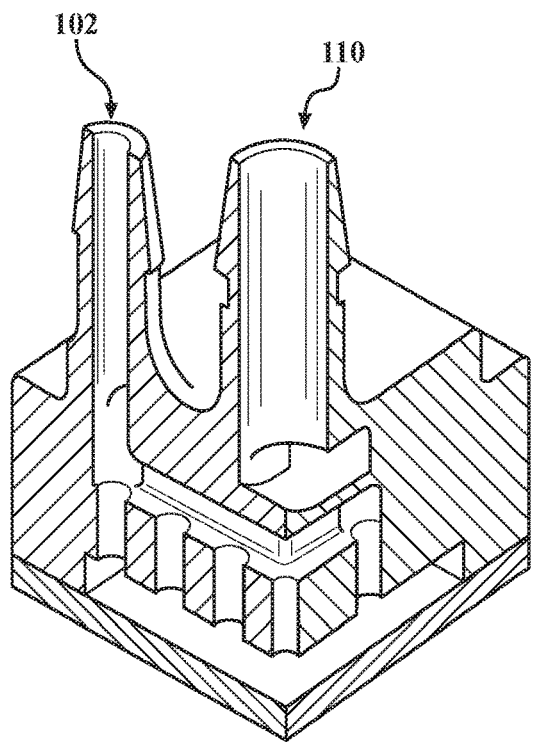
FIGS. 19A and 19B are schematics of the computational domain of the hybrid heat sinks.
Figure 19B:
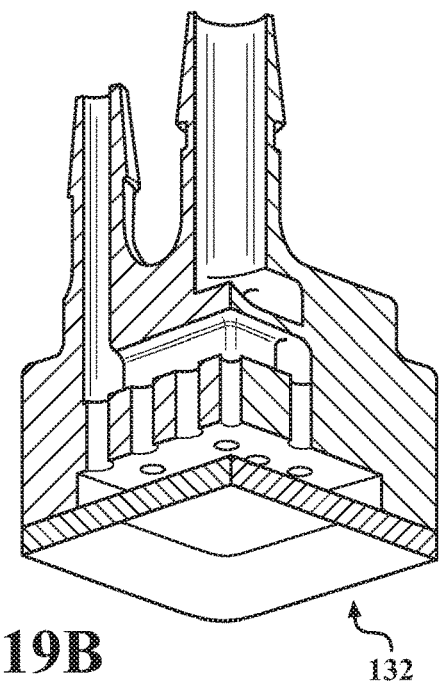

The hybrid heat sinks are symmetric with respect to two planes; thus, the computational domain can be reduced to one-quarter of the whole geometry (see FIG. 19), which allows for a reduction in the size of the cells for more accurate solutions at a relatively low computational cost. FIG. 19 is a schematic of computational domain of the hybrid heat sinks, depicting the corresponding boundary conditions (red arrows) and materials. The boundary conditions are shown in FIG. 19. For the inlet, the mass flow rate was varied from 0.025 to 0.06 kg/s and the inlet temperature was fixed to 300 K. A zero-gauge pressure was prescribed at the outlet. The electronic package was modeled as a heat flux prescribed on a 3 by 3 cm squared region (1.5 per 1.5 cm for the symmetric domain), centered at the bottom of the heat spreader (copper plate), corresponding to a constant heat transfer rate of 150 W. The other external walls were set as adiabatic. The internal walls corresponding to the fluid/solid interface were set with non-slip and temperature continuity boundary conditions.

The working fluid was water, with the following constant thermophysical properties: $\kappa_f$=0.6 W/(m-K), $c_{p,f}$=4182 J/(kg-K), $\mu_f$=1.003×10$^{-3}$ kg/(m-s), $\rho_f$=998.2 g/m$^3$. The solid photopolymer resin has a thermal conductivity of $\kappa_p$=0.23 W/(m-K) [76]. The heat spreader was copper with the following properties: $\kappa_s$=3 87.6 W/(m-K), $c_{p,s}$=381 J/(kg-K), $\rho_s$=8978 kg/m$^3$).

Domain Discretization and Numerical Procedure

The governing equations were discretized and solved using ANSYS® (v19.1). The generation of the initial computational grid was conducted in the ANSYS Meshing software, obtaining conformal meshes with tetrahedral cells. After obtaining a good-quality tetrahedral mesh, the computational cells were exported to ANSYS Fluent, where the tetrahedral cells were converted into polyhedrons using a Polyhedral Mesh Conversion Algorithm [77], reducing the skewness of the initial grid cells. Due to the numerical nature of the solution scheme, a mesh sensibility analysis was conducted to ensure grid-independent results. A set of computational models was created for each heat sink where the size of the grid elements was reduced progressively to increase the overall number of computational cells. The numerical solution was obtained for each computational model using the same boundary and operating conditions. The average temperature of the heated surface and the pressure drop across the heat sink were monitored during mesh sensibility analysis. Mesh independent results were verified for each numerical model, by finding variations in the monitoring parameters below 0.5% between at least three different computational grids. Table 5 below shows an example of the mesh sensibility analysis conducted for the 16WD design.

TABLE 5

Mesh Sensibility Analysis for 16WD

| Cells | Pressure Drop (kPa) | Convergence Criteria | Base Temperature (K) | Convergence Criteria |
|---|---|---|---|---|
| 1,879,112 | 8.27 | 1.008% | 308.72 | 0.041% |
| 4,623,625 | 8.35 | 0.322% | 308.60 | 0.043% |
| 8,645,159 | 8.38 | — | 308.73 | — |

A second order upwind discretization scheme was used for the momentum and energy equations, with a least squares cell based gradient method. The coupling of pressure and velocity was achieved by means of the SIMPLE algorithm. The standard κ-ε model was implemented to account for the transport of momentum and energy generated in the turbulent flow. The underrelaxation factors were set as follows: 0.3 for pressure, 0.5 for momentum, and 1 for density, body forces, turbulence kinetic energy, rate of dissipation of turbulence energy, and energy. The convergence of the numerical solution was achieved when the scaled residuals for the continuity, momentum, and κ-ε equations reached a value of $10^{-5}$, while the criterion for the energy equation scaled residuals was set to $10^{-9}$. Simultaneously, in order to verify the convergence and stability of the solution, the area-weighted average temperature of the heated surface and the pressure drop across the heat sink were computed and monitored at each iteration.

Performance Assessment

The pressure drop was selected as the comparison parameter for the hydraulic performance of the systems, while the average temperature at the heat flux region is employed to compare the thermal performance of the different designs. An assessment of the hydraulic performance was obtained by calculating percentage changes in the pressure drop $\%\Delta P_i$, using the following definition $$\%\Delta P_i = \frac{\Delta P_i - \Delta P_{bc}}{\Delta P_{bc}} \times 100 \quad (20)$$

where $\Delta P_i$ is the pressure drop in the design of interest and $\Delta P_{bc}$ is the pressure drop in a selected reference case from the hybrid heat sink set. An alternative to characterize the hydraulic performance in a cooling system is to employ the pumping power, which indicates the power necessary to pump the working fluid through the heat sink and is defined as $$\dot{W}_p = \dot{V}\Delta P \quad (21)$$

where $\dot{V}$ is the flow rate and $\Delta P$ is the pressure drop. A common practice to characterize the thermal performance of liquid-cooling systems is to estimate a thermal resistance using the average temperature at the heated surface $\overline{T}_s$ and the flow inlet temperature $T_{in}^f$, as $$R = \frac{\overline{T}_s - T_{in}^f}{Q} \quad (22)$$

where Q is the heat input from the electronic device (150 W) and the inlet flow temperature is fixed at 300 K by the boundary condition. The variations in the thermal performance of the hybrid heat sinks were also described using the variable $\theta_i$ defined by $$\theta_i = \frac{\overline{T}_i - T_{in}^f}{\overline{T}_{bc} - T_{in}^f} \quad (23)$$

where $\overline{T}_i$ is the average temperature in the heat flux region for the heat sink of interest, $\overline{T}_{bc}$ is the average temperature in the heat flux region for a reference case. A $\theta_i$ value greater than one indicates an increase of the average temperature in the heat flux region with respect to the reference case, which means a poorer thermal performance, and vice versa.

Lastly, the comprehensive parameter PPTR is employed to evaluate the overall performance of the heat sinks considering both, their thermal and hydraulic behavior [71]. The PPTR is a parameter computed from the variations in the estimated thermal resistance as a function of the pumping power. The PPTR is computed as $$PPTR = \int R d\dot{W}_p \quad (24)$$

The PPTR is able to capture the thermal and hydraulic performance of the cooling system over a range of flow rates in a single value. The PPTR, as an overall performance parameter of liquid-cooled heat sinks, is described at length in Ref [71]. In the way that the PPTR is defined, low values indicate an enhanced overall efficiency, while greater PPTR values means a poor comprehensive performance of the cooling system.

Entropy Generation Analysis

The grade of irreversibility in the operation of the hybrid heat sinks can be estimated by coupling a model for local entropy generation with the mass, momentum, and energy conservation equations, where the local entropy generation rates are defined as [68, 78]:

$$\dot{S}_{g,t}''' = \dot{S}_{g,h}''' + \dot{S}_{g,f}''' \quad (25)$$

$$\dot{S}_{g,h}''' = \frac{K}{T^2}\left[\left(\frac{\partial \overline{T}}{\partial x}\right) + \left(\frac{\partial \overline{T}}{\partial y}\right) + \left(\frac{\partial \overline{T}}{\partial z}\right)\right] \quad (26)$$

$$\dot{S}_{g,f}''' = \frac{\mu}{T}\left[\left(\frac{\partial \overline{u}}{\partial x}\right) + \left(\frac{\partial \overline{v}}{\partial y}\right) + \left(\frac{\partial \overline{w}}{\partial z}\right)\right]$$

-continued $$\dot{S}'''_{g,f} = \frac{\mu}{T}\left[\left(\frac{\partial \overline{u}}{\partial x}\right) + \left(\frac{\partial \overline{v}}{\partial y}\right) + \left(\frac{\partial \overline{wT}}{\partial z}\right)\right] \quad (27)$$

$$\left(\frac{\partial \overline{u}}{\partial y} + \frac{\partial \overline{v}}{\partial x}\right) + \left(\frac{\partial \overline{u}}{\partial z} + \frac{\partial \overline{w}}{\partial x}\right) + \left(\frac{\partial \overline{v}}{\partial z} + \frac{\partial \overline{w}}{\partial y}\right)$$

where $\dot{S}'''_{g,t}$, $\dot{S}'''_{g,h}$ and $\dot{S}'''_{g,f}$ indicate respectively total entropy generation rate, thermal entropy generation rate, and frictional entropy generation rate per unit volume. The global entropy generation rate can be obtained by integrating the local entropy generation rate over the volume of the entire domain:

$$\dot{S}_{g,t} = \int \dot{S}'''_{g,t} dV \quad (28)$$

After solving the RANS equations in Fluent, the local entropy generation model can be easily implemented in the post processing software Tecplot®, using the velocity and temperature fields from the data files.

Results

Effect of Flow Channel Modifications

The hydraulic and thermal performance of the hybrid heat sinks with 16, 32 and 64 jets nozzles was investigated for the versions with modified flow channels with respect to the original and highly theoretical design from Ref [71]. In this Section, the designs are identified by the number of jet nozzles, while the suffix "WD" refers to flow deflectors and rounded corners. The analysis begins with a study of the thermal and hydraulic performance of the heat sinks followed by the presentation of the results from the entropy generation analysis.

Hydraulic and Thermal Performance

Figure 20:
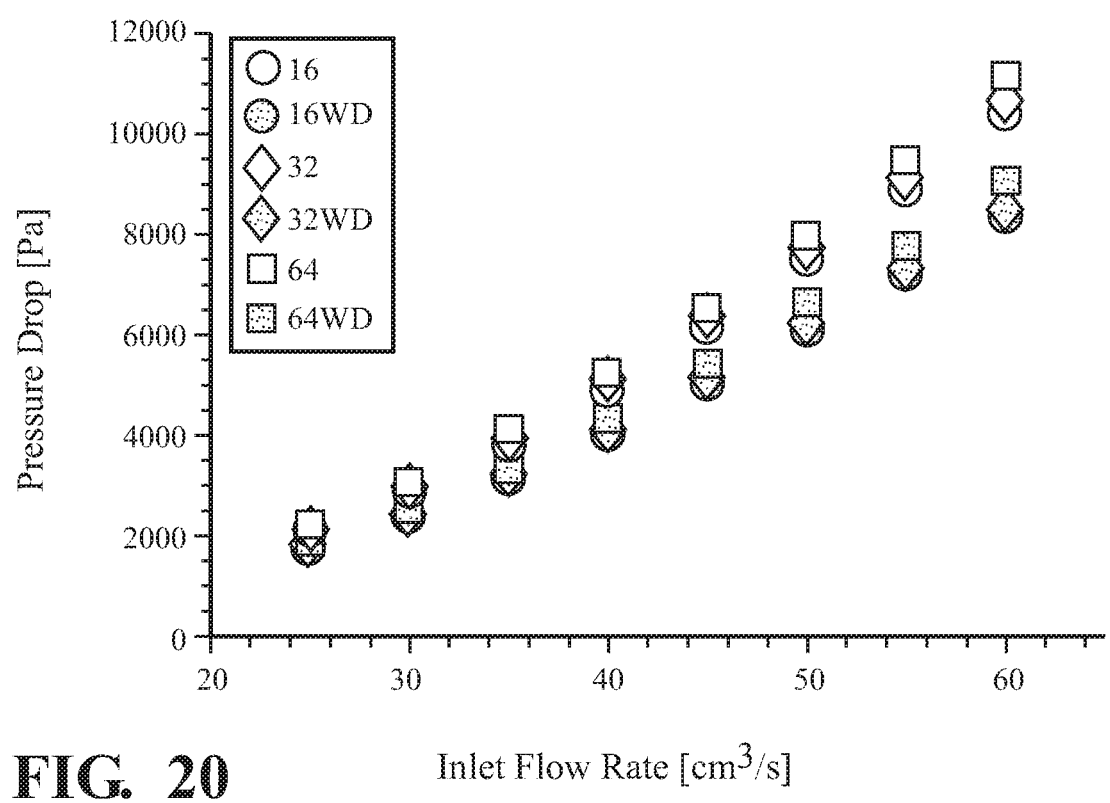
FIG. 20 is a graph of pressure drop for the hybrid heat sinks under different flow rates.

The main objective of the flow deflectors and rounded corners is to reduce the pressure drop across the system. Thus, the pressure drop is the primary variable of interest. The pressure drop for the six designs under different flow rates is reported in FIG. 20. It is possible to observe a decrease in the pressure drop in the WD designs, while changes are less notable between designs with different number of jet nozzles. The reduction in the pressure drop is more prominent as the flow rate increases, observing changes of approximately 2 kPa at the highest flow rate between designs with the same number of jet nozzles when including the deflectors and curvatures.

To have a better insight into the variations of the pressure drop, percentage changes were calculated for the different heat sinks using as a reference for comparison the design with 16 jet nozzles without deflectors. The percentage changes are computed using Eq. (20). In FIG. 21, the percentage changes in the pressure drop of the hybrid heat sinks with respect to a design with 16 jet nozzles without deflectors. The wide black bars indicate average values, while the thin red bars bound the minimum and maximum values in the range of flow rate conditions considered. FIG. 21 shows the percentage changes, where the wide black bars indicate the average percentage change in the pressure drop over the range of flow rates, while the thin red bars bound the minimum and maximum percentage change in the range of flow rates considered. An increase in the pressure drop is observed when the number of jet nozzles is increased in the hybrid heat sinks (approximately 6.3% for the design with 64 jets), which is expected, since extra resistance to the flow is created by smaller branches of channels and jet nozzles. Furthermore, a remarkable change in the pressure drop is shown by including the flow deflectors and curvatures, where reductions from 15 to 18% are obtained. The data from FIG. 21 indicate that the reduction in the hydraulic performance of the heat sinks when additional jet nozzles are incorporated is overwhelmed by the positive effect of including flow deflectors and curved channels. The flow patterns inside the heat sinks are depicted in FIG. S1 of the Supplementary Material.

Following the hydrodynamic analysis of the hybrid heat sinks, their thermal performance was investigated using the average temperature at the heat flux input region. The primary objective of the heat sinks is to dissipate the heat generated in the electronic device, while maintaining the lowest possible device temperature. Thus, it is crucial to track the average temperature at the contact area between the base plate and the electronic package (heat flux region). FIG. 22 is a graph of average temperature in the contact area between the impingement plate and the electronic package (heat flux region) for the hybrid heat sinks configurations under different flow rate conditions. The average temperatures are shown in FIG. 22 for the different hybrid heat sinks. The temperature of the heat sinks with 16 and 32 jet nozzles are similar, while a considerable reduction in the temperature is observed for the designs with 64 jet nozzles. Moreover, the temperatures are similar for designs with the same number of jet nozzles regardless of the inclusion of deflectors; which is expected, since the objective of the deflectors and rounded corners is to reduce the pressure drop along the channels, not to modify the thermal performance of the heat sink.

The parameter θ is computed using the hybrid heat sink with 16 jet nozzles without deflectors as a reference. The results for θ are shown in FIG. 23 for the different hybrid heat sinks, using the same average bar plot scheme from FIG. 21. FIG. 23 is a graph showing comparison of thermal performance for the hybrid heat sinks with respect to a design with 16 jet nozzles without deflectors. The wide black bars indicate average values, while the thin red bars bound the minimum and maximum values in the range of flow rate conditions considered. The values of θ for the designs with 64 jets are below 0.8, which means an improvement in the thermal performance with respect to the reference case, as explained above. However, a small reduction in the thermal performance is shown for the designs with 32 jet nozzles with respect to a design with 16 jet nozzles, as values slightly above 1 are shown for θ. The expected behavior is to observe an increase in the thermal performance as more jet nozzles are included, since the number of jets and the local regions with high heat transfer coefficients increase [51]. However, it is important to consider two important factors: 1) the position of the jet nozzles is fixed by the fractal configuration of the manifold, which distributed the jet nozzles over the whole 5 cm side base plate, and 2) the heat transfer area is only a 3 cm side square centered in the base plate. The aforementioned circumstances lead to an uneven distribution of the jet nozzles that are effectively impinging on the heat transfer area, which severely affect the thermal performance of the designs with 32 jets. This unexpected effect is explained in detail in ref. [71].

The comprehensive parameter, PPTR, was computed to look into the overall performance of the different heat sinks. An improvement in the overall performance is observed when the flow deflectors and rounded corners are added to the hybrid heat sinks, regardless of the number of jet nozzles. The improvement shown in the designs with deflectors and curvatures is mainly due to the reduction in the pressure drop, rather than any change in the thermal performance, as it was observed in FIGS. 21 and 23. Nevertheless, the changes in temperature seem to have greater weight in the PPTR, since the major changes observed in FIG. 24 are due to varying the number of jets nozzles rather than for the inclusion of the flow deflectors and rounded corners. Furthermore, it is observed that the unexpected thermal behavior of the designs with 32 jet nozzles affects their overall performance, depicting the highest PPTR values with respect to their 16 and 64 counterparts. FIG. 24 is a graph showing overall performance comparison of the hybrid heat sinks using the PPTR parameter. PPTR values are normalized by the worst case (32 jet nozzles heat sink).

Entropy Generation Analysis

The local entropy generation was computed for the three different domains: the water, the photopolymer resin heat sink, and the copper impingement plate. The three contributions of entropy generation were analyzed individually. The local entropy generation due to friction is of particular interest for the present analysis, as the objective of the flow deflectors and curvatures is to increase the hydraulic performance of the system by reducing the flow friction. As discussed above, the overall change in the hydraulic performance was analyzed using the pressure drop. However, the friction component of the local entropy generation analysis provides interesting information of the regions that are contributing to the enhancement of the hydraulic performance. The changes in the friction component of the local entropy generation, when flow deflectors and curvatures are included, are compared for heat sinks with 64 jet nozzles in FIGS. 25A-25D. Each subfigure shows contours of the local entropy generation due to friction in the flow across the different sections of the manifolds introduced in FIGS. 17A-17D.

FIGS. 25A-25D frictional local entropy generation contours for heat sinks with straight 90 degree turns and square corners (left of each subfigure), and with the included flow deflectors and rounded corners (right of each subfigure). Both configurations have 64 jet nozzles. The dashed rectangles enclose the regions were the contours are located inside the heat sink. These results correspond to the highest flow rate.

Figure 25A:
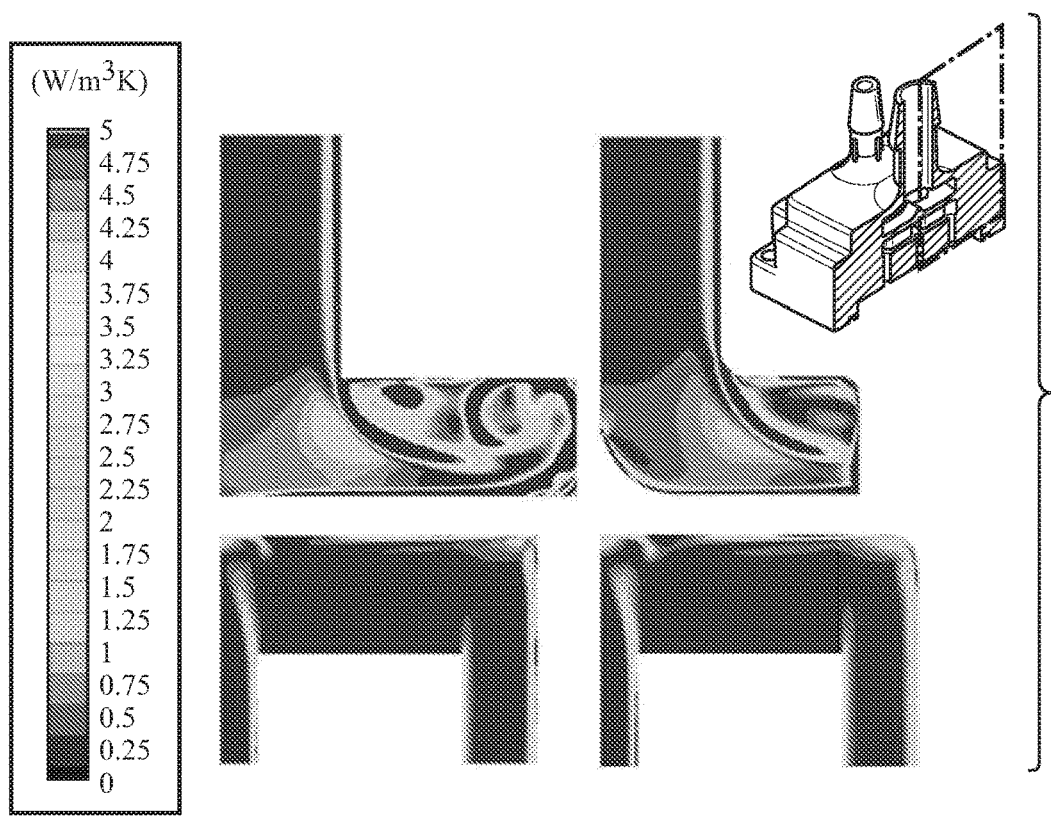
FIGS. 25A-25D are thermal images of frictional local entropy generation contours for heat sinks with straight 90 degree turns and square corners (left of each subfigure)
Figure 25B:
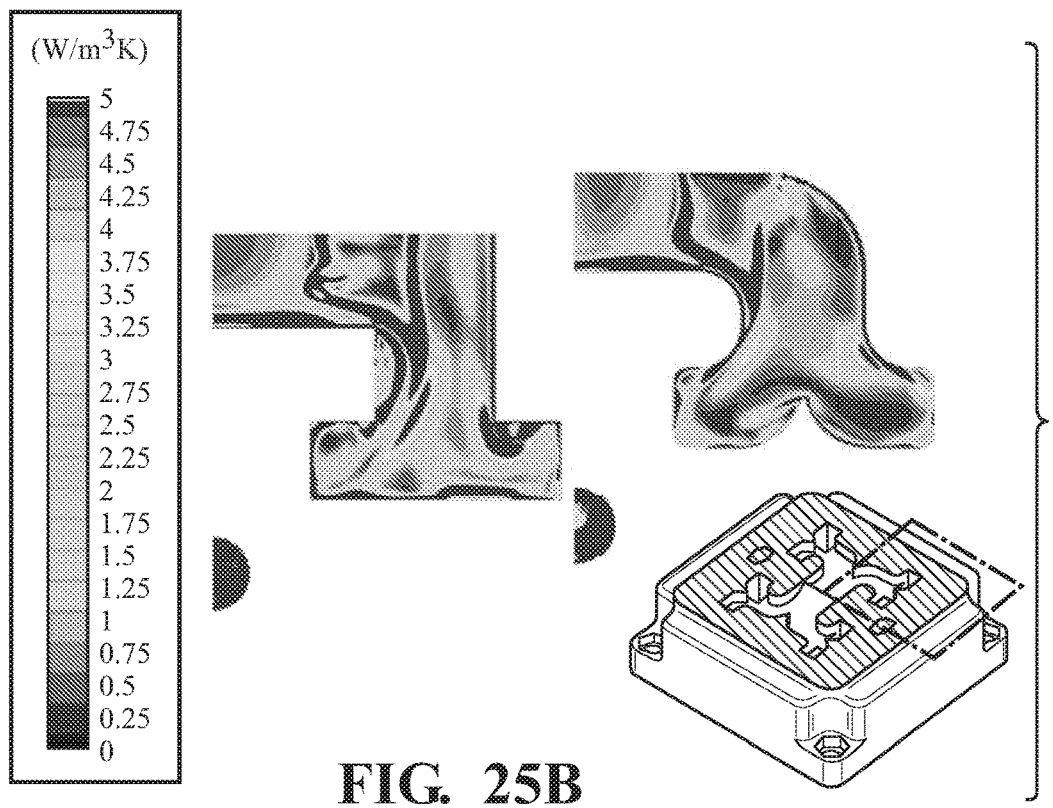
Figure 25C:
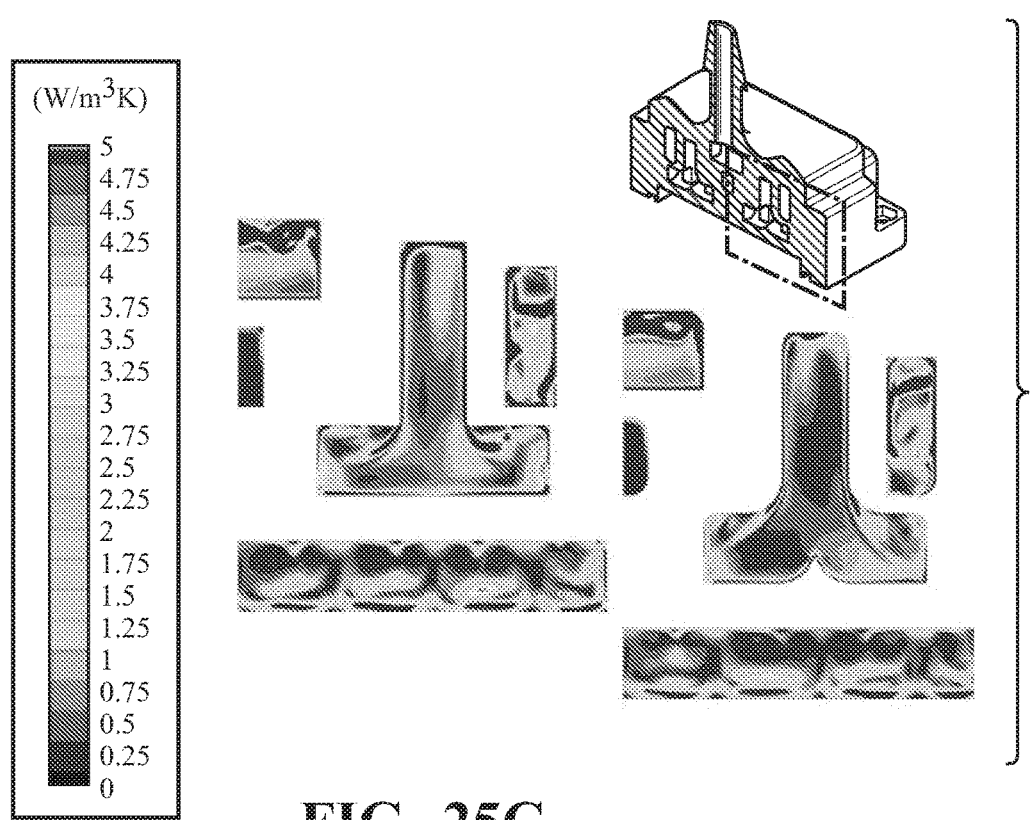
Figure 25D:
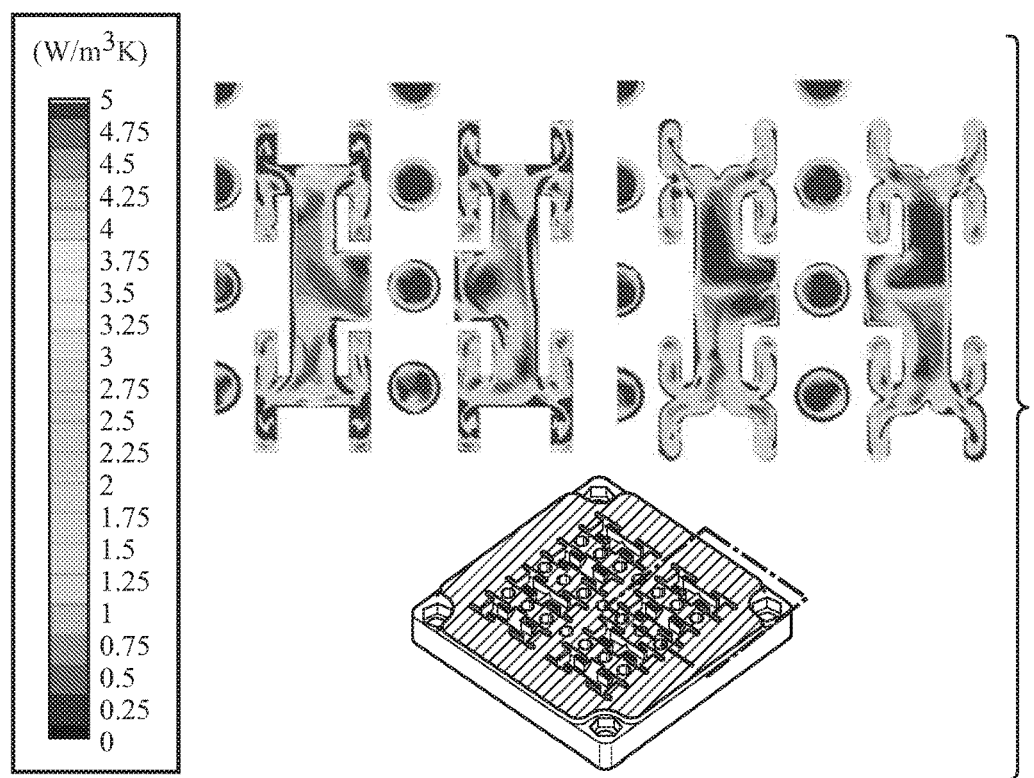

In FIG. 25A, the region near the inlet of the manifold is depicted, showing variations in the friction entropy generation between the two designs. The inclusion of the flow deflector generates a thin region with high entropy generation over its surface, while a reduction of entropy generation is observed in the wake past the recirculation area (upper inlet region). In FIG. 25b, there are focal zones with high entropy generation close to the flow deflectors surfaces, due to wall friction, but there is a considerable reduction in the levels of frictional entropy generation at the bifurcation zone as a whole. The reduction in frictional entropy generation when a flow deflector is placed is attributed to a better distribution of the flow by reducing the steep velocity gradients that can generate high friction levels in the flow. The reduction of frictional entropy generation is also observable in the flow near the deflector in FIG. 25C, while it becomes more notable around the flow deflectors and curvatures of FIG. 25D. The importance of the local entropy generation contours depicted in FIGS. 25A-25D resides in the fact that we can observe which deflectors and curvatures are actually contributing to reduce the pressure drop in the hybrid heat sinks. Furthermore, using the local entropy generation contours, it is possible to identify the regions where friction is still considerably high and focus future optimization efforts in these zones. Contours for the hybrid configurations with 16 and 32 jets are not presented since the behavior exhibited was analogous.

To obtain an overall perspective from the entropy generation analysis, the global values of entropy generation are computed using Eq. (28). The global rates of entropy generation due to friction in the flow channels inside the hybrid heat sinks for a flow rate of 60 cm$^3$/s are shown in FIG. 26. It is possible to observe the reduction in the values of entropy generation due to friction between designs with the same number of jets, when flow deflectors and rounded corners are included, which agrees with the behavior depicted in FIG. 25. A considerable increase in the global values of frictional entropy generation is shown by the designs with 64 jets, which is expected since the small channels and jet nozzles favor steeper velocity gradients.

The heat transfer contribution to the overall values of entropy generation is shown in FIG. 12. The first finding from the data in FIG. 12 is that the values of entropy generation due to heat transfer are one order of magnitude higher than the frictional contribution. It is worth mentioning that from the entropy generation rate due to heat transfer, approximately 96% is generated in the copper plate, while only 4% is generated in the fluid, and the entropy generation is negligible in the photopolymer resin. From these observations, two main outcomes arise. First, the irreversibility of the system is mainly generated due to heat transfer in the copper plate, which asserts the crucial role of the impingement plate in the cooling system and signals the redesign of the heat spreader to obtain a significant improvement in future optimizations. The second outcome is related to the heat dissipated through the photopolymer resin. Since the thermal conductivity of the photopolymer resin is relatively small, the heat dissipated through the heat sink casing is minimal, which is exhibited in the negligible values of entropy generation for this domain. FIG. 27 is a graph showing entropy generation rates due to heat transfer in the hybrid heat sinks for a flow rate of 60 cm3/s using a flat impingement copper plate. The heat sink designs in FIG. 27 display similar values of entropy generation due to heat transfer, which is expected since the major contributions are generated in the cooper plate, which is the same for every design, i.e., a flat featureless copper plate.

Effect of the Heat Spreader (Impingement Plate)

Following the previous entropy generation analysis, a parametric study was conducted for a number of heat sinks operating with different heat spreader designs, as described above. In this Section, the heat sinks are labeled with the number of jet nozzles in the heat sink, followed by the nomenclature presented in Tables 3 and 4 for the type of mini-fins etched in the copper plate. The different copper plates were tested on hybrid heat sinks with flow deflectors and rounded corners. The results are presented as a comprehensive analysis of the thermal and hydraulic performance of the heat sinks together with a brief entropy generation analysis.

Hydraulic and Thermal Performance

The pressure drop for a heat sink with 16 jet nozzles is presented in FIG. 28 for the different heat spreader designs. FIG. 28 is a graph showing pressure drop across the 16-jet nozzles hybrid heat sinks with different heat spreader designs and under various flow rates. It is possible to observe that the mini-fins in the base plate have little effect on the pressure drop; thus, indicating that the hydraulic performance of the heat sink is primarily ruled by the pressure losses in the channels and jet nozzles. The limited effect of the heat spreader in the pressure drop can be further explained by inspecting the pressure distribution along the flow path inside the heat sink. From the total pressure drop, only 1.7 to 3.5% of the losses are generated inside the flood chamber; thus, the potential influence of the heat spreader design is constrained within this narrow percentage range.

The previous results reinforced the idea discussed above about focusing the efforts to reduce the pressure drop in the optimization of the channels inside the fractal manifolds.

The percentage changes in the pressure drop were computed using a hybrid heat sink with 16 jet nozzles and a flat heat spreader as the reference case, see Eq. (20). The computed percentage changes are shown in FIG. 29, where data is included for some of the flat plate designs tested on heat sinks with 32 and 64 jets, in order to further corroborate that the pressure drop behavior is predominantly influenced by the number channels in the manifolds. In FIG. 29, the percentage changes are similar for designs with the same number of jet nozzles. FIG. 29 is a graph of percentage change in pressure drop for the hybrid heat sink with different heat spreader designs and under various flow rate conditions. The wide color bars indicate the average values, while the thin red bars bound the minimum and maximum values in the range of flow rates considered. For configurations with 16 jet nozzles, the average percentage changes are below 1.5%; which as expected, is under the limits for the contribution to the total pressure drop in the flood chamber. More significant variations are shown for modifications in the manifold structure (the number of jet nozzles), where the average percentage changes for heat sinks with 32 and 64 jet nozzles are approximately 3% and 7%, respectively, with respect to the 16 jet nozzles reference.

Conversely to the flow deflectors and rounded corners, the main objective of the features added to the heat spreader is to enhance the heat transfer in the cooling system, while their effect in the hydraulic performance of the heat sinks has been shown negligible. The significant effect of the heat spreader design becomes visible after analyzing the thermal performance of the hybrid heat sinks. FIG. 30 is a graph of average temperature in the contact area between the impingement plate and the electronic package (heat flux region) for the 16-jet nozzles hybrid heat sinks with different heat spreaders designs and under various flow rate conditions. The average temperature in the heated region of the heat spreader is reported in FIG. 30 for heat sinks with 16 jet nozzles and copper plates with the different mini-fin designs. A substantial reduction in the average temperature is shown after introducing mini-fins, displaying changes from 2.6 to 5.8 K with respect to the flat plate design. For plates with pin-fins, the average temperatures are slightly lower as the center-to-center spacing between the fins gets smaller, being 16FS3 and 16FC3 the designs that exhibit the lowest temperatures. By reducing the center-to-center spacing more fins fit in the 37.5 cm$^2$ impinging region, increasing the effective heat transfer area, which is evinced in the lower average temperatures. The effective heat transfer area is also increased for the plates with minichannels, as the slot width becomes smaller. Nevertheless, the minichannels do not exhibit the lowest base temperatures for the narrow 0.2 mm slot width. For low flow rates, the atypical poor performance of 16FR3 is more notable, while for all high flow rates it still displays higher average temperature than the 16FR2 and 16FR3 designs.

The reduced heat transfer characteristics in the 16FR3 heat sinks can be explained by investigating the velocity field along the channels. The average velocity was computed for the flow between the mini-fins over a plane parallel to the impinging surface, at 1 mm below the top of the fins. For the 16FR1 design, the average velocity between the fins is in the range of 0.07 to 0.18 m/s, going from the lowest to the highest inlet flow rate condition, while for the 16FR2 design the average velocity is in the range of 0.046 to 0.14 m/s, which means a reduction ranging from 22 to 34%. However, the average velocity for the 16FR3 design is in the range of 0.014 to 0.05 m/s, which represents a reduction of 65 to 70% with respect to the 16FR2 design. Although the effective heat transfer area is increased by reducing the slot width of the minichannels, the resistance to the flow between the fins is increased, triggering a backlash in the convective heat transfer coefficients. Between the 16FR1 and 16FR2 designs, the reduction the velocity is not significant enough to overcome the effect of increasing the heat transfer area. On the other hand, for the 16FR3 design, the resistance to the flow gets considerably high between the mini-fins, showing prominent reductions in the flow velocity, which leads to low convective heat transfer coefficients that overwhelm the positive effect of the enhanced heat transfer area. Thus, for the design of base plates with minichannels, it is important to maintain their width above 0.5 mm, to allow the cooling stream to flow freely along the channels. The changes in the velocity distribution along the base plates with minichannels are depicted in FIG. S2 of the Supplementary Material.

Meanwhile, the 16FS3 pin-fin design generates channels of 0.5 mm width between the fins is in the safe limit of low flow resistance. The average velocity for the 16FS1 design is in the range of 0.11 to 0.29 m/s, while for the 16FS3 is in the range of 0.075 to 0.20 m/s, which represents a change of only 31% from the bigger to the smaller on-center spacing. Similar values were exhibited for the circular pin-fin designs. The negligible changes in the velocity distribution for the pin-fin design is depicted on FIGS. S3 and S4 of the Supplementary Material. The temperature distribution on the impinging surface is also depicted for the different fin designs in FIGS. S5 to S7 of the Supplementary Material.

A general comparison for the thermal performance of the different heat spreaders is obtained from the parameter θ. For the computation of θ, the hybrid heat sink with 16 jet nozzles and a flat plate is considered again as the reference case. FIG. 31 displays the data obtained from the computation of the parameter θ, presenting again results for heat sinks with 32 and 64 jet nozzles. The results for designs with 32 and 64 jet nozzles exhibit, the meager performance of the minichannels with a 0.2 mm slot width. A surprising result is that the value of θ is similar for all the FS3 and FC3 pin-fin designs, regardless of the number of jet nozzles in the heat sink, see the dashed line in FIG. 31. This finding confirms the importance of the heat spreader in the design of these hybrid heat sinks, as suggested in the previous entropy generation analysis.

FIG. 31 is a graph showing a comparison of thermal performance of the hybrid heat sinks with respect to a design with 16 jet nozzles with deflectors. The wide bars indicate the average values, while the thin bars bound the minimum and maximum values in the range of flow rate conditions considered. The dashed line follows the trending of the maximum attained enhancement in the thermal performance.

The PPTR parameter is employed to bring a comprehensive comparison of the overall performance for the heat sink designs. The PPTR values are plotted in FIG. 32. FIG. 32 is a graph showing an overall performance comparison of the hybrid heat sinks using the PPTR parameter. PPTR values are normalized by the worst case (32 Flat). The dashed red line follows the trend of the maximum attained enhancement in the overall performance. As noted above, it was observed that the PPTR is predominantly influenced by changes in the thermal performance of the heat sink. In the current heat spreader analysis, the changes in the thermal performance between different designs are more prominent than the thermal performances discussed above, while the changes in the hydraulic performance are even less significant; thus, the PPTR plot from FIG. 32 closely resembles the behavior of the parameter θ in FIG. 31. A trend is also observed in the overwhelming effect of the heat spreader in the heat sink design, see the dashed line in FIG. 32, as the number of jets in the system has a minimum impact after the implementation of an efficient heat spreader.

Entropy Generation Analysis

The total entropy generation was separated into its frictional and heat transfer contributions. Since the hydraulic behavior in the heat sinks is rather similar regardless of the heat spreader design, the entropy generation due to friction in the flow is closely identical for heat sinks with the same number of jet nozzles. Due to the similarity between the frictional entropy generation values, and because their magnitudes are one order of magnitude smaller than the heat transfer contributions, we focus only on the results of entropy generation rates due to heat transfer.

Figure 18B:
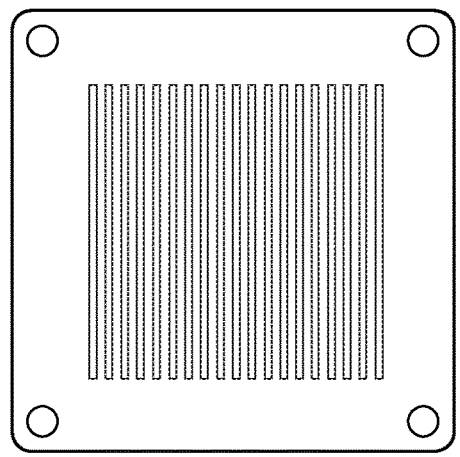

The heat transfer contributions to the global entropy generation rates are depicted in FIG. 33, where 95% of the values are generated in the copper plate. FIG. 33 is a graph showing entropy generation rates due to heat transfer in the hybrid heat sinks with modified heat spreaders for a flow rate of 60 cm³/s. The horizontal dotted line indicates the lowest entropy generation rate value observed for 64FS3. The results show that the heat spreaders with pin-fins dissipate heat more effectively than flat plates, being the ones with the lowest values of entropy generation; while the rates in the minichannels designs are close to the flat plate, regardless of the slot width. The overall trending followed by the entropy generation rates resembles the behavior of the thermal performance depicted by the PPTR. However, the entropy generation rates do not clearly exhibit the saturation trend reflected in FIGS. 16 and 17 for the best performing heat sinks. The results indicate that the 64FS3 heat sink, is the one with the lowest irreversibility, see the horizontal dotted line in FIG. 18. However, the difference in the entropy generation rate with respect to 16FS3 is approximately 12%, where the design with 16 jet nozzles is easier to manufacture.

Conclusion of Thermo-Fluid Characteristics and Entropy Generation Analysis

The comprehensive investigation reported herein features new perspectives in the performance analysis of hybrid liquid cooled heat sinks and unfolds paths for the design of alternative liquid cooling systems. A detailed understanding of the mechanisms that are contributing to the pressure losses was obtained from an entropy generation analysis. From the entropy generation due to friction, a local observation of this parameter allowed for the optimization of the flow channels by identifying the regions where entropy generation is higher. Furthermore, the entropy generation analysis showed that entropy generation rates are higher in the copper plate; thus, an optimization of the heat transfer within the heat spreader was suggested to significantly improve the thermal performance of the heat sinks. Finally, it was observed that the heat dissipated across the photopolymer resin heat sink is negligible; thus, the primary mechanism of cooling in the hybrid heat sinks is jet impingement and the original hybrid concept of combined microchannels and jet impingement cooling, described in ref. [71], is not applicable anymore. The hybrid nature of the heat sinks is now limited to its hydraulic behavior, where the channels manifold helps to uniformly distribute the flow to the jet nozzles array.

The analysis of the heat spreader with mini-fins handed out additional findings. The mini-fins showed to have little effect on the hydraulic performance of the cooling system, while the thermal performance was substantially improved. Moreover, the pin-fin designs showed better heat transfer characteristics, while a maximum attainable enhancement in the overall performance was observed regardless of the number of jet nozzles in the heat sink. Following these findings, a heat sink with 16 jet nozzles rise as the most convenient option, when mini-fins are included in the design of the heat spreader, since the performance will tend to be similar for heat sinks with an alternative number of jet nozzles, but the manufacturing complexity is considerably reduced for the 16 jet nozzles design.

Experimental Investigation of the Cooling Performance of 3-D Printed Hybrid Water-Cooled Heat Sinks Further to Thermo-fluid Characteristics and Entropy Generation Analysis discussed above, an experimental characterization of hybrid water-cooled heat sinks for dense electronic packages was conducted. This work represents the culmination of a series of three papers (of which the first two are discussed above) on the analysis and optimization of hybrid liquid-cooled heat sinks. The hybrid heat sinks incorporated a combination of fractal channel manifolds and microjet impingement arrays. The intricate manifold structure required the use of advanced stereolithography 3-D printing techniques for its manufacturing. The effects of the number and distribution of the impinging jets and the depth of the flood chamber were investigated in terms of hydraulic and thermal performance. Additionally, a simple design without impinging jets was incorporated for comparison purposes. The effects of different heat transfer enhancement features (circular and rectangular fins) added to the copper heat spreader were also studied. Pressure drop, junction temperature, and thermal resistance were measured and compared among all the studied heat sinks. The results indicated that the 32 jets design produced the highest chip temperature, while the heat sinks with 16 and 64 jets had a similar thermal performance for the range of flow rates considered. For the hydraulic performance the 16 jets design featured the lowest pressure drop in comparison with the 64 and 32 jets designs. Nonetheless, all the hybrid heat sinks were outperformed by the simple design, which showcased the capability to generate lower chip temperatures with considerably lower pressure drop. The overall performance assessment of the liquid-cooled heat sinks was conducted using a new a metric formed by the combination of the thermal resistance and the pumping power. This metric serves as suitable option to identify the best heat sink designs based on their thermo-fluid characteristics, i.e., the one that offers the highest cooling performance with the least pumping power.

Introduction

Continued miniaturization and large energy requirements of high-power electronic devices have posed a colossal challenge for their adequate thermal management [79]. High operating temperatures lead to low performance and decrease the longevity of electronic devices, as it has been demonstrated that a rise in the operating temperatures exponentially increases the risk of failure [80]. Moreover, maintaining a uniform temperature distribution proves to be an extremely daunting task due to the presence of hotspots caused by the non-uniform power distribution in chip packages [81], which can lead to malfunction or catastrophic failure. Despite the astounding advancement in electronics cooling in the past decade, challenges persist for heat dissipation from the modern miniaturized electronic components.

In the past decade, numerous investigations on air-cooled heat sinks have been conducted to explore and enhance their cooling capabilities [82-84]; despite these advances, conventional air-cooling solutions are inadequate for high performance electronics [85]. Alternatively, liquid-cooling has notorious advantages, as it offers superior cooling rates [86], noise reduction, and modularity [87]. Some of the initial work on liquid-cooling dates back to the investigation by Tuckerman and Pease [88] for effective thermal management of planar integrated circuits. Since then, many liquid-cooling methods such as pool boiling [89], micro-channel heat sinks, jet impingement, and spray cooling have been used for thermal management of high-density power electronics [90]. Although two-phase cooling is associated with large heat transfer coefficients, Mudawar [91] demonstrated that single-phase liquid cooled systems have considerable advantages in terms of reliability and packaging concerns.

Among the single-phase liquid-cooled devices, micro-channel heat sinks stand out as a reliable solution. In the comprehensive survey reported by Kandlikar et al. [92], it is discussed that a reduction in channel dimensions leads to larger surface area per unit volume, which increases the heat transfer coefficient. Other investigations have been focused on the enhancement of microchannels heat sinks from different perspectives [93-100]; nonetheless, there are major short comings as the enhancement potential is only limited to small regions near the entry region and microchannels naturally generate high pressure drops [92, 101]. Microjet-cooled heat sinks represent a plausible remedy for these setbacks. It has been reported that increments in the turbulence of the flow stream and modifications on targeted surface are beneficial for the thermal management in micro-jet heat sinks [102-106]. Natrajan et. al [107] proved the large cooling capabilities of submerged microjet heat sinks by being able to dissipate up to 250 W/cm$^2$ with a pressure drop lower than 70 kPa. Wiriyasart and Naphon [105] demonstrated the effect of features on the impinging surface; circular, rectangular, and cone-shaped pin fins were added on top of the impinging surface and the finding revealed that the circular pin fins led to the lowest surface temperatures. Rattner [108] demonstrated the importance of the location of the coolant extraction ports in conventional jet impingement array heat sinks. It was found that closely spaced jets and alternating outlets in microjet cooling are beneficial for heat transfer, as the cross-flow interference is drastically reduced, improving the cooling uniformity and reducing pumping loads.

Usually, microjet heat sinks are associated with low pressure drops and modest thermal resistance in comparison with microchannel heat sinks [109]. Thus, a possible approach to take advantage of the lower pressure drop found in jet cooling is the hybridization of heat sinks. A hybrid heat sink would deliver high cooling performance and uniform surface temperature with comparatively lower pressure drop and thermal resistance, a feat difficult to achieve with microchannels or impinging jets individually. Barrau et al. [110] demonstrated that the hybrid jet impingement/microchannel cooling scheme could achieve good temperature uniformity, being able to dissipate up to 695 W with surface temperatures between 23° C. and 25° C. Several investigations focused their attention in adjusting the geometry of the hybrid devices to accomplish an optimum performance [111-115], finding that parameters like the diameter of the jets, the jets arrangement, the microchannel height, and slot-jet length are crucial for the cooling performance. Alternatively, heat sinks combining impinging micro-jet arrays and microchannels with pin fins on the cooled surface have been proposed [116-120]. Robinson et al. [116, 117] presented an intricate hybrid heat sink, whose manufacturing was only achieved through the implementation of MICA Freeform additive manufacturing. Heat fluxes as high as 1000 W/cm$^2$ were dissipated with the use of this device within an acceptable range of operating temperatures for Si-based electronics (75° C. to 85° C.), bringing into the attention possible thermal management capabilities achievable with the implementation of new manufacturing techniques.

Due to the drastic miniaturization of heat sinks, researchers are facing challenges at creating complex geometries in small spaces with previous generation manufacturing methodologies; however, the solution has presented itself with the rapid development of advanced additive manufacturing techniques. Stereolithography (SLA) 3-D printing is known for producing highly detailed parts, with a resolution up to 20 $\lambda$m [121], which extends its applicability to various research fields. It is based on the principle of layered manufacturing, where the materials are deposited layer by layer allowing to fabricate complex structures with high precision and at a low cost. In this investigation, low force stereolithography (LFS) was used to manufacture fractal channel manifolds for microjet liquid-cooled heat sinks. Four different designs were fabricated, three fractal heat sinks with 16, 32 and 64 impinging jets and a simple one-inlet and one-outlet design for comparison purposes. The 3-D printed blocks containing the microchannels manifolds were attached to copper heat spreaders, to which heat enhancement features were added, such as circular and rectangular fins. The depth of the flood chamber was varied in order to observe the influence of this parameter on the thermal and hydraulic performance of the heat sinks. Average chip temperature, volumetric flow rate, and pressure drop measurements were used to characterize the performance of the different heat sinks. Finally, to have a more straightforward comparison between the devices, the PPTR presented in Ref [122] was used as a figure of merit. The theoretical idea of the fractal hybrid heat sinks was first introduced in [123] where numerical simulations were conducted in the laminar regime. Later on, in Ref. [123] we adapted the theoretical concept of the hybrid heat sink for incorporation in a commercial liquid-cooling loop, additional optimization was performed using entropy generation minimization, and geometry modifications were incorporated for optimum turbulent flow operation. In this contribution, we conclude this series of three papers with the experimental verification of the previously reported findings.

Description of the Liquid-Cooled Heat Sinks
Hybrid Heat Sinks

Figure 34A:
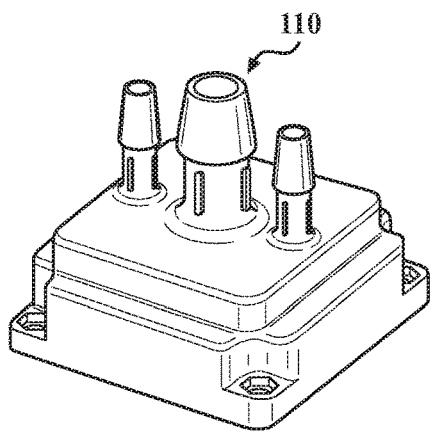
FIGS. 34A and 34E are schematics of a hybrid heat sink outer shell with 64 jets and internal channels geometry, respectively.
Figure 34B:
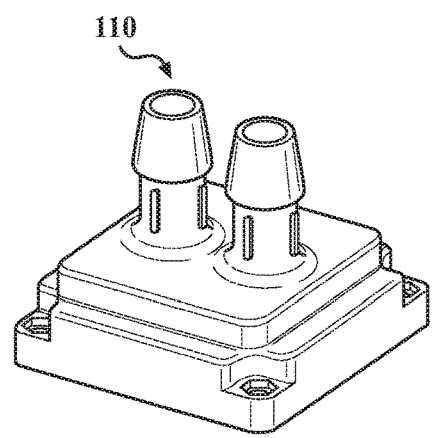
FIGS. 34B and 34F are schematics of a 3-D model of the one inlet one outlet (1in1out) outer shell and channels geometry, respectively.
Figure 34C:
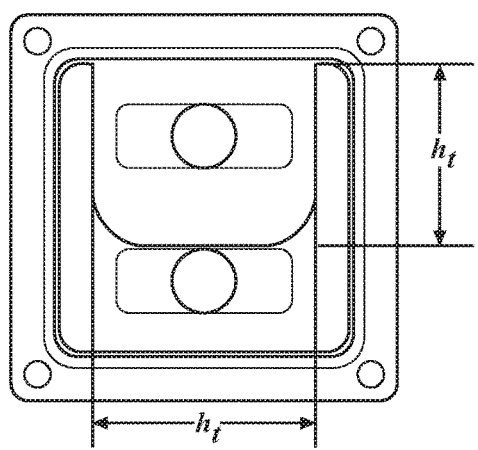
FIG. 34C is a bottom view of the 1in1out outer shell shown in FIG. 34B.
Figure 34D:
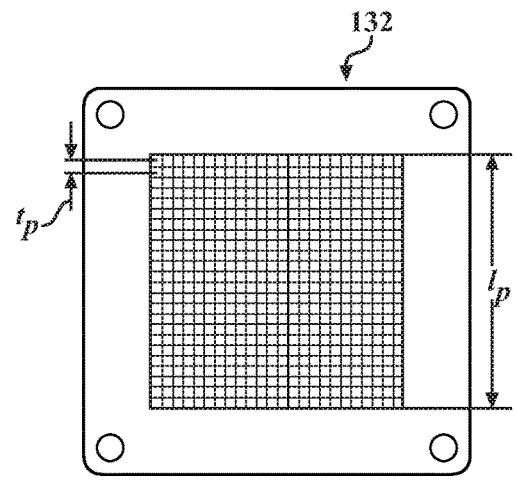
FIG. 34D is a top view of copper plate with rectangular fins.
Figure 34E:
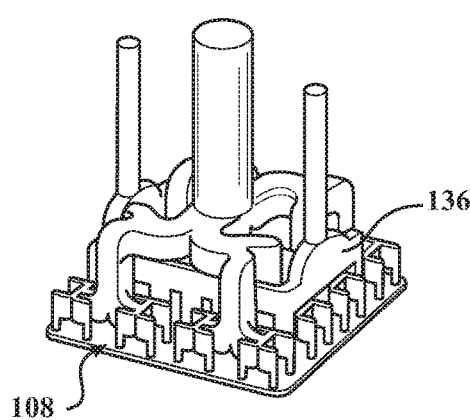
Figure 34F:
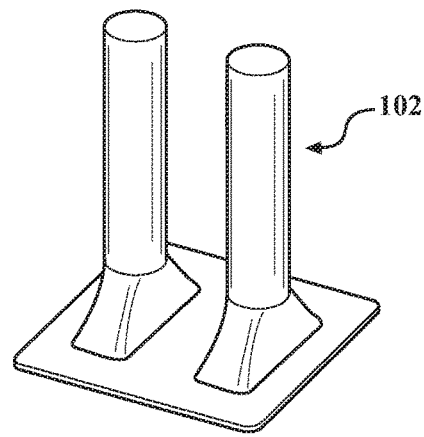
Figure 34G:
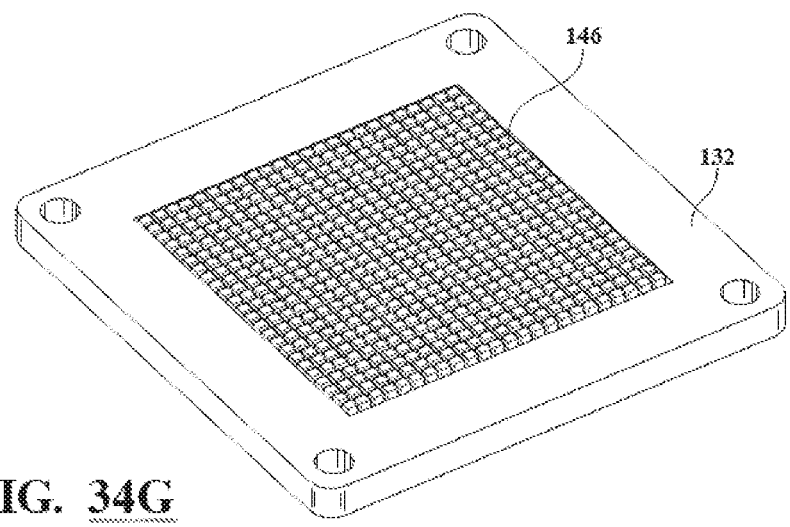
FIG. 34G is a perspective view of a copper plate with rectangular pin-fins.
Figure 34H:
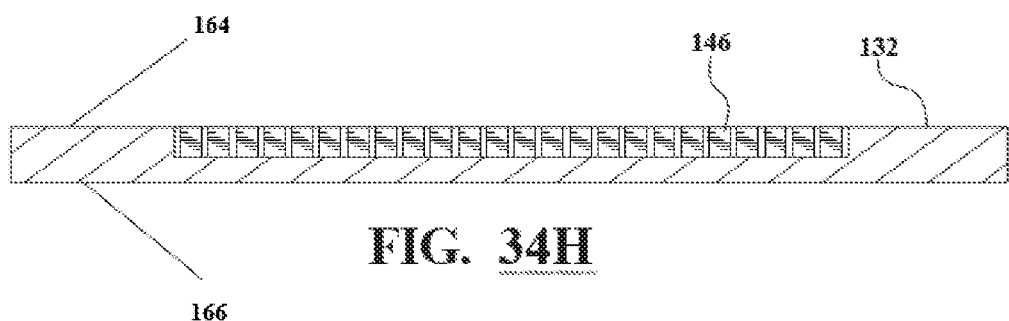
FIGS. 34H-34I are cross sectional views of a copper plate with rectangular pin-fins.
Figure 34I:
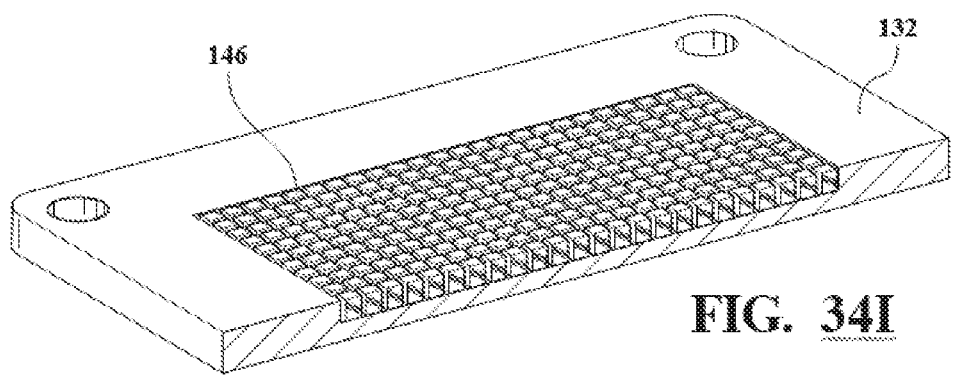
Figure 34J:
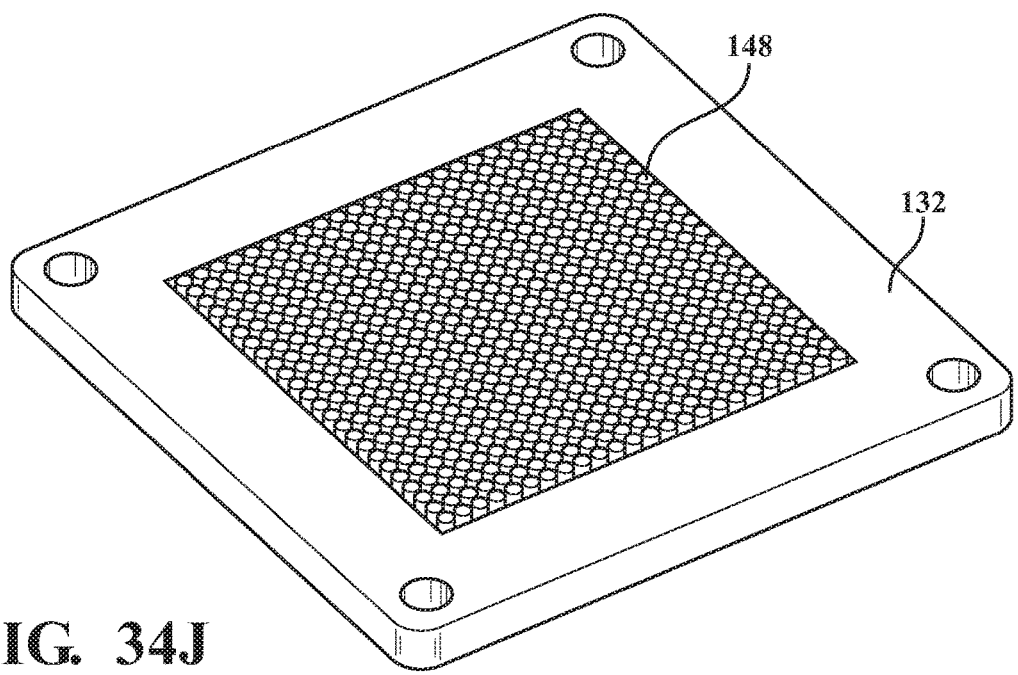
FIG. 34J is a perspective view of a copper plate with circular pin-fins.
Figure 34K:
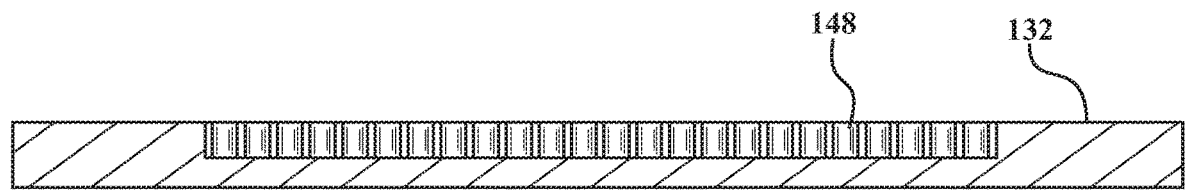
FIGS. 34K-34L are cross sectional view of a copper plate with circular pin-fins.
Figure 34L:
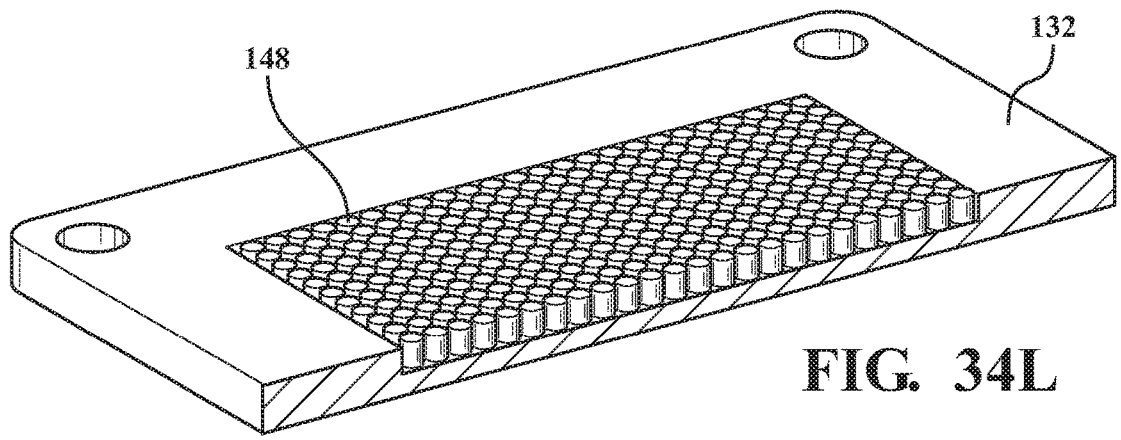

The hybrid heat sinks are made of a combination of an inlet fractal channels manifold, a microjet impingement array, a flood chamber, and an extraction manifold, all contained within an external shell as depicted in FIG. 34A. Water enters through the inlet manifold 110, perpendicular to the impinging surface 132, which bifurcates successively following a fractal configuration with multiple jet nozzles. Water is homogeneously distributed into the flood chamber 108, where impingement with a copper heat spreader 132 occurs. The liquid is extracted through the outlet manifold 136, which features extraction ports near the nozzles vicinity to avoid cross-flow [108]. Heat sinks with 16, 32, and 64 jet nozzles were built with a flood chamber thickness (distance between the nozzles exit and the copper plate) of 4 mm. One 64 jet heat sink was fabricated with a 1 mm flood chamber thickness, referred to as 64v2. FIGS. 34A and 34E are schematics of a hybrid heat sink outer shell with 64 jets and internal channels geometry, respectively. FIGS. 34B and 34F are schematics of a 3-D model of the one inlet one outlet (1in1out) outer shell and channels geometry, respectively. FIG. 34C is a bottom view of the 1in1out outer shell shown in FIG. 34B. FIG. 34D is a top view of copper plate with rectangular fins. FIG. 34G is a perspective view of a copper plate with rectangular pin-fins. FIGS. 34H-34I are cross sectional views of a copper plate with rectangular pin-fins showing the first surface 164 and the second surface 166.

The branching fractal pattern of the inlet manifold is defined by a set of recursive equations; the number of channels in successive levels is determined by $2^k$, being k the bifurcation level [122]. The length of each channel, $l_k$, at the bifurcation level k is given by $$l_k = \begin{cases} \dfrac{L}{2^{(k+2)/2}} & k = 2, 4, 6 \ldots \\ \dfrac{L}{2^{(k+3)/2}} & k = 1, 3, 5 \ldots \end{cases} \quad (29)$$

where L=50 mm is the side length of the copper plate. The Lagrange multiplier method was used to minimize the pressure drop in the inlet manifold channels under the constraint of constant volume. The cross-section dimensions of the channels were determined as indicated in [123], where the optimum widths for each branch level k was given by $$\left(\dfrac{w_{k+1}}{w_k}\right)^4 \dfrac{(w_k + h)^m [2-m]w_k + 3h]}{(w_{k+1} + h)^m [2-m]w_{k+1} + 3h]} = \dfrac{1}{2^{3-m}} \quad (30)$$

where h the height of the channel, $w_k$ the width of the channel at the branch level k, and m is the exponent from the friction factor for the turbulent regime $f = C_k/Re_k^m$, where the variations in the friction coefficient at the $k^{th}$ level are accounted for in $C_k$, and $Re_k$ represents the local Reynolds number in the $k^{th}$ branch. The friction factor f was obtained from fitting the smooth pipe curve from the Moody diagram, where $C_k$=0.4 and m=0.278. All sharp edges were rounded off and deflector plates were placed at stagnation points for the reduction of friction, see FIG. 34A. The width of the first level (denoted by $w_0$) in the inlet manifold was fixed for all the designs to 9.15 mm, which matches the diameter of a standard ½" barbed fitting.

The outlet manifold extracts the fluid from the flood chamber through 21 equidistant extraction ports located between the impinging jets as described in Refs. [122-123]. The diameters of the inlet, outlet, and jet nozzles are listed in Table 6. It is worth mentioning that the inlet and outlet diameters are standardized, thus, commercially available barbed fittings of ½" and ¼" are compatible with the device. As depicted in FIG. 34A and FIG. 34B, the standard barbed fittings are manufactured attached to the manifold block. The design illustrated in FIG. 34A corresponds to the final optimized heat sink reported by Paniagua-Guerra and Ramos-Alvarado in [123]. Further description and details of the optimization process can be consulted in [123].

TABLE 6

Dimensions of the different hybrid heat sink designs [123].

| Inlet Diameter [mm] | Outlet Diameter [mm] | Jets Nozzle Diameter [mm] | | |
|---|---|---|---|---|
| | | 16 | 32 | 64 |
| 9.15 | 3.55 | 2.85 | 1.7 | 1.16 |

One Inlet and One Outlet Heat Sink

A simple design composed of one inlet and one outlet was fabricated for comparison with the hybrid heat sinks, the outer shell and insides of the one inlet one outlet (1in1out) heat sink is depicted in FIG. 34B. The inlet and outlet diameters were fixed to 9.15 mm and are compatible with commercially available barbed fittings of ½". The flood chamber (1 mm depth) is slightly different; as it features a throttling surface, see FIG. 34C, which forces the fluid through the pin fins manufactured on the copper plate. This feature makes the operation of the 1in1out with a plain plate impossible due to the complete obstruction of the inlet. The throttling section encloses the inlet region (24.83×9.15 mm$^2$) and $h_t$=25.94 mm and $l_t$=32 mm, see FIG. 34C.

Impingement Plate

The impingement plate is the only metallic component of the heat sink; it is made of copper, with a surface area of 56×56 mm$^2$, and it is 3 mm thick. An array of mini-fins was manufactured on a square region of 37.5 mm long centered in the impinging area ($l_p$ in FIG. 34D). The effect of having circular and rectangular pin fins was investigated, while fixing the cross-sectional area of the fins to 1 mm$^2$. A total of 576 mini pin fins are distributed symmetrically over 24 rows and columns, the distance to the centers ($t_p$) between 2 adjacent pin fins is 1.43 mm and the height of the pin fins is 1.59 mm. FIG. 34D shows the design of the copper plate featuring rectangular fins.

FIG. 34E is a cross sectional view of a copper plate with rectangular pin-fins 146. FIG. 34F is a cross sectional view of a copper plate with circular pin-fins 148. Three copper plates were tested, two with circular and rectangular pin-fins and a plain plate; for the case of the 1in1out configuration, its operation was only possible with the pin-finned plates. The selection of the impingement plates was guided by the simulation results in Ref [123], where an entropy generation analysis highlighted the importance of the impingement plate on the heat sink performance. A series of CFD simulations also concluded that heat sinks featuring the described array of pin fins on the impinging surface outperformed the implementation of straight minichannels. To attest the performance of the different heat sinks, average chip temperature, pressure drop, thermal resistance, and the PPTR metric were recorded [123].

Heat Sinks Manufacturing and Experimental Setup

3-D Printed Heat Sinks

The complexity of the manifolds and the high precision needed to manufacture the features within the channels, required of the implementation of advanced additive manufacturing techniques. The hybrid and 1in1out heat sinks were manufactured using the Form 2 printer from FormLabs, which employs LFS. The LFS is a layer-by-layer approach based on the polymerization of photopolymer resin using UV light, the UV laser is directed through a transparent window at the bottom of the resin tank drawing a cross section of the 3D model and selectively hardening a thin layer of the material each time on the building platform. The printing time varies depending on the geometry, where approximately 9 hours and 40 minutes are required to print one of the outer shells for the hybrid designs using a resolution of 50 μm. The manufacturing time does not increase linearly, as approximately 15 hours and 20 minutes are needed to print four prototypes at the same time. Once the printing process is completed, the prototype is placed in a 95% isopropyl alcohol (IPA) bath for 15 minutes to wash off the excess of uncured resin. After the washing stage, the supports that held the prototype during the printing stage can be removed by cutting or simply bending them prior the final curing phase. Once the prototype is separated from its supports, the finished part is placed into the cure station (UV light station) at 80° C. for 15 minutes. This curing stage completely solidifies the resin, hardening the surface and giving it the last fine-finishing. Once the shell containing the manifolds is completed, the cooper base plate is attached to the bottom of the printed part using four screws and an 0-ring is used for sealing the system (see FIG. 34C). Copper was selected for the impingement plate due to its high thermal conductivity; contrariwise, the photopolymer in the shell has a low thermal conductivity. As it was demonstrated in Ref [123], the most critical component for optimizing cooling is the impinging surface. Alternatively, the material for the shell features lightweight, low corrosion in aqueous environments, good thermal stability, and high impact strength.

Experimental Setup

Figure 35:
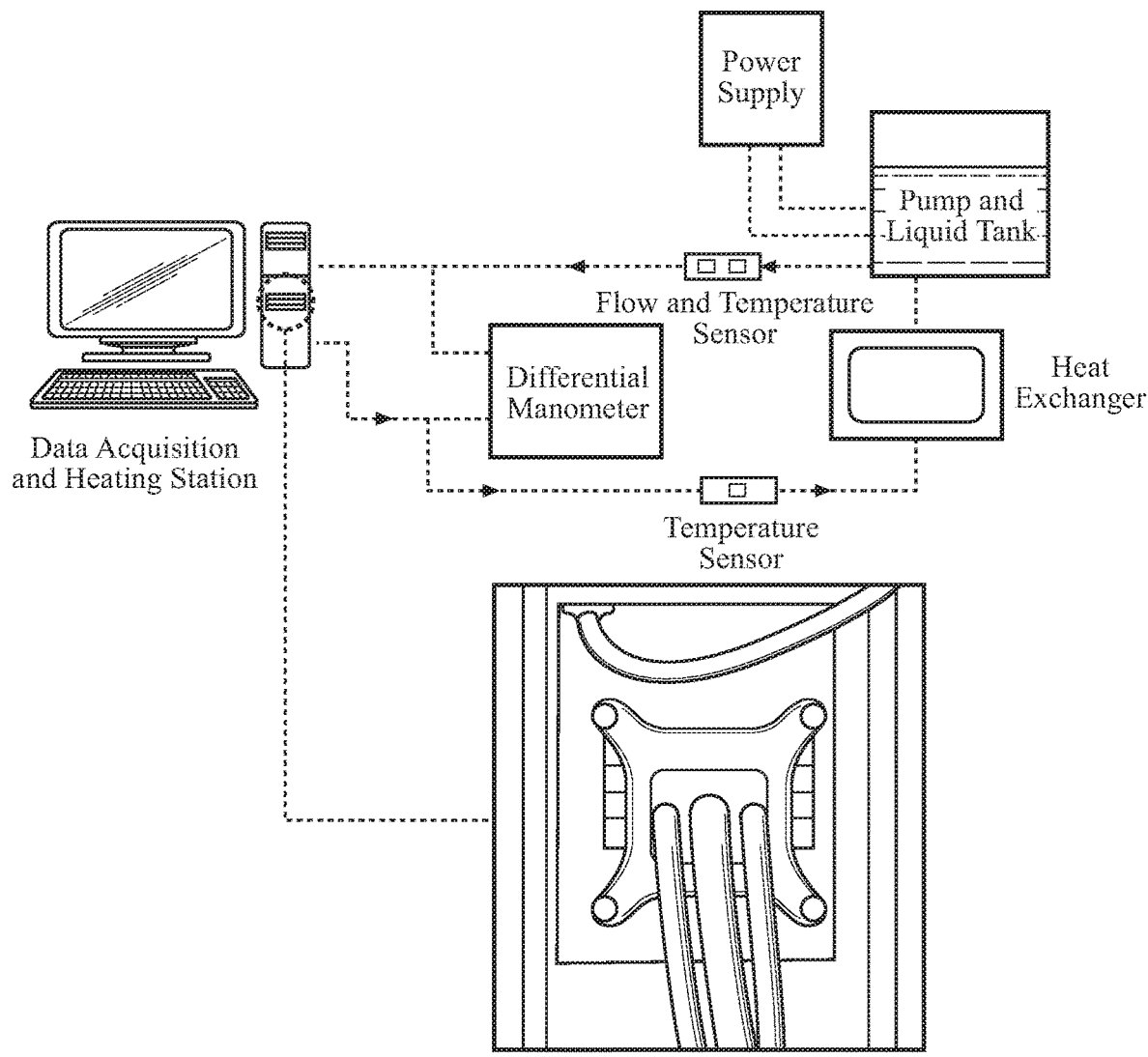
FIG. 35 is a schematic representation of the experimental setup for the hybrid heat sink.

A schematic of the main components of the experimental setup is shown in FIG. 35. Filtered water is supplied at the reservoir (D5 Photon 170 Reservoir V2 by XSPC) attached to a variable pump capable to provide a maximum flow rate of 1200 liters per hour with a maximum head of 3.7 m. The flow then passes through a Pacific TF1 flow meter (±0.28 cm$^3$/s) and temperature sensor (±0.5° C.) before entering the heat sink. The pressure drop of the heat sinks was measured with a differential manometer (TPI-621) with an accuracy of ±0.3 Pa; probes were inserted at the inlet and outlet of the heat sinks. Once the water leaves the heat sink and passes through the sensing port, the fluid goes to a Pacific temperature sensor by Thermal take (accuracy of ±0.5° C.). Finally, the flow is directed to an XSPC heat exchanger (EX240 Dual Fan Radiator) and the chilled water is pumped back to the reservoir.

For the sensing and heating stations we used the last generation of CPUs available in the market. In this investigation the CPU Intel Core i5-9600K was selected for having a thermal design power (TDP) of 95 W. The Intel Core i5-9600K processor is completely instrumented for temperature measurement (with an accuracy of 0.2° C. for individual cores) and power sensing; thus, measurements can be directly taken from the operating computer. The open source software HWiNFO64 v6.08 was used to gather the temperature and power consumption of the 6 different cores in the CPU. To achieve the condition for the maximum heat dissipation, the CPU was overclocked fixing the clock speed to 4.5 GHz and full load conditions were generated with the open source software powerMAX by CPUID. At full load, the CPU consumes more than 100 W and requires a minimum cooling capability of 95 W; this amount of energy needs to be dissipated through the contact area of the processor (30×30 mm$^2$), thus producing a constant heat flux of 10.55 W/cm$^2$.

The pump was driven by a DC power supply allowing to modulate the head delivery to the loop. The input voltage was varied from 6 to 12 V in increments of 0.5 V to generate different flow rates in the loop. The order of the operating voltages was randomized to avoid any external effect of the gradual voltage change. The temperature of the cores was sampled every 2 s during a window of 240 s (fully loaded CPU) to ensure that steady state (SS) is achieved for each test. After each test, the experimental setup was allowed to cool down to maintain uniformity in the operating conditions. Three trials using the same voltage range were performed for every heat sink. The temperature data presented above is the average of the six cores and the three trials, unless indicated otherwise, and the pressure and volumetric flow data corresponds to the average between the three trials.

Results and Discussion

Steady State Analysis and Voltage-Flow Relationship

Achieving low operating temperatures under extreme load conditions is the objective of all cooling devices; thus, the CPU temperature is a fundamental metric to evaluate the thermal performance of the heat sinks. Due to the differences in the various designs, different performance is expected; hence, the prototypes will reach the SS condition at different times. FIG. 36A is a graph of faerage core temperature as function of time for all hybrid heat sinks using a plain copper plate operating at 12V and FIG. 36B is a graph of flow rate in the cooling loop as function of the pump operating voltage. The time required to achieve the SS condition was measured for each heat sink at different operating voltages (6V to 12V). FIG. 36A presents the time-dependent average core temperature for prototypes with a plain copper plate. FIG. 36A illustrates that it is possible to observe a large increment from idle temperatures (~26° C.) to 54° C. within 10 s after enabling the full load condition. After this sudden increase, the temperature starts to stabilize but small fluctuation can be noticed (see insert in FIG. 36A). To verify if the variations in the CPU temperatures are not associated with unsteadiness in the system, the derivative (dT/dt) was approximated using a 4$^{th}$ order of accuracy central difference expression. The time at which SS is reached was defined with the help of this numerical derivate. The SS condition was reached when the observed fluctuations in the derivative decreased to less than 5%, being the system with 32 jets and a plain copper plate the one with the longest time to reach SS conditions (approximately 74 s); thus, to ensure that SS conditions have been reached in all the tested prototypes, the measurements gathered between 80 s to 240 s are the ones reported in the following Sections.

Different flow rates are obtained at different operating voltages depending on the pressure losses in each cooling loop; thus, higher flow rates are observed for heat sinks with lower pressure drops, as the heat sink represents the major hydraulic resistance in the loop. An illustrative example of the volumetric flow rate as function of the operating voltage is presented in FIG. 36B; the volumetric flow rates at different voltages are within 7.89% difference (in the most critical case, 12V) among the hybrid heat sinks.

Hydraulic Performance of the Liquid-Cooled Heat Sinks

An efficient liquid-cooled heat sink dissipates the largest possible amount of waste heat with the lowest pumping power input; hence, one of the principal factors to evaluate the overall performance of the tested heat sinks is the pumping power. FIG. 37 shows the measurements of pressure drop as a function of flow rate for the four hybrid heat sinks with no features in the copper plate. The results for the 1in1out configuration are not included with the plain base plate due to the inoperability described above.

The results displayed in FIGS. 37 and 38 represent the averaged value of the measured pressure drop. Variations between 0.507% to 5.708% for each flow rate were observed, which is an indication the repeatability and reliability of the experimental data. It is observed that the measured pressure drop for all the heat sinks was quite similar for the range of flow rates, especially at low flow rates. A small increase in the pressure drop is observed with increasing number of jets for the higher flow rates; it can be noticed that the designs with 64 jets displayed the largest pressure drop, followed by the 32 jet, and finally the 16 jet design. It is noted that among the 64-jet designs, the reduction in the thickness of the flood chamber promoted an increase in the pressure drop of 2.61 kPa. Alternatively, the number of jet nozzles showed a smaller effect, as pressure drop differences of 0.21 kPa between the 64-jet and the 32-jet and 0.57 kPa between the 64-jet and the 16-jet designs were observed at the highest flow rate attainable for each heat sink. The pressure drop trends agreed with the simulation results from [122-123], where 64-jet configurations showed the largest pressure drop. These results are expected, as a bigger number of jets leads to more friction losses due to adding more and smaller channels to the inlet manifold. Although it is possible to observe an increment in the pressure drop, the detected differences are not greater than 10% in the most critical case (between 64 and 64v2); thus, it is possible to conclude that the sole effect of increasing the number of impinging jets does not drastically affect the hydraulic performance of the hybrid heat sinks.

The pin fins added to the copper plate have a beneficial cooling effect, but could also negatively impact the hydraulic performance of the heat sinks. To verify the effect of pin-fin structures on the impinging surface, the plain copper plate was replaced by plates with fins and the same measurements were performed. FIG. 38A depicts the pressure drop measurements for the four hybrid heat sinks and the 1in1out prototype at different flow rates for copper plates with circular pin fins. The inclusion of features on the impinging surface resulted in a slight increase of the pressure drop. Average increments of 0.266, 0.108, and 1.253 kPa where found between the circular-finned and plain surfaces for the 16-, 32-, and 64-jet designs, respectively. An interesting behavior can be noticed for the 64v2 configuration; unlike the observed for the 4 mm chamber 64-jet heat sink, the pressure drop decreased approximately 200 Pa in average if circular fins are added on the impinging surface. It was expected that the variations in the pressure drop were minimal for the hybrid heat sinks, as most of the pressure drop is generated by the small fractal channels in the manifolds as it is reported in [123]. Therefore, the pressure drop reduction for the 64v2 design can be related to the enlargement of the flood chamber volume by the finned surface, which decreased the flow constraints.

With the implementation of a pin-finned copper plate, the operation of the 1in1out design is possible. As shown in FIG. 38A, a remarkable difference was observed when this prototype was tested. First, higher flow rates can be achieved with this design and a difference of 7.6 kPa is observed between the 16-jet and the 1in1out heat sink at the maximum flow rate attained by the hybrid design. The lower pressure drop observed in the 1in1out configuration can be attributed to its simpler flow channels, which consist of large diameter inlet and outlet ducts. This design features the absence of major obstacles in the direction of flow, offering less resistance until the fluid reaches the flood chamber and the throttling section (see FIG. 34C), which is responsible for the major pressure losses within the system.

The pressure drop measurements as function of the flow rate for all the heat sinks with rectangular fins on the copper plate are illustrated in FIG. 38B. If the pressure drop measurements are compared for the hybrid configurations, no significant changes can be observed due to the change of the fins cross-sectional shape on the base plate. For the range of studied flow rates, the average pressure drop difference between featureless and square finned plates was negligible for all the hybrid heat sinks. These findings support the claim that most of the pressure drop can be attributed to the fractal channel manifolds in the hybrid heat sinks, as the geometry of features within the impinging surface did not display a major effect on the pressure drop.

Alternatively, the implementation of rectangular fins had a stronger impact on the hydraulic performance of the 1in1out design. A reduction of the attainable flow rates was observed, while the pressure drop increased by 1.667 kPa at the highest flow rate when switching from circular to rectangular fins. The throttling section presented in the 1in1out configuration forms mini-channels underneath the extruded area forcing the fluid to go around the fins on its way out; thus, the cross-sectional area of these mini-channels will be influenced by the shape of the fins. Having sharp corners in the mini-channels will promote larger pressure drops, while rounded corners will facilitate the flow of water, decreasing the pressure losses, and explains the reason to observe lower pressure drop with the circular pin-fins on the copper plate. Overall, the 1in1out design exhibited the lowest pressure drop in comparison with the hybrid heat sinks, while the 16-jet prototype had the best hydraulic performance amongst the hybrid designs.

Thermal Performance of the Liquid-Cooled Heat Sinks

Figure 39:
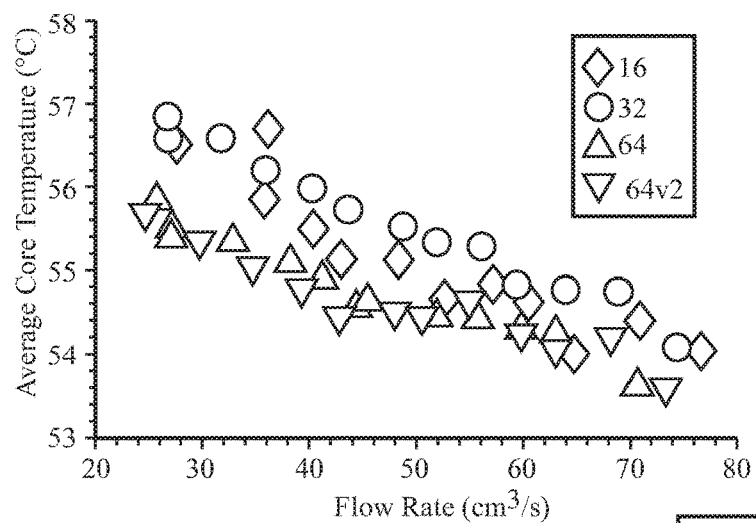
FIG. 39 is a graph of average core temperature as a function of flow rate for the hybrid heat sink designs with a plain copper plate.

The average core temperature attained using the different heat sinks was the main metric used to assess the thermal performance. FIG. 39 is a graph of average core temperature as a function of flow rate for the hybrid heat sink designs with a plain copper plate. FIG. 39 shows the average temperature, past the SS condition, of the cores as a function of flow rate for the different hybrid heat sinks with a plain copper plate. For the range of flow rates, the designs with 64 impinging jets had the lowest core temperatures, these results agree with the simulation results reported in Ref. [122, 123]. It is expected to have reduction in the core temperatures with an increase in the number of jets, as a larger number of jets reduces the distance between two consecutive jet nozzles, which in turn increases the narrow regions with high heat transfer coefficients adjacent to the impingement area. A negligible temperature change was observed when the 64- and 64v2-jet designs are compared, indicating the minimum effect of the flood chamber thickness.

Regarding to the effect of the number of jets in the hybrid heat sinks, it could be unexpected to see the 16-jet hybrid heat sink outperforming the 32-jet prototype; however, the simulation results reported in [122-123] explain that the observed anomaly is attributed to the distribution of the impinging jets over the heated surface. The hybrid heat sinks offer an approximated cooling area of 5×5 $cm^2$, where the jets are homogeneously distributed, whereas the heat flux is transferred majorly through a smaller area of approximately of 3×3 $cm^2$; hence, a large number of the jets impinging outside the heated surface decreases the effectivity of the cooling process for the 32-jet design. Furthermore, the hybrid heat sinks have a different effective jet impingement area, as the location of jet nozzles is constrained by the fractal design equations. Therefore, for the size of the chip used herein, an uneven distribution of jets on the cooled surface is observed, resulting in smaller effective heat transfer surfaces, which explains the low performance observed for the 32-jet design.

Figure 40A:
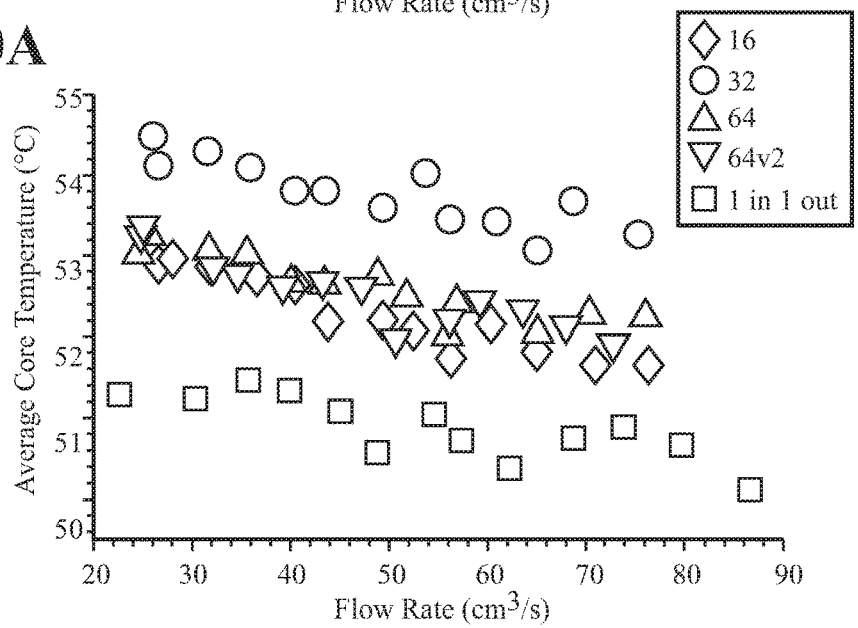
FIG. 40A is a graph of average core temperature as a function of the flow rate for heat sink designs with circular fins.
Figure 40B:
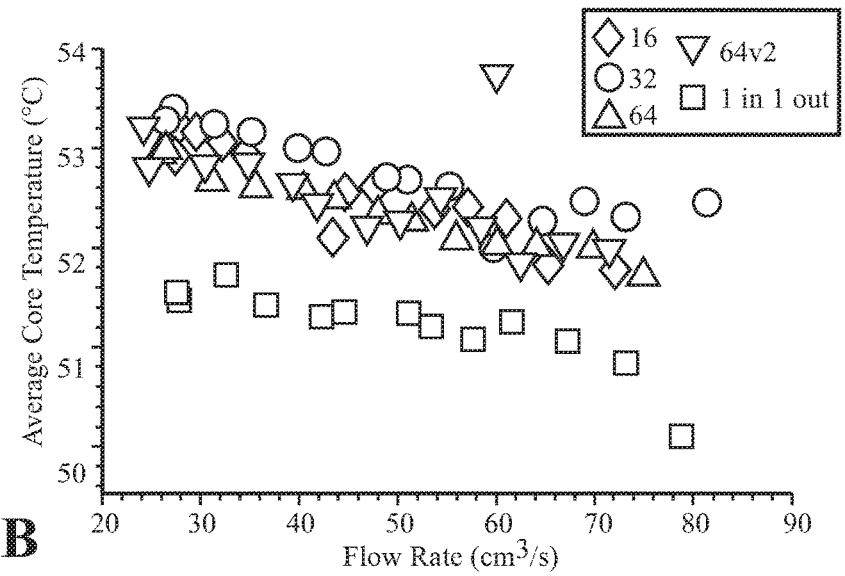
FIG. 40B is a graph of average core temperature as a function of the flow rate for heat sink designs with square fins on the copper plate.

FIGS. 40A-40B illustrates the results of the experiments conducted using circular and rectangular fins on the copper plate for all the prototypes. FIG. 40A is a graph of average core temperature as a function of the flow rate for heat sink designs with circular fins and FIG. 40B is a graph of average core temperature as a function of the flow rate for heat sink designs with square fins on the copper plate. A remarkable reduction in the average core temperature was observed with the implementation of area enhancement features on the copper plate in comparison with the plain plate. Differences of up to 3° C. were measured when the fin-featured plates were used, as predicted in [122-123]. The enhancement in thermal performance can be attributed to the area enhancement and mixing in the flood chamber caused by the features on the impinging surface. The 32-jet design had the worst thermal performance among all the studied heat sinks; however, the average core temperatures reached with this design are considerably reduced with rectangular fins observing an average temperature reduction of 2.83° C. with respect to the plain copper plate heat sink, this is depicted in FIGS. 40A-40B. It is noteworthy that a significant enhancement in the thermal performance can only be noticed for the 32-jet heat sink. The average core temperature for the 16- and 64-jet heat sinks was similar indistinctly of the shape of the fins on the impinging surface (below 2.5% difference in average).

As it was observed with the use of the plain copper plate, the depth of the flood chamber did not show any noticeable effect in the measured temperatures, affecting only the hydraulic performance of the heat sink; the coupled effects of the hydraulic and thermal performance will be further evaluated in the following Section. The implementation of the features in the base plate allows for the operation of the 1in1out prototype, as it has been discussed previously. This simple 1in1out design was able to outperform the fractal configurations, achieving average core temperatures 2° C. below the observed with the hybrid heat sinks for all flow rates with the circular finned base plate as depicted in FIG. 40A. A similar behavior can be observed with the implementation of rectangular fins, as it is shown in FIG. 40B, reaching similar values for the average core temperatures.

The low values of average core temperature observed for the 1in1out design can be attributed mainly to the coupled effect of different mechanisms that are favored with the current design. First, the smaller depth of the flood chamber featured in the 1in1out configuration forces the entering fluid to pass through the fins before the fluid is extracted. This effectively increases the heat transfer area and induces turbulence within the flow, which leads to higher heat transfer coefficients, whereas in the case of the hybrid heat sinks, it is not guaranteed that a flood chamber depth reduction will influence the flow through the surface features. Additionally, the water has a higher mean velocity as it strikes the finned plate compared to the fractal designs due to the lower resistance experienced by the flow. Even though the differences of the average core temperature reached with different heat sinks are small (~2° C.), an improvement of this magnitude is significant for the application of interest. Furthermore, the results presented in Ref. [123] indicated that the number of jets in the hybrid heat sinks plays a secondary role, while the characteristics of the impinging surface are critical for heat transfer. FIGS. 39 and 40 provide experimental support to the simulation findings in Ref. [123].

Thermal Resistance and Overall Performance Assessment

An estimation of the thermal resistance can be obtained from $$R = \frac{\overline{T}_s - T_{in}^f}{q} \quad (31)$$

where $\overline{T}_s$ is the average core temperature, $T_{in}^f$ is the temperature of the working fluid at the inlet, and q represent the thermal design power (95 W). It is clear that the estimation of R includes the resistance of the chip package; however, the package resistance can be considered as a constant that would just offset the thermal resistance of the heat sinks as a function of the flow rate.

In the cooling loop depicted in FIG. 35, the input power requirements are associated with the power required to overcome the pressure losses through the heat sink at a certain volumetric flow rate, thus, the pumping power ($\dot{W}_P$) can be defined as the product of pressure drop ($\Delta P$) and volumetric flow rate ($\dot{V}$) as $$\dot{W}_P = \dot{V} \Delta P \quad (32)$$

Figure 41A:
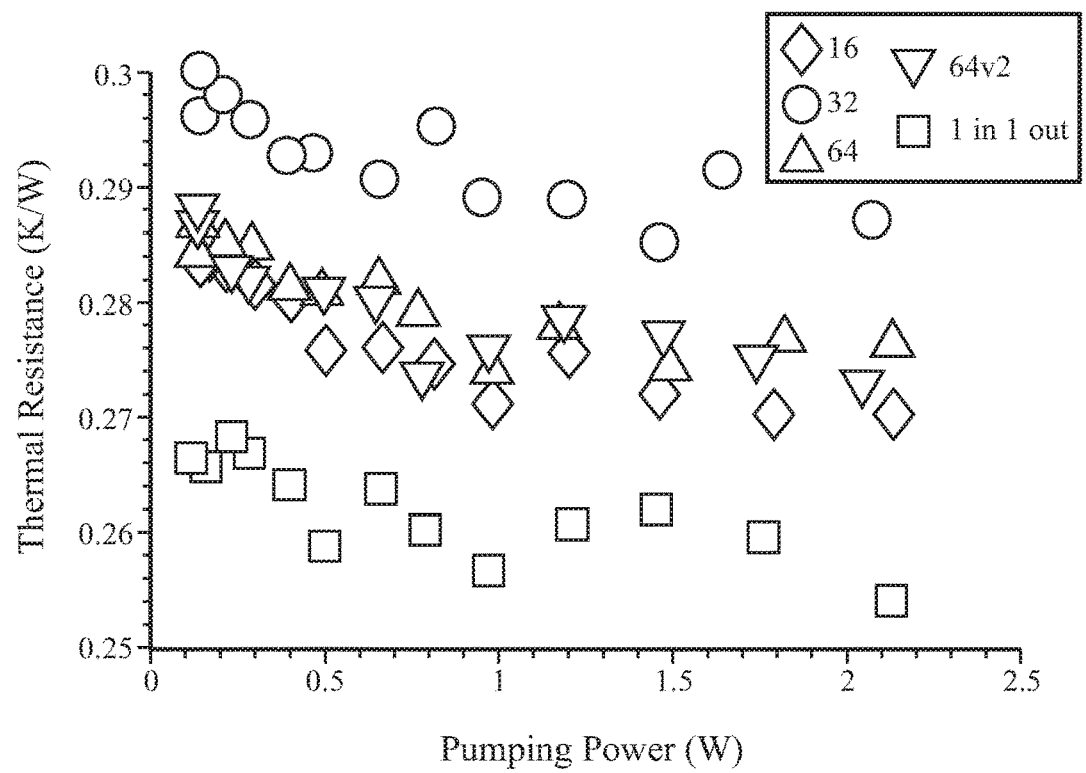
FIG. 41A is a graph of thermal resistance as a function of the pumping power.
Figure 41B:
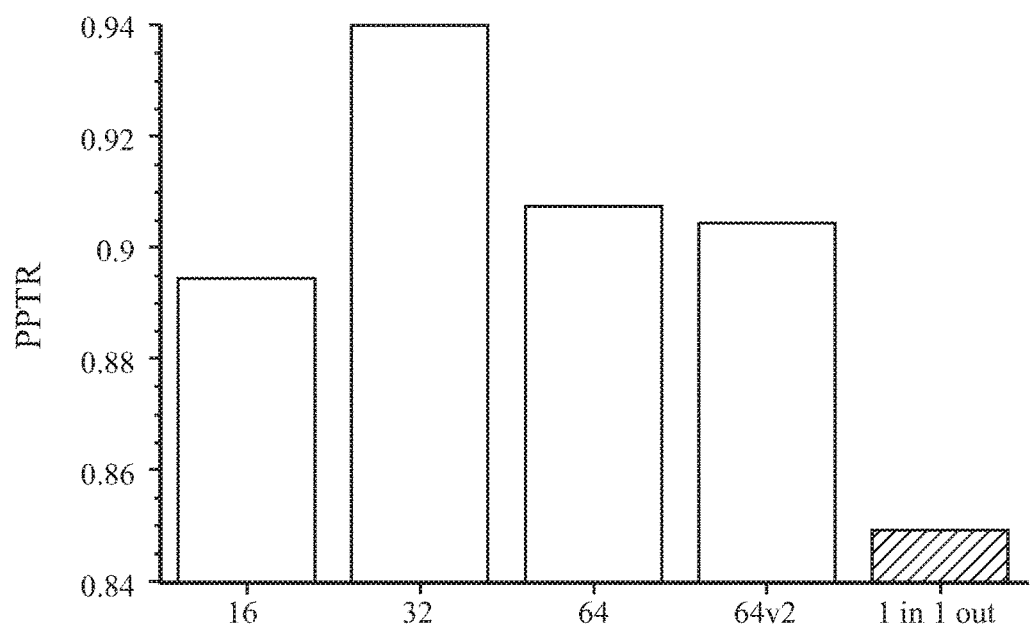
FIG. 41B is a graph of PPTR parameter for all the heat sinks with circular fins on the copper plate.

The evaluation of the estimated thermal resistance as function of the pumping power encompasses the characteristics of the hydraulic and thermal design and helps in the selection of the best cooling device from these two perspectives. FIG. 41A is a graph of thermal resistance as a function of the pumping power and FIG. 41B is a graph of PPTR parameter for all the heat sinks with circular fins on the copper plate. FIG. 41A illustrates the thermal resistance as a function of the pumping power for all the tested heat sinks with circular fins on the copper plate, this figure serves as an example as similar trends are observed for all copper plates. The design with 32 jets has the highest thermal resistance while the 16- and 64-jet designs displayed similar resistances at pumping powers below 0.5 W. The effects of the flood chamber depth in the 64-jet heat sinks showed to be negligible, as average differences no greater than 2.3% were observed. Although it could be expected to have a reduction in thermal resistance by increasing the number of jets, it is possible to observe that the 16-jet design has a lower thermal resistance than the 64-jet design, especially at higher pumping power conditions. This could be related to the effective impingement area as it was discussed in the previous Section and the slightly higher flow rates achieved by the 16-jet design in comparison with the 64-jet one due to its lower hydraulic resistance. If FIG. 40A and FIG. 41A are compared, a similar behavior is observed; however, the definition of the estimated thermal resistance helped to enlarge the differences and make more noticeable the advantages of the simplest hybrid heat sink design, the 16-jet prototype.

The comparison made in FIG. 41A encloses the thermo-hydraulic performance of the cooling devices over a range of operating conditions given by the pumping power. A comprehensive metric that not only encompasses the hydraulic and thermal performances, but also accounts for the variations of these parameters in one single-value metric was introduced as the PPTR [122], $$PPTR = \int R d\dot{W}_P \quad (33)$$

The PPTR is defined as the area under the curve in a thermal resistance versus pumping power diagram, as the one depicted in FIG. 41A. Since the PPTR comprehends both, thermal and hydraulic parameters, a modification in any of the two will affect the PPTR, where lower values of this metric imply a better overall performance in the cooling devices. The significance of this parameter cannot be emphasized more, as it offers a benchmark for the performance evaluation of any heat sink using a single numerical value.

FIG. 41B illustrates an example of the overall performance comparison of the tested liquid cooled heat sinks with circular fins on the copper plate using the PPTR, the values are normalized with respect to the largest PPTR (32-jet design with a plain copper plate), for visualization and comparison purposes. As it can be observed from FIG. 41B, the 1in1out design is confirmed as the best overall heat sink, this result is not surprising, but only confirms the accuracy of the PPTR utilization. Among the hybrid heat sinks, the 32-jet design evidently had the worst overall performance, which is supported by the core temperature measurements, the simulation results reported in [122-123], and the PPTR in FIG. 41B. The PPTR calculations in FIG. 41B resolve the comparison issues for the 16-jet and 64-jet hybrid heat sinks with similar performance over the entire range of pumping powers. The PPTR has a lower value for the 16-jet design, which confirms the simulation results from [123]. The PPTR allows to observe that the 64v2 prototype is slightly better than the 64-jet heat sink, a conclusion difficult to draw from the sole analysis of the average core temperatures or the estimated thermal resistance. The PPTR values for all the heat sinks are summarized in Table 7.

The PPTR values displayed in FIG. 41B and Table 7 are normalized by the worst performing heat sink, the 32-jet design with a plain copper plate. From the values presented in Table 7, it can be identified that using a plain copper plate led to the worst performance, independently of the implemented heat sink. A large reduction of the PPTR was observed when the plain plate is replaced by a surface enhanced plate. The shape of the features seemed to drastically affect only the 32-jet heat sink, as for the other heat sinks, slight variations of the PPTR are observed when circular or rectangular fins are used, which agrees with the observations of the average core temperatures. Lastly, the best heat sink among the tested cooling devices was the 1in1out with circular fins on the copper plate with a normalized PPTR value 15% smaller than the worst configuration, while the best hybrid heat sink was the 16-jet design with circular fins on the copper plate, having a PPTR approximately 11% smaller than the worst design.

FIG. 42A is a schematic of a water block assembled with a copper plate and a X-clamp, and FIG. 42B is an exploded schematic of water block shown in FIG. 42A. The X-clamp facilitates mounting the water block onto an electronic component for heat exchange. The water block is detachably connected to the heat exchange plate and/or the electronic component, and therefore, the water may be used disconnected and used for other electronic components.

TABLE 7

Normalized PPTR values for the investigated heat sinks.

| Heat sink design | Plain plate | Circular fins plate | Rectangular fins plate |
|---|---|---|---|
| 16 | 0.987 | 0.894 | 0.901 |
| 32 | 1.000 | 0.947 | 0.911 |
| 64 | 0.973 | 0.907 | 0.898 |
| 64v2 | 0.973 | 0.904 | 0.900 |
| 1inlet 1outlet | — | 0.849 | 0.86 |

Conclusions of Experimental Investigation of the Cooling Performance of 3-D Printed Hybrid Water-Cooled Heat Sinks An experimental investigation of the thermal and hydraulic performance of hybrid water-cooled heat sinks was performed. The heat sinks were composed of a cooper plate and 3-D printed shells containing flow manifolds; four hybrid designs with 16, 32, and 64 jets were 3-D printed using LFS. The effects of the number of jets, flood chamber depth, and the inclusion of area enhancement features on the copper plate were experimentally assessed. Measurements of the volumetric flow rate and the pressure drop in the liquid-cooled heat sinks were used to evaluate the hydraulic performance, while the temperature sensed from a state-of-the-art Intel Core i5 processor was used to evaluate the thermal performance. The complexity in the evaluation of the overall performance and the selection of the best liquid cooling device was carried out by the analysis of the estimated thermal resistance and the inclusion of the PPTR parameter, which allowed to easily rank the best preforming heat sinks with a single number.

It was observed that an increment in the number of jets led to larger pressure drops and a similar trend was observed for the reduction of the flood chamber thickness. The configuration with 16 jets had the best hydraulic performance among the hybrid configurations, while the 1in1out design displayed the lowest pressure drop overall. The inclusion of pin fins on the impinging surface yielded a negligible effect on the pressure losses, indicating that for the hybrid heat sinks, the major pressure loses are within the fractal inlet and outlet manifolds. In terms of the average core temperatures, the addition of fins on the impinging surface drastically decreased the operating temperatures, while the number of jets in the hybrid configurations played a secondary role. The evaluation of the estimated thermal resistance and required pumping power helped to have a better insight of the systems performance. The PPTR helped to better inform on the overall performance of the heat sinks, especially among the hybrid designs were overlapping data obscured the ranking process. This investigation is the culmination of a series of publications focused on designing, analyzing, and optimizing these novel hybrid heat sinks. The theoretical and simulations efforts were reported in [122-123], while the manufacturing and testing efforts are reported herein.

Any patents or publications mentioned in this specification are incorporated herein by reference to the same extent as if each individual publication is specifically and individually indicated to be incorporated by reference.

It will be apparent to those skilled in the art that various modifications and variations can be made in the present invention without departing from the spirit or scope of the inventions. Thus, it is intended that the present invention covers the modifications and variations of this invention. The present invention has been described with reference to some embodiments. However, it is realized that variants and equivalents to the preferred embodiments may be provided without departing from the scope of the invention as defined in the accompanying claims. It is to be understood that the detailed description of the present invention are exemplary and explanatory and are intended to provide further explanation of the invention. It is not intended to be exhaustive or to limit embodiments to the precise form disclosed.

REFERENCES

1. Joshi, Y., *Reduced Order Thermal Models of Multiscale Microsystems*. Journal of Heat Transfer, 2012. 134(3): p. 031008-031008-11.

2. Pop, E., *Energy dissipation and transport in nanoscale devices.* Nano Research, 2010. 3(3): p. 147-169.
3. Keyes, R. W., *Physical limits in digital electronics.* Proceedings of the IEEE, 1975. 63(5): p. 740-767.
4. Tuckerman, D. B. and R. F. W. Pease, *High-performance heat sinking for VLSI.* IEEE Electron Device Letters, 1981. 2(5): p. 126-129.
5. Ramos-Alvarado, B., et al., *CFD study of liquid-cooled heat sinks with microchannel flow field configurations for electronics, fuel cells, and concentrated solar cells.* Applied Thermal Engineering, 2011. 31(14): p. 2494-2507.
6. Mohammed Adham, A., N. Mohd-Ghazali, and R. Ahmad, *Thermal and hydrodynamic analysis of microchannel heat sinks: A review.* Renewable and Sustainable Energy Reviews, 2013. 21(Supplement C): p. 614-622.
7. Dixit, T. and I. Ghosh, *Review of micro- and minichannel heat sinks and heat exchangers for single phase fluids.* Renewable and Sustainable Energy Reviews, 2015. 41(Supplement C): p. 1298-1311.
8. Jae-Young, C., et al. *A System Design of Liquid Cooling Computer Based on the Micro Cooling Technology.* in *Thermal and Thermomechanical Proceedings 10th Intersociety Conference on Phenomena in Electronics Systems,* 2006. ITHERM 2006. 2006.
9. Kang, S., D. Miller, and J. Cennamo, *Closed Loop Liquid Cooling for High Performance Computer Systems.* 2007(42789): p. 509-515.
10. Yang, D., et al., *Numerical and experimental analysis of cooling performance of single-phase array microchannel heat sinks with different pin-fin configurations.* Applied Thermal Engineering, 2017. 112(Supplement C): p. 1547-1556.
11. Xu, F., Z. Pan, and H. Wu, *Experimental investigation on the flow transition in different pin-fin arranged microchannels.* Microfluidics and Nanofluidics, 2017. 22(1): p. 11.
12. Xie, X. L., et al., *Numerical study of laminar heat transfer and pressure drop characteristics in a water-cooled minichannel heat sink.* Applied Thermal Engineering, 2009. 29(1): p. 64-74.
13. Luo, X. and S. Liu, *A Microjet Array Cooling System for Thermal Management of High-Brightness LEDs.* IEEE Transactions on Advanced Packaging, 2007. 30(3): p. 475-484.
14. Liu, S., et al., *Structural optimization of a microjet based cooling system for high power LEDs.* International Journal of Thermal Sciences, 2008. 47(8): p. 1086-1095.
15. Husain, A., et al., *Thermal Performance Analysis and Optimization of Microjet Cooling of High Power Light-Emitting Diodes.* Journal of Thermophysics and Heat Transfer, 2013. 27(2): p. 235-245.
16. Muszynski, T. and D. Mikielewicz, *Structural optimization of microjet array cooling system.* Applied Thermal Engineering, 2017. 123(Supplement C): p. 103-110.
17. Brunschwiler, T., et al. *Direct Liquid Jet-Impingement Cooling With Micron-Sized Nozzle Array and Distributed Return Architecture.* in *Thermal and Thermomechanical Proceedings 10th Intersociety Conference on Phenomena in Electronics Systems,* 2006. ITHERM 2006. 2006.
18. Rattner, A. S., *General Characterization of Jet Impingement Array Heat Sinks With Interspersed Fluid Extraction Ports for Uniform High-Flux Cooling.* Journal of Heat Transfer, 2017. 139(8): p. 082201-082201-11.
19. Husain, A., et al., *Thermal performance analysis of a hybrid micro-channel, -pillar and -jet impingement heat sink.* Applied Thermal Engineering, 2016. 102 (Supplement C): p. 989-1000.
20. Ghani, I. A., et al., *Heat transfer enhancement in microchannel heat sink using hybrid technique of ribs and secondary channels.* International Journal of Heat and Mass Transfer, 2017. 114(Supplement C): p. 640-655.
21. Robinson, A. J., et al. *A new hybrid heat sink with impinging micro jet arrays and microchannels fabricated using high volume additive manufacturing.* in *2017 33rd Thermal Measurement, Modeling & Management Symposium (SEMI-THERM).* 2017.
22. Zhang, Y., S. Wang, and P. Ding, *Effects of channel shape on the cooling performance of hybrid microchannel and slot-jet module.* International Journal of Heat and Mass Transfer, 2017. 113: p. 295-309.
23. Zhang, Y., et al., *Effect of slot-jet position on the cooling performance of the hybrid trapezoid channel and impingement module.* International Journal of Heat and Mass Transfer, 2018. 118(Supplement C): p. 1205-1217.
24. Fan, Z., et al., *Experimental investigation of the flow distribution of a 2-dimensional constructal distributor.* Experimental Thermal and Fluid Science, 2008. 33(1): p. 77-83.
25. Ramos-Alvarado, B., et al., *Constructal flow distributor as a bipolar plate for proton exchange membrane fuel cells.* International Journal of Hydrogen Energy, 2011. 36(20): p. 12965-12976.
26. Ramos-Alvarado, B., B. Feng, and G. P. Peterson, *Comparison and optimization of single-phase liquid cooling devices for the heat dissipation of high-power LED arrays.* Applied Thermal Engineering, 2013. 59(1): p. 648-659.
27. Luo, L., et al., *Experimental study of constructal distributor for flow equidistribution in a mini crossflow heat exchanger (MCHE).* Chemical Engineering and Processing: Process Intensification, 2008. 47(2): p. 229-236.
28. Murray, C. D., *THE PHYSIOLOGICAL PRINCIPLE OF MINIMUM WORK APPLIED TO THE ANGLE OF BRANCHING OF ARTERIES.* The Journal of General Physiology, 1926. 9(6): p. 835.
29. Murray, C. D., *The Physiological Principle of Minimum Work.* Proceedings of the National Academy of Sciences, 1926. 12(3): p. 207.
30. Anderson, K. B., et al., *A 3D Printed Fluidic Device that Enables Integrated Features.* Analytical Chemistry, 2013. 85(12): p. 5622-5626.
31. Kitson, P. J., et al., *Configurable 3D-Printed millifluidic and microfluidic 'lab on a chip' reactionware devices.* Lab on a Chip, 2012. 12(18): p. 3267-3271.
32. Lee, M. P., et al., *Development of a 3D printer using scanning projection stereolithography.* Scientific Reports, 2015. 5: p. 9875.
33. Wang, X., et al., *3D printing of polymer matrix composites: A review and prospective.* Composites Part B: Engineering, 2017. 110: p. 442-458.
34. Ingram, D. M., D. M. Causon, and C. G. Mingham, *Developments in Cartesian cut cell methods.* Mathematics and Computers in Simulation, 2003. 61(3): p. 561-572.

35. Garimella, R. V., J. Kim, and M. Berndt. *Polyhedral Mesh Generation and Optimization for Non-manifold Domains*. in *Proceedings of the 22nd International Meshing Roundtable*. 2014. Cham: Springer International Publishing.

[36] Keyes, R. W., *Physical limits in digital electronics*. Proceedings of the IEEE, 1975. 63(5): p. 740-767.

[37] Moore, A. L. and L. Shi, *Emerging challenges and materials for thermal management of electronics*. Materials Today, 2014. 17(4): p. 163-174.

[38] Hamann, H. F., A. Weger, J. A. Lacey, Z. Hu, P. Bose, E. Cohen, and J. Wakil, *Hotspot-Limited Microprocessors: Direct Temperature and Power Distribution Measurements*. IEEE Journal of Solid-State Circuits, 2007. 42(1): p. 56-65.

[39] Mahajan, R., C. Chia-pin, and G. Chrysler, *Cooling a Microprocessor Chip*. Proceedings of the IEEE, 2006. 94(8): p. 1476-1486.

[40] Tuckerman, D. B. and R. F. W. Pease, *High-performance heat sinking for VLSI*. IEEE Electron Device Letters, 1981. 2(5): p. 126-129.

[41] Mudawar, I., *Assessment of high-heat-flux thermal management schemes*. IEEE Transactions on Components and Packaging Technologies, 2001. 24(2): p. 122-141.

[42] Kim, S. J. and D. Kim, *Forced Convection in Microstructures for Electronic Equipment Cooling*. Journal of Heat Transfer, 1999. 121(3): p. 639-645.

[43] Fedorov, A. G. and R. Viskanta, *Three-dimensional conjugate heat transfer in the microchannel heat sink for electronic packaging*. International Journal of Heat and Mass Transfer, 2000. 43(3): p. 399-415.

[44] Qu, W. and I. Mudawar, *Experimental and numerical study of pressure drop and heat transfer in a single-phase micro-channel heat sink*. International Journal of Heat and Mass Transfer, 2002. 45(12): p. 2549-2565.

[45] Lee, P.-S., S. V. Garimella, and D. Liu, *Investigation of heat transfer in rectangular microchannels*. International Journal of Heat and Mass Transfer, 2005. 48(9): p. 1688-1704.

[46] Kandlikar, S. G. and A. V. Bapat, *Evaluation of Jet Impingement, Spray and Microchannel Chip Cooling Options for High Heat Flux Removal*. Heat Transfer Engineering, 2007. 28(11): p. 911-923.

[47] Jiji, L. M., *Experiment Investigation of Single Phase Multi-jet Impingement Cooling of an Array of Microelectronic Heat Sources*. Cooling Technology for Electronic Equipment, 1988.

[48] Wadsworth, D. C. and I. Mudawar, *Cooling of a Multichip Electronic Module by Means of Confined Two-Dimensional Jets of Dielectric Liquid*. Journal of Heat Transfer, 1990. 112(4): p. 891-898.

[49] Estes, K. A. and I. Mudawar, *Comparison of Two-Phase Electronic Cooling Using Free Jets and Sprays*. Journal of Electronic Packaging, 1995. 117(4): p. 323-332.

[50] Park, T. H., H. G. Choi, J. Y. Yoo, and S. J. Kim, *Streamline upwind numerical simulation of two-dimensional confined impinging slot jets*. International Journal of Heat and Mass Transfer, 2003. 46(2): p. 251-262.

[51] Sung, M. K. and I. Mudawar, *Single-phase hybrid micro-channel/micro-jet impingement cooling*. International Journal of Heat and Mass Transfer, 2008. 51(17): p. 4342-4352.

[52] Husain, A., M. Ariz, N. Z. H. Al-Rawahi, and M. Z. Ansari, *Thermal performance analysis of a hybrid micro-channel, -pillar and -jet impingement heat sink*. Applied Thermal Engineering, 2016. 102(Supplement C): p. 989-1000.

[53] Robinson, A. J., W. Tan, R. Kempers, J. Colenbrander, N. Bushnell, and R. Chen. *A new hybrid heat sink with impinging micro-jet arrays and micro-channels fabricated using high volume additive manufacturing*. in *2017 33rd Thermal Measurement, Modeling & Management Symposium (SEMI-THERM)*. 2017.

[54] Zhang, Y., S. Wang, K. Chen, and P. Ding, *Effect of slot-jet position on the cooling performance of the hybrid trapezoid channel and impingement module*. International Journal of Heat and Mass Transfer, 2018. 118(Supplement C): p. 1205-1217.

[55] Bejan, A. and S. Lorente, *Design With Constructal Theory*. Vol. 22. 2006.

[56] Fan, Z., X. Zhou, L. Luo, and W. Yuan, *Experimental investigation of the flow distribution of a 2-dimensional constructal distributor*. Experimental Thermal and Fluid Science, 2008. 33(1): p. 77-83.

[57] Ramos-Alvarado, B., A. Hernandez-Guerrero, F. Elizalde-Blancas, and M. W. Ellis, *Constructal flow distributor as a bipolar plate for proton exchange membrane fuel cells*. International Journal of Hydrogen Energy, 2011. 36(20): p. 12965-12976.

[58] Luo, L., Z. Fan, H. Le Gall, X. Zhou, and W. Yuan, *Experimental study of constructal distributor for flow equidistribution in a mini crossflow heat exchanger (MCHE)*. Chemical Engineering and Processing: Process Intensification, 2008. 47(2): p. 229-236.

[59] Fan, Y., R. Boichot, T. Goldin, and L. Luo, *Flow distribution property of the constructal distributor and heat transfer intensification in a mini heat exchanger*. 2008. 54(11): p. 2796-2808.

[60] Rattner, A. S., *General Characterization of Jet Impingement Array Heat Sinks With Interspersed Fluid Extraction Ports for Uniform High-Flux Cooling*. Journal of Heat Transfer, 2017. 139(8): p. 082201-082201-11.

[61] Huber, A. M. and R. Viskanta, *Effect of jet-jet spacing on convective heat transfer to confined, impinging arrays of axisymmetric air jets*. International Journal of Heat and Mass Transfer, 1994. 37(18): p. 2859-2869.

[62] Xing, Y. and B. Weigand, *Experimental investigation of impingement heat transfer on a flat and dimpled plate with different crossflow schemes*. International Journal of Heat and Mass Transfer, 2010. 53(19): p. 3874-3886.

[63] Naphon, P. and S. Wiriyasart, *Liquid cooling in the mini-rectangular fin heat sink with and without thermoelectric for CPU*. International Communications in Heat and Mass Transfer, 2009. 36(2): p. 166-171.

[64] Jajja, S. A., W. Ali, H. M. Ali, and A. M. Ali, *Water cooled minichannel heat sinks for microprocessor cooling: Effect of fin spacing*. Applied Thermal Engineering, 2014. 64(1): p. 76-82.

[65] Saeed, M. and M.-H. Kim, *Numerical study on thermal hydraulic performance of water cooled mini-channel heat sinks*. International Journal of Refrigeration, 2016. 69: p. 147-164.

[66] Bejan, A., *Entropy Generation Minimization*. 1st Edition ed. 1995, Boca Raton: CRC Press.

[67] Bejan, A., *Entropy generation minimization: The new thermodynamics of finite-size devices and finite-time processes*. Journal of Applied Physics, 1996. 79(3): p. 1191-1218.

[68] Bahiraei, M., S. Heshmatian, and M. Keshavarzi, *A decision-making based method to optimize energy efficiency of ecofriendly nanofluid flow inside a new heat sink enhanced with flow distributor.* Powder Technology, 2019. 342: p. 85-98.

[69] Sharma, C. S., M. K. Tiwari, B. Michel, and D. Poulikakos, *Thermofluidics and energetics of a manifold microchannel heat sink for electronics with recovered hot water as working fluid.* International Journal of Heat and Mass Transfer, 2013. 58(1): p. 135-151.

[70] Ramos-Alvarado, B., A. Hernandez-Guerrero, and V. Rangel, *Irreversibilities reduction of a flow distribution system by means of the EGM methodology.* Vol. 10. 2012. 94-109.

[71] Paniagua-Guerra, L. E., S. Sehgal, C. U. Gonzalez-Valle, and B. Ramos-Alvarado, *Fractal channel manifolds for microjet liquid-cooled heat sinks.* International Journal of Heat and Mass Transfer, 2019. 138: p. 257-266.

[72] Wang, X., M. Jiang, Z. Zhou, J. Gou, and D. Hui, *3D printing of polymer matrix composites: A review and prospective.* Composites Part B: Engineering, 2017. 110: p. 442-458.

[73] Vaezi, M., H. Seitz, and S. Yang, *A review on 3D micro-additive manufacturing technologies.* The International Journal of Advanced Manufacturing Technology, 2013. 67(5): p. 1721-1754.

[74] He, M., Y. Zhao, B. Wang, Q. Xi, J. Zhou, and Z. Liang, *3D Printing Fabrication of Amorphous Thermoelectric Materials with Ultralow Thermal Conductivity.* Small, 2015. 11(44): p. 5889-5894.

[75] Steinke, M. E. and S. G. Kandlikar, *Single-Phase Liquid Friction Factors in Microchannels.* 2005 (41855a): p. 291-302.

[76] Mikkelson, E. C., *Characterization and Modeling of the Thermal Properties of Photopolymers for Material Jetting Processes*, in *Mechanical Engineering.* 2014, Virginia Polytechnic Institute and State University: Blacksburg, Virginia

[77] Garimella, R. V., J. Kim, and M. Berndt. *Polyhedral Mesh Generation and Optimization for Non-manifold Domains.* in *Proceedings of the 22nd International Meshing Roundtable.* 2014. Cham: Springer International Publishing.

[78] Mahian, O., A. Kianifar, C. Kleinstreuer, M. d. A. Al-Nimr, I. Pop, A. Z. Sahin, and S. Wongwises, *A review of entropy generation in nanofluid flow.* International Journal of Heat and Mass Transfer, 2013. 65: p. 514-532.

[79] S. M. Sohel Murshed, C. A. Nieto de Castro, A critical review of traditional and emerging techniques and fluids for electronics cooling, Renewable and Sustainable Energy Reviews, 78 (2017) 821-833.

[80] A. L. Moore, L. Shi, Emerging challenges and materials for thermal management of electronics, Materials Today, 17(4) (2014) 163-174.

[81] H. F. Hamann, A. Weger, J. A. Lacey, Z. Hu, P. Bose, E. Cohen, J. Wakil, Hotspot-limited microprocessors: direct temperature and power distribution measurements, IEEE Journal of Solid-State Circuits, 42(1) (2007) 56-65.

[82] E. M. Dede, S. N. Joshi, F. Zhou, Topology optimization, additive layer manufacturing, and experimental testing of an air-cooled heat sink, Journal of Mechanical Design, 137(11) (2015) 111403.

[83] C.-W. Han, S.-B. Jeong, Evaluation of the thermal performance with different fin shapes of the air-cooled heat sink for power electronic applications, Journal of International Council on Electrical Engineering, 6(1) (2016) 17-25.

[84] Z. Khattak, H. M. Ali, Air cooled heat sink geometries subjected to forced flow: A critical review, International Journal of Heat and Mass Transfer, 130 (2019) 141-161.

[85] R. Mahajan, C. Chia-pin, G. Chrysler, Cooling a microprocessor chip, Proceedings of the IEEE, 94(8) (2006) 1476-1486.

[86] M. K. Sung, I. Mudawar, Single-Phase and two-phase hybrid cooling schemes for high-heat-flux thermal management of defense electronics, Journal of Electronic Packaging, 131(2) (2009) 121-131.

[87] S. Balci, A CFD simulation of the liquid-cooled pipe conductors for the high power and high frequency power electronic circuits, Measurement, (2019) 106885.

[88] D. B. Tuckerman, R. F. W. Pease, High-performance heat sinking for VLSI, IEEE Electron Device Letters, 2(5) (1981) 126-129.

[89] M. Moura, E. Teodori, A. S. Moita, A. L. N. Moreira, 2-Phase microprocessor cooling system with controlled pool boiling of dielectrics over micro- and nano-structured integrated heat spreaders, 15th IEEE Intersociety Conference on Thermal and Thermomechanical Phenomena in Electronic Systems (ITherm), (2016) 378-387.

[90] W.-L. Cheng, W.-W. Zhang, H. Chen, L. Hu, Spray cooling and flash evaporation cooling: The current development and application, Renewable and Sustainable Energy Reviews, 55 (2016) 614-628.

[91] I. Mudawar, Assessment of high-heat-flux thermal management schemes, IEEE Transactions on Components and Packaging Technologies, 24(2) (2001) 122-141.

[92] S. G. Kandlikar, W. J. Grande, Evolution of microchannel flow passages—thermohydraulic performance and fabrication technology, Heat Transfer Engineering, 24(1) (2003) 3-17.

[93] S. G. Kandlikar, A. V. Bapat, Evaluation of jet impingement, spray and microchannel chip cooling options for high heat flux removal, Heat Transfer Engineering, 28(11) (2007) 911-923.

[94] W. Qu, I. Mudawar, Experimental and numerical study of pressure drop and heat transfer in a single-phase micro-channel heat sink, International Journal of Heat and Mass Transfer, 45(12) (2002) 2549-2565.

[95] S. J. Kim, D. Kim, Forced convection in microstructures for electronic equipment cooling, Journal of Heat Transfer, 121(3) (1999) 639-645.

[96] P.-S. Lee, S. V. Garimella, D. Liu, Investigation of heat transfer in rectangular microchannels, International Journal of Heat and Mass Transfer, 48(9) (2005) 1688-1704.

[97] A. G. Fedorov, R. Viskanta, Three-dimensional conjugate heat transfer in the microchannel heat sink for electronic packaging, International Journal of Heat and Mass Transfer, 43(3) (2000) 399-415.

[98] A. Mohammed Adham, N. Mohd-Ghazali, R. Ahmad, Thermal and hydrodynamic analysis of microchannel heat sinks: A review, Renewable and Sustainable Energy Reviews, 21 (2013) 614-622.

[99] M. R. Hajmohammadi, P. Alipour, H. Parsa, Microfluidic effects on the heat transfer enhancement and optimal design of microchannels heat sinks, International Journal of Heat and Mass Transfer, 126 (2018) 808-815.

[100] D. Jing, S. Song, Y. Pan, X. Wang, Size dependences of hydraulic resistance and heat transfer of fluid flow in elliptical microchannel heat sinks with boundary slip, International Journal of Heat and Mass Transfer, 119 (2018) 647-653.

[101] S. V. Garimella, V. Singhal, Single-phase flow and heat transport and pumping considerations in microchannel heat sinks, Heat Transfer Engineering, 25(1) (2004) 15-25.

[102] M.-Y. Wen, K.-J. Jang, An impingement cooling on a flat surface by using circular jet with longitudinal swirling strips, International Journal of Heat and Mass Transfer, 46(24) (2003) 4657-4667.

[103] J. S. Bintoro, A. Akbarzadeh, M. Mochizuki, T. Nguyen, A closed loop impinging jet cooling for computer chip, (37149) (2003) 349-355.

[104] E. N. Wang, Z. Lian, J. Linan, K. Jae-Mo, J. G. Maveety, E. A. Sanchez, K. E. Goodson, T. W. Kenny, Micromachined jets for liquid impingement cooling of VLSI chips, Journal of Microelectromechanical Systems, 13(5) (2004) 833-842.

[105] S. Wiriyasart, P. Naphon, Liquid impingement cooling of cold plate heat sink with different fin configurations: High heat flux applications, International Journal of Heat and Mass Transfer, 140 (2019) 281-292.

[106] C. H. Oh, J. H. Lienhard V, H. F. Younis, R. S. Dahbura, D. Michels, Liquid jet-array cooling modules for high heat fluxes, AIChE Journal, 44(4) (1998) 769-779.

[107] G. Natarajan, R. J. Bezama, Microjet cooler with distributed returns, Heat Transfer Engineering, 28(8-9) (2007) 779-787.

[108] A. S. Rattner, General characterization of jet impingement array heat sinks with interspersed fluid extraction ports for uniform high-flux cooling, Journal of Heat Transfer, 139(8) (2017) 082201.

[109] B. Ramos-Alvarado, B. Feng, G. P. Peterson, Comparison and optimization of single-phase liquid cooling devices for the heat dissipation of high-power LED arrays, Applied Thermal Engineering, 59(1) (2013) 648-659.

[110] J. Barrau, M. Omri, D. Chemisana, J. Rosell, M. Ibañez, L. Tadrist, Numerical study of a hybrid jet impingement/micro-channel cooling scheme, Applied Thermal Engineering, 33-34 (2012) 237-245.

[111] C.-B. Kim, C. Leng, X.-D. Wang, T.-H. Wang, W.-M. Yan, Effects of slot-jet length on the cooling performance of hybrid microchannel/slot-jet module, International Journal of Heat and Mass Transfer, 89 (2015) 838-845.

[112] S. H. Kim, H.-C. Shin, S.-M. Kim, Numerical study on cooling performance of hybrid micro-channel/micro-jet-impingement heat sink, Journal of Mechanical Science and Technology, 33(7) (2019) 3555-3562.

[113] M. K. Sung, I. Mudawar, Experimental and numerical investigation of single-phase heat transfer using a hybrid jet-impingement/micro-channel cooling scheme, International Journal of Heat and Mass Transfer, 49(3) (2006) 682-694.

[114] M. K. Sung, I. Mudawar, Effects of jet pattern on single-phase cooling performance of hybrid micro-channel/micro-circular-jet-impingement thermal management scheme, International Journal of Heat and Mass Transfer, 51(19) (2008) 4614-4627.

[115] A. J. Robinson, E. Schnitzler, An experimental investigation of free and submerged miniature liquid jet array impingement heat transfer, Experimental Thermal and Fluid Science, 32(1) (2007) 1-13.

[116] A. J. Robinson, R. Kempers, J. Colenbrander, N. Bushnell, R. Chen, A single phase hybrid micro heat sink using impinging micro-jet arrays and microchannels, Applied Thermal Engineering, 136 (2018) 408-418.

[117] A. J. Robinson, W. Tan, R. Kempers, J. Colenbrander, N. Bushnell, R. Chen, A new hybrid heat sink with impinging micro-jet arrays and microchannels fabricated using high-volume additive manufacturing, 2017 33rd Thermal Measurement, Modeling & Management Symposium (SEMI-THERM), (2017) 179-186.

[118] Y. Han, G. Tang, B. L. Lau, X. Zhang, Hybrid micro-fluid heat sink for high power dissipation of liquid-cooled data centre, 2017 IEEE 19th Electronics Packaging Technology Conference (EPTC), (2017) 1-4.

[119] Y. Zhang, S. Wang, K. Chen, P. Ding, Effect of slot-jet position on the cooling performance of the hybrid trapezoid channel and impingement module, International Journal of Heat and Mass Transfer, 118 (2018) 1205-1217.

[120] Y. Zhang, S. Wang, P. Ding, Effects of channel shape on the cooling performance of hybrid micro-channel and slot-jet module, International Journal of Heat and Mass Transfer, 113 (2017) 295-309.

[121] F. P. W. Melchels, J. Feijen, D. W. Grijpma, A review on stereolithography and its applications in biomedical engineering, Biomaterials, 31(24) (2010) 6121-6130.

[122] L. E. Paniagua-Guerra, S. Sehgal, C. U. Gonzalez-Valle, B. Ramos-Alvarado, Fractal channel manifolds for microjet liquid-cooled heat sinks, International Journal of Heat and Mass Transfer, 138 (2019) 257-266.

[123] L. E. Paniagua-Guerra, B. Ramos-Alvarado, Efficient hybrid microjet liquid cooled heat sinks made of photopolymer resin: thermo-uid characteristics and entropy generation analysis, International Journal of Heat and Mass Transfer, Just Accepted (2019).

APPENDIX A. SUPPLEMENTARY MATERIAL

Supplementary data to this disclosure can be found online at http://dio.org/10.1016/j.ijheatmasstransfer.2019.11884.

The invention claimed is:
1. A hybrid microjet liquid-cooled heat spreader/sink, comprising:
a main manifold comprising an inlet manifold and an outlet manifold;
the inlet manifold comprising an inlet duct at one end and an array of microjets at an opposing end, the array of microjets disposed generally in a jet-plane, the inlet duct being bifurcated into a plurality of multi-level flow channels, the multi-level flow channels disposed between and connecting the inlet duct to the array of microjets, the multi-level flow channels each having a fractal distribution and a bifurcated branched pattern, the multi-level flow channels each adapted for uniform flow distribution of a fluid on each level of bifurcation, wherein the inlet manifold is adapted for delivering the fluid from the inlet duct to the array of microjets via the multi-level flow channels;

a heat exchange plate parallelly disposed at a distance from the jet-plane of the array of microjets, the heat exchange plate having a first surface and a second surface, the first surface comprising an array of area-enhancement features, the area-enhancing features selected from the group consisting of a round pin fin, a rectangular pin fin, and a square pin fin, wherein one or more of the microjets in the array are generally perpendicular to the first surface of the heat exchange plate;

a flood chamber defined between the jet-plane of the array of microjets and the first surface of the heat exchange plate, each of the microjets being adapted to produce a substantially perpendicular impinging jet of the fluid on the first surface; and the outlet manifold comprising two outlet ducts at one end, a plurality of extraction ports on an opposing end and an out-of-plane network of channels for draining the fluid from the flood chamber, the out-of-plane network of channels connecting the plurality of extraction ports to the two outlet ducts, the plurality of extraction ports being disposed generally in the jet-plane and being interspersed among the plurality of microjets, and the outlet manifold being adapted to draining the fluid in an opposite direction to the impinging jets produced by the microjets.

2. The hybrid microjet liquid-cooled heat spreader/sink of claim 1, wherein the array of microjets is configured to operate under turbulent flow conditions with the impinging jets on the first surface of the heat exchange plate.

3. The hybrid microjet liquid-cooled heat spreader/sink of claim 1, wherein at least a portion of each of the plurality of multi-level flow channels are disposed in a channel-plane that is substantially parallel to the jet-plane.

4. The hybrid microjet liquid-cooled heat spreader/sink of claim 1, wherein the plurality of multi-level flow channels has k number of levels, each of the k levels disposed in a respective channel-plane, and the respective channel-planes of each of the k levels of the plurality of multi-level flow channels are substantially parallel to each other and to the jet-plane.

5. The hybrid microjet liquid-cooled heat spreader/sink of claim 1, wherein the number of microjets in the array of microjets are selected from the group of sixteen, thirty-two, and sixty-four.

6. The hybrid microjet liquid-cooled heat spreader/sink of claim 1, wherein the main manifold is manufactured by an additive manufacturing technique.

7. The hybrid microjet liquid-cooled heat spreader/sink of claim 1, further comprising a water block housing the main manifold and the flood chamber.

8. The hybrid microjet liquid-cooled heat spreader/sink of claim 7, further comprising a X-clamp for mounting the water block on an electronic component.

9. The hybrid microjet liquid-cooled heat spreader/sink of claim 1, wherein the water block is detachably connected to the heat exchange plate.

10. The hybrid microjet liquid-cooled heat spreader/sink of claim 1, wherein the number of microjets in the array is $2^k$, wherein k is the total number of levels in the plurality of multi-level flow channels.

11. The hybrid microjet liquid-cooled heat spreader/sink of claim 1, wherein the ratio between a diameter of each of the plurality of extraction ports and a diameter of each of $$\frac{d_{ep}}{d_n} = 2^{1/3}\left(\frac{JN}{EN}\right),$$

the microjects is wherein $d_{ep}$ is the diameter of the extraction ports, $d_{jn}$ is the diameter of the jet nozzles, JN is the number of microjets in the array, and EN is the number of extraction ports in the outlet manifold.

12. The hybrid microjet liquid-cooled heat spreader/sink of claim 1, wherein the out-of-plane network of channels of the outlet manifold has at least two levels of channels, each of the at least two levels of channels are disposed in a respective outlet-plane, and each of the respective outlet-planes are sustantially parallel to each other and to the jet-plane.

13. The hybrid microjet liquid-cooled heat spreader/sink of claim 1, wherein the area-enhancing features are uniformly distributed and/or equally spaced on the first surface of the heat exchange plate.

14. The hybrid microjet liquid-cooled heat spreader/sink of claim 1, wherein the plurality of extraction ports are uniformly distributed and/or equally spaced among the plurality of microjets.

15. A method of cooling an electronic component using a hybrid microjet liquid-cooled heat spreader/sink, comprising:

providing a main manifold comprising an inlet manifold and an outlet manifold, wherein the inlet manifold comprises an inlet duct at one end and an array of microjets at an opposing end, the array of microjets is disposed generally in a jet-plane, the inlet duct being bifurcated into a plurality of multi-level flow channels, the multi-level flow channels disposed between and connecting the inlet duct to the array of microjets, the multi-level flow channels each having a fractal distribution and a bifurcated branched pattern, the multi-level flow channels each adapted for uniform flow distribution of fluid on each level of bifurcation, wherein the inlet manifold is adapted for delivering the fluid from the inlet duct to the array of microjets via the multi-level flow channels;

providing a heat exchange plate and disposing the heat exchange plate parallelly at a distance from the jet-plane of the array of microjets, the heat exchange plate having a first surface and a second surface, the first surface comprising an array of area-enhancement features, the area-enhancing features selected from the group consisting of a round pin fin, a rectangular pin fin, and a square pin fin, wherein one or more of the microjets in the array are generally perpendicular to the first surface of the heat exchange plate;

providing a flood chamber defined between the jet-plane of the array of microjets and the first surface of the heat exchange plate, each of the microjets being adapted to produce a substantially perpendicular impinging jet of the fluid on the first surface;

providing the outlet manifold comprising two outlet ducts at one end, a plurality of extraction ports on an opposing end and an out-of-plane network of channels for draining the fluid from the flood chamber, the out-of-plane network of channels connecting the plurality of extraction ports to the two outlet ducts, the plurality of extraction ports being disposed generally in the jet-plane and being interspersed among the plurality of microjets, and the outlet manifold being adapted to draining the fluid in an opposite direction to the impinging jets produced by the microjets; and pumping the fluid into the inlet manifold through the inlet duct and draining the fluid from the flood chamber through the outlet manifold for cooling the heat exchange plate/electronic component.

16. The method claim 15, wherein:

the array of microjets is configured operate under turbulent flow conditions with the impinging jets on the first surface of the heat exchange plate; and the step of providing the main manifold comprises disposing at least a portion of each of the plurality of multi-level flow channels in a channel-plane that is substantially parallel to the jet-plane.

17. The method of claim 15, wherein the plurality of multi-level flow channels has k number of levels, each of the k level disposed in a respective channel-plane, and the respective channel-planes of each of the k levels of the plurality of multi-level flow channels are substantially parallel to each other and to the jet-plane.

18. The method of claim 15, wherein the step of providing the main manifold comprises manufacturing the main manifold by an additive manufacturing technique;

further comprising a step of providing a water block, and housing the main manifold and the flood chamber in the water block.

19. The method of claim 15, wherein:

the number of microjets in the array is $2^k$, wherein k is the total number of levels in the plurality of multi-level flow channels;

the ratio between a diameter of each of the plurality of extraction ports and a diameter of each of the microjects is $$\frac{d_{ep}}{d_{jn}} = 2^{1/3}\left(\frac{JN}{EN}\right),$$

wherein $d_{ep}$ is the diameter of the extraction ports, $d_{jn}$ is the diameter of the jet nozzles, JN is the number of microjets in the array, and EN is the number of extraction ports in the outlet manifold; and the out-of-plane network of channels of the outlet manifold has at least two levels of channels, each of the at least two levels of channels are disposed in a respective outlet-plane, and each of the respective outlet-planes are sustantially parallel to each other and to the jet-plane.

20. The method of claim 15, wherein:

the area-enhancing features are uniformly distributed and/or equally spaced on the first surface of the heat exchange plate;

the plurality of extraction ports are uniformly distributed and/or equally spaced among the plurality of microjets; and distribution of the plurality of extraction ports is configured to minimize cross-flow interference in the flood chamber.

* * * * *